US006888620B2

(12) United States Patent
Lee et al.

(10) Patent No.: US 6,888,620 B2
(45) Date of Patent: May 3, 2005

(54) SYSTEM AND METHOD FOR HOLDING A DEVICE WITH MINIMAL DEFORMATION

(75) Inventors: Martin E. Lee, Saratoga, CA (US); Mike Binnard, Belmont, CA (US); Douglas C. Watson, Campbell, CA (US)

(73) Assignee: Nikon Corporation (JP)

( * ) Notice: Subject to any disclaimer, the term of this patent is extended or adjusted under 35 U.S.C. 154(b) by 209 days.

(21) Appl. No.: 09/997,553

(22) Filed: Nov. 29, 2001

(65) Prior Publication Data

US 2003/0098964 A1 May 29, 2003

(51) Int. Cl.[7] .................. G03B 27/60; G03B 27/58; G03B 27/62; G03B 27/42
(52) U.S. Cl. .................. 355/73; 355/72; 355/75; 355/53
(58) Field of Search .................. 355/73, 53, 72, 355/75, 77; 356/399, 400, 401; 250/492.2; 384/100; 318/575, 687, 649, 38, 135; 310/12, 112, 90.5; 524/505

(56) References Cited

U.S. PATENT DOCUMENTS

| 4,444,492 | A | | 4/1984 | Lee | |
|---|---|---|---|---|---|
| 5,991,005 | A | * | 11/1999 | Horikawa et al. | 355/53 |
| 6,124,923 | A | * | 9/2000 | Horikawa | 355/53 |
| 6,420,475 | B1 | * | 7/2002 | Chen | 524/505 |
| 6,570,645 | B2 | * | 5/2003 | Korenaga et al. | 355/75 |
| 2001/0019250 | A1 | * | 9/2001 | Lee | 318/575 |
| 2002/0126923 | A1 | * | 9/2002 | Usui | 384/100 |

FOREIGN PATENT DOCUMENTS

JP  2002-50560  2/2002

OTHER PUBLICATIONS

U.S. patent application Ser. No. 09/919,940, Takahashi, filed Aug. 2, 2001, Stage Unit, Measurement Unit and Measurement Method, and Exposure Apparatus and Exposure Method.
U.S. patent application Ser. No. 09/635,339, Shiraishi et al., filed Aug. 9, 2000, Adjusting Method for Position Detecting Apparatus.

* cited by examiner

Primary Examiner—Peter B. Kim
(74) Attorney, Agent, or Firm—Steven G. Roeder

(57) ABSTRACT

A stage assembly (10) for moving and positioning a device (26) includes a device table (20), a device holder (24) that retains the device (26), and a stage mover assembly (14). The stage assembly (10) includes one or more features that can isolate the device holder 24 and the device (26) from deformation. In some embodiments, the stage assembly (10) allows precise rotation of the device (26) between a first position (42) and a second position (44) without influencing the flatness of the device (26) and without deflecting and distorting the device (26). For example, the stage assembly (10) can include a carrier (60) and a holder connector assembly (62). The carrier (60) is supported above the device table (20) and rotates relative to the device table (20). The holder connector assembly (62) connects the device holder (24) to the carrier (60). Further, the stage assembly (10) can include a holder mover (120) that rotates the device holder (24) relative to the device table (20). Additionally, the stage assembly (10) can include a fluid connector (94) that connects the device holder (24) in fluid communication with the device table (20).

144 Claims, 20 Drawing Sheets

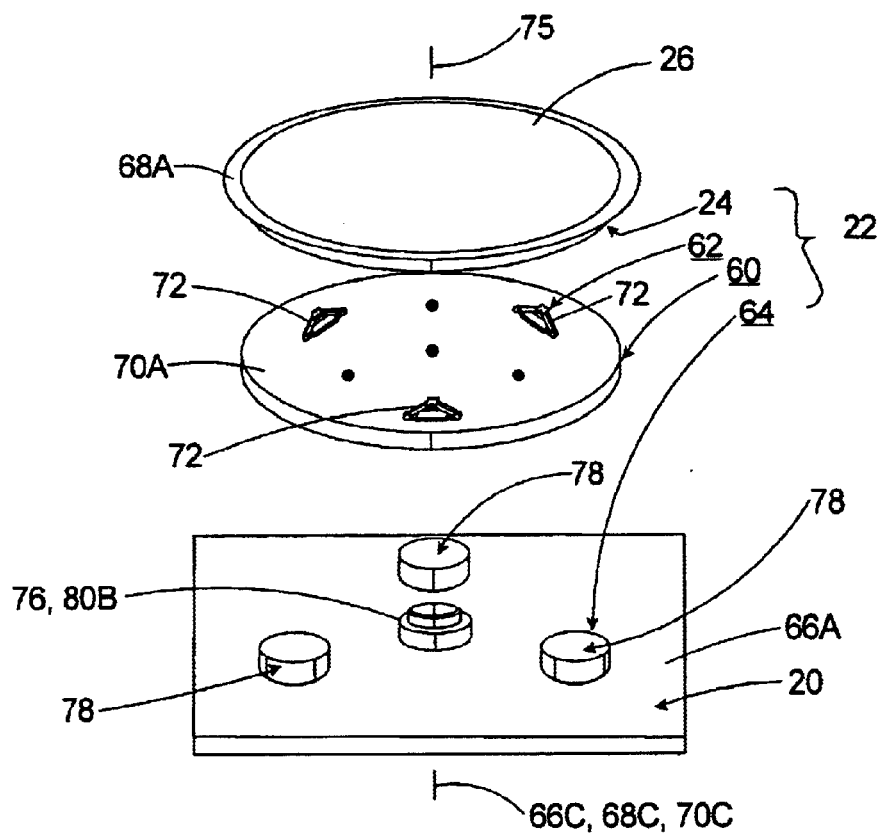
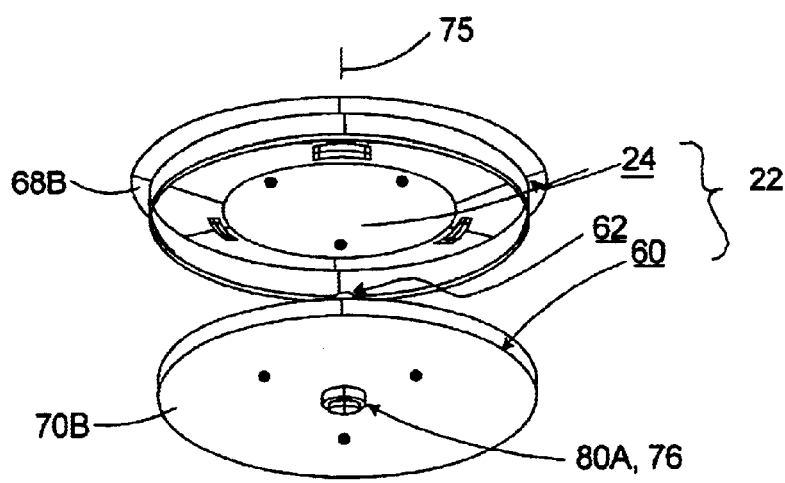
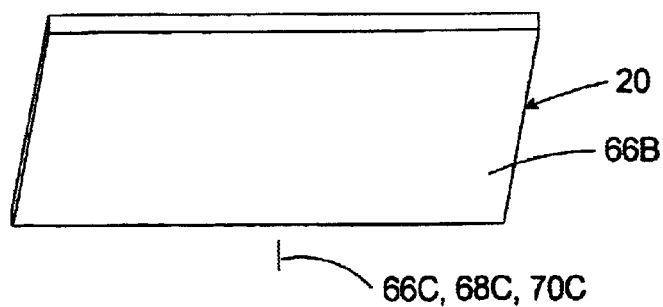
Fig. 2B
Fig. 2C

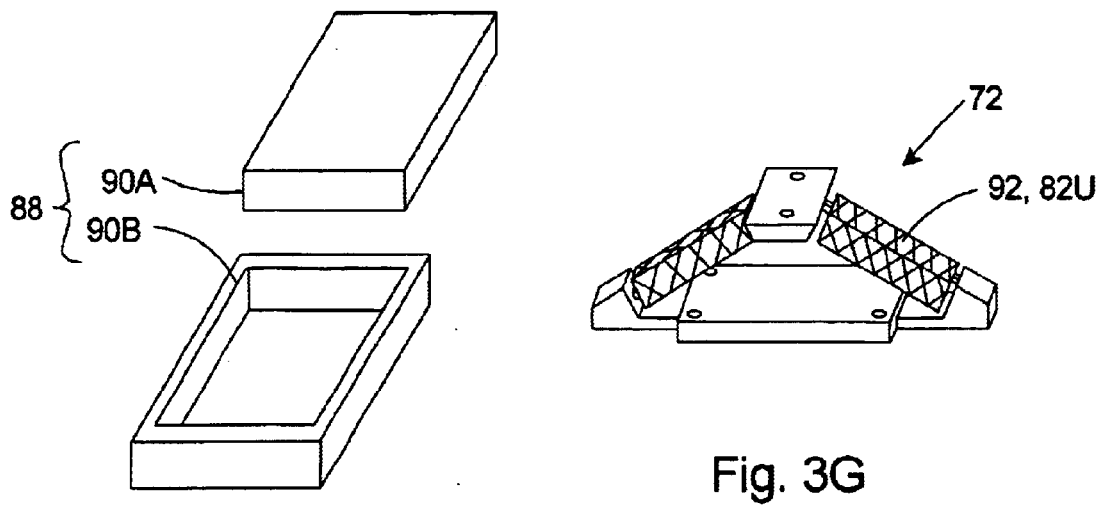
Fig. 3F
Fig. 3G
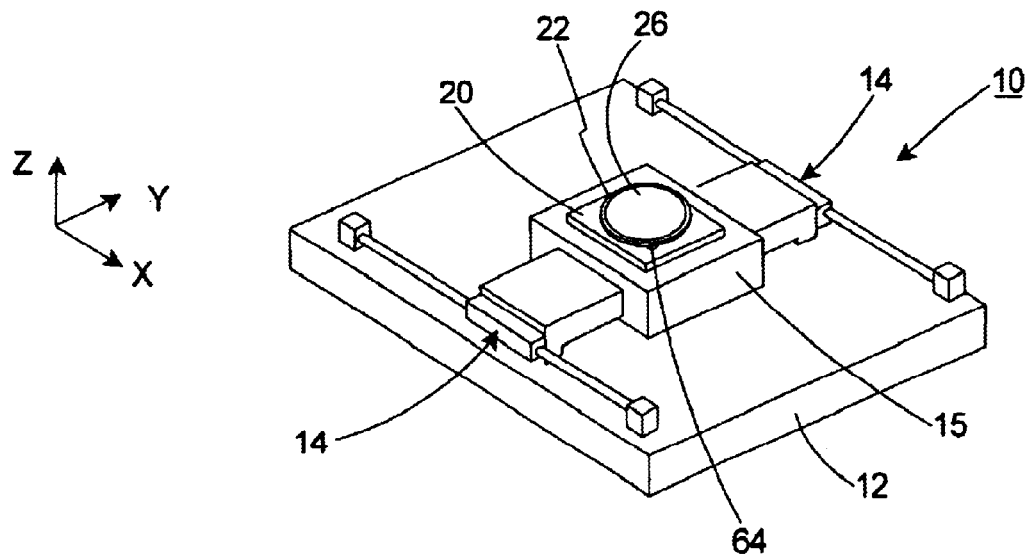
Fig. 4A
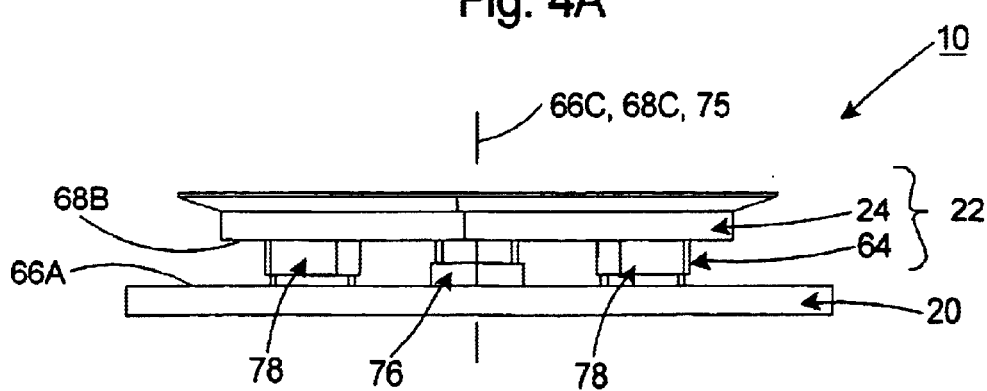
Fig. 4B

SYSTEM AND METHOD FOR HOLDING A DEVICE WITH MINIMAL DEFORMATION

FIELD OF THE INVENTION

The present invention is directed to a stage assembly for moving and positioning a device. More specifically, the present invention is directed to a stage assembly that rotatably retains a semiconductor wafer for an exposure apparatus.

BACKGROUND

Exposure apparatuses are commonly used to transfer images from a reticle onto a semiconductor wafer during semiconductor processing. A typical exposure apparatus includes an illumination source, a reticle stage assembly that retains a reticle, an optical assembly, a wafer stage assembly that retains a semiconductor wafer, and a measurement system. The semiconductor wafer includes a plurality of chip alignment marks that identify the location of the chips on the semiconductor wafer.

Typically, the wafer stage assembly includes a wafer stage base, a wafer stage including a wafer vacuum chuck that retains the wafer, and a wafer mover assembly that precisely positions the wafer stage and the wafer. Somewhat similarly, the reticle stage assembly includes a reticle stage base, a reticle stage that retains the reticle, and a reticle mover assembly that precisely positions the reticle stage and the reticle. In order to obtain precise relative positioning, the position of the reticle stage and the wafer stage are constantly monitored by the measurement system. Stated another way, the measurement system monitors movement of the device stage and the wafer stage relative to the optical assembly or some other reference. With this information, the wafer mover assembly can be used to precisely position the wafer and the reticle mover assembly can be used to precisely position the reticle.

As provided herein, the wafer mover assembly moves the wafer stage and the wafer between an alignment position and an operational position. In the alignment position, the wafer is loaded onto the wafer stage. Subsequently, in the alignment position, an alignment device, e.g. a microscope, is used to align and determine the position of the chip alignment marks of the wafer relative to the wafer stage and the measurement system. In the operational position, a projection device, e.g. a projection microscope, is used to check alignment of the wafer relative to the reticle through the optical assembly of the exposure apparatus. Finally, in the operational position, images from the reticle are transferred to the wafer.

The size of the images and features within the images transferred onto the wafer from the reticle are extremely small. Accordingly, the precise positioning of the wafer and the reticle relative to the optical device is critical to the manufacture of high density, semiconductor wafers.

One way to improve the accuracy of the exposure apparatus includes improving the determination of the location of the chip alignment marks relative to the wafer stage and the measurement system. For example, the alignment and determination of the chip alignment marks can be improved by (i) initially aligning and determining the position of the chip alignment marks in a first position with the alignment device, and (ii) subsequently, rotating the wafer 180 degrees to a rotated second position, and (iii) aligning and determining the position of the chip alignment marks in the second position with the alignment device. With this information, the errors in the alignment device can be averaged. Next, the wafer is rotated back to the first position and then the wafer is moved to the operational area.

Unfortunately, rotation of the wafer between the positions can deform the wafer. The deformation of the wafer compromises the accuracy of the alignment process. Further, the alignment process is compromised if the wafer is not rotated exactly between the positions. Ultimately, this reduces the accuracy of positioning of the wafer relative to the reticle and degrades the accuracy of the exposure apparatus.

In light of the above, there is a need for a wafer stage assembly and method for precisely rotating a device between a first position, a rotated second position and back to the first position without deforming, deflecting and/or distorting the device. Additionally, there is a need for a mover and method for accurately moving the wafer chuck relative to the wafer stage between the positions. Moreover, there is a need for a system and method for connecting the wafer chuck in fluid communication with a fluid source such as a vacuum source. Further, there is a need for an exposure apparatus that allows for more accurate positioning of the semiconductor wafer relative to the reticle. Furthermore, there is a need for an exposure apparatus capable of manufacturing precision devices such as high density, semiconductor wafers.

SUMMARY

The present invention is directed to a stage assembly for moving a device relative to a stage base. The stage assembly includes a stage, a device table secured to the stage, a stage mover assembly that moves the device table and a device holder that retains the device. A number of embodiments of the stage assembly are provided herein. In some of the embodiments, the stage assembly includes one or more features that allow the stage assembly to accurately rotate the device and the device holder relative to the device table about a holder axis of rotation between a first position and a second position.

In one embodiment, the stage assembly also includes a carrier and holder connector assembly. In this embodiment, the carrier is rotatably secured to the device table, and the holder connector assembly connects the device holder to the carrier so that rotation of the carrier results in rotation of the device holder. The holder connector assembly can kinematically connect the device holder to the carrier. With this design, for example, all of the clamping, rotating, loading/unloading and bearing forces can be applied to the carrier to move the carrier and the device holder without distorting and deforming the device holder and influencing the flatness of the device.

In embodiments in which the stage assembly includes the carrier, there is a possibility that the device holder will vibrate relative to the carrier. In order to reduce vibration of the device holder, the stage assembly can include a holder damper assembly that dampens vibration of the device holder relative to the carrier. As provided herein, for example, the holder damper assembly can utilize (i) one or more damping layers secured to the device table, the carrier and/or the device holder, (ii) a constrained layer damper secured to the device table, the carrier and/or the device holder, (iii) one or more permanent magnets that are secured to the device table, the carrier and/or the device holder for eddy current damping, and/or (iv) squeeze film type damping.

In embodiments having a device holder that utilizes a vacuum chuck, the stage assembly can include a fluid connector that connects the device holder in fluid communication with a fluid source such as a vacuum source and allows the device holder to be moved relative to the device table with minimal resistance and drag. More specifically, (i) the device table includes a table outlet that is in fluid communication with the vacuum source and a table inlet, and (ii) the device holder includes a holder outlet and a holder inlet that is in fluid communication with the vacuum chuck. A number of embodiments of the fluid connector are provided herein. In some of these embodiments, the fluid connector connects the table inlet in fluid communication with the holder outlet while allowing the device holder to be lifted, moved and/or rotated relative to the device table with minimal resistance and minimal leakage. In one embodiment, the fluid connector includes an annular shaped, flexible seal that maintains fluid communication between the table inlet and the holder outlet. Alternately, in another embodiment, the fluid connector includes a tapered, tube shaped needle and a needle aperture that is sized and shaped to receive the needle. It should be noted that the fluid connectors provided herein can be utilized in a stage assembly that includes the carrier or a stage assembly that does not include the carrier.

In an alternate embodiment, the stage assembly includes a holder mover and/or device that moves and/or rotates the device holder relative to the device table. A number of alternate designs are provided herein that can be utilized in a stage assembly that includes the carrier or a stage assembly that does not include the carrier. For example, in one embodiment, the stage assembly includes a stop that selectively retains a point of the device holder. More specifically, in this embodiment, with the stop inhibiting a point of the device holder from moving, the stage mover assembly moves the device table in a semicircular pattern and the device holder is rotated between the positions about the stop and about the holder axis of rotation.

In another embodiment, a center of gravity of the device holder and/or the carrier is offset and positioned away from the holder axis of rotation. With this configuration, the stage mover assembly can be used to accelerate the device table and rotate the device holder. Further, in this embodiment, the stage mover assembly can be used to accelerate the device table and stop rotation of the device holder.

In yet another embodiment, the stage assembly includes a motor that engages the carrier and/or the device holder and rotates the device holder. A number of versions of the motor are provided herein. In one version, the motor is secured to the stage adjacent to an outer perimeter of the device holder. In another version, the motor is secured to the stage along the holder axis of rotation below the device holder. In still another version, the motor is secured to an apparatus frame.

In yet another embodiment, the stage assembly includes a motor having a first component and an adjacent second component that interacts with the first component. One of the components includes one or more magnet arrays and the other component includes one or more conductor arrays. For the motor, electrical current supplied to the conductor array interacts with a magnetic field generated by the magnet array. This causes a force (Lorentz type force) between the conductor array and the magnet array that can be used to move the device holder relative to the device table between the positions. As provided herein, the second component is secured to the carrier and/or the device holder. Further, the first component is secured to a rigid structure, such as the apparatus frame, the device table, or the stage.

The present invention is also directed to an exposure apparatus, a device, a semiconductor wafer, a method for making a stage assembly, a method for making an exposure apparatus, a method for making a device, and a method for manufacturing a wafer.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which:

FIG. 2B is a top, exploded perspective view of the holder assembly and device table of FIG. 2A;

FIG. 2C is a bottom, exploded perspective view of the holder assembly and device table of FIG. 2A;

FIG. 3F is an exploded perspective view of a damping unit having features of the present invention;

FIG. 3G is a perspective view of an embodiment of the holder damper assembly;

FIG. 4A is a perspective view of a stage assembly including another embodiment of the holder assembly;

FIG. 4B is a side view of the holder assembly of FIG. 4A;

FIG. 6KK is a perspective view of another embodiment of the holder mover, the holder assembly, and the device table;

FIG. 6LL is a perspective view of another embodiment of the holder mover, the holder assembly, and the device table;

FIG. 6MM is a cut-away view of another embodiment of the holder mover, the holder assembly, and the device table;

FIG. 6NN is a side view of another embodiment of the holder mover, the holder assembly, and the device table;

FIG. 6SS is a side view of another embodiment of the holder mover, the holder assembly, and the device table;

FIG. 6TT is a side view of another embodiment of the holder mover, the holder assembly, and the device table;

DESCRIPTION

Figure 1:
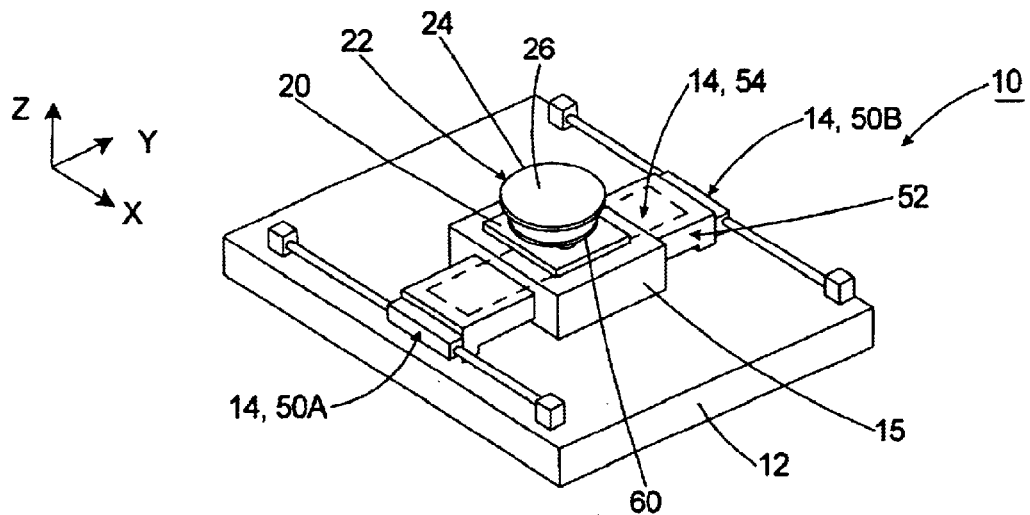
FIG. 1 is a perspective view of a stage assembly having features of the present invention.
Figure 7:
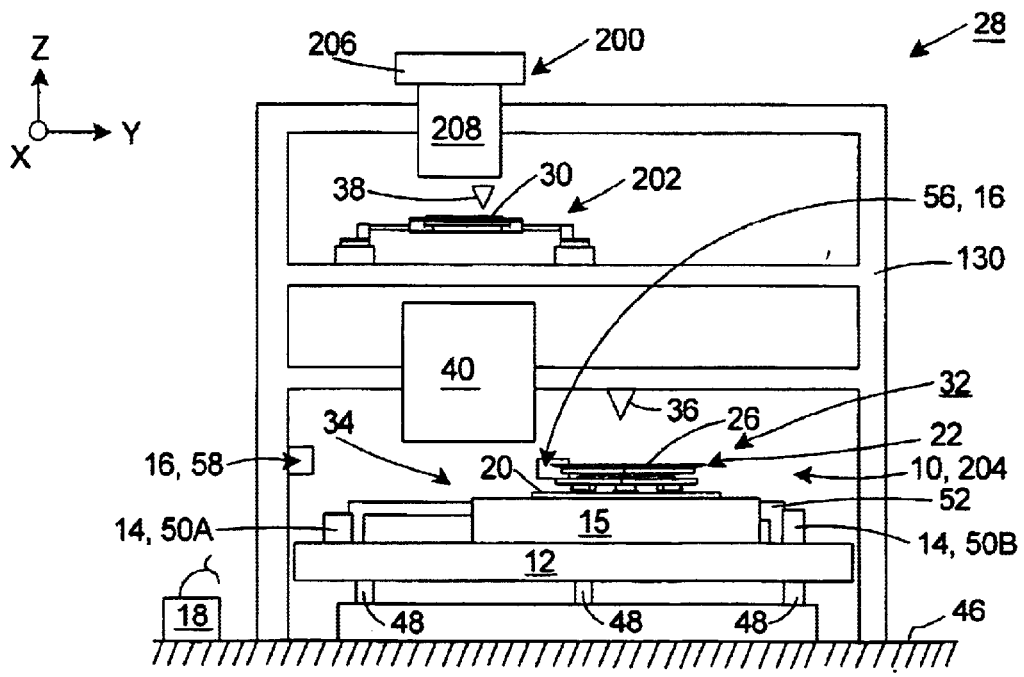
FIG. 7 is a schematic side illustration of an exposure apparatus having features of the present invention.

Referring initially to FIGS. 1 and 7, a stage assembly 10 having features of the present invention, includes (i) a stage base 12, (ii) a stage mover assembly 14, (iii) a stage 15, (iv) a measurement system 16 (illustrated in FIG. 7), (v) a control system 18 (illustrated in FIG. 7), (vi) a device table 20, and (vii) and a holder assembly 22 including a device holder 24. The stage assembly 10 is useful for precisely positioning a device 26 during a manufacturing and/or an inspection process. The type of device 26 positioned and moved by the stage assembly 10 can be varied. For example, the device 26 can be a semiconductor wafer, and the stage assembly 10 can be used as part of an exposure apparatus 28 (illustrated in FIG. 7) for precisely positioning the semiconductor wafer relative to a reticle 30 (illustrated in FIG. 7) during manufacturing of the semiconductor wafer. Alternately, for example, the stage assembly 10 can be used to move other types of devices during manufacturing and/or inspection, to move a device under an electron microscope (not shown), or to move a device during a precision measurement operation (not shown).

Referring to FIG. 7, the stage mover assembly 14 can move the device table 20 and wafer 26 between an alignment position 32 and an operational position 34. Typically, the wafer 26 includes a plurality of chip alignment marks (not shown) that identify the location of the chips (not shown) on the wafer. In the alignment position 32, an alignment device 36, e.g. a microscope, is used to align and determine the position of the wafer alignment marks of the wafer relative to the device table 20 and the measurement system 16. In the operational position 34, a projection device 38, e.g. a projection microscope, is used to check alignment of the wafer relative to the reticle 30 through an optical assembly 40 of the exposure apparatus 28. Subsequently, in the operational position 34, images from the reticle 30 are transferred to the wafer.

As provided herein, in some embodiments, the holder assembly 22 allows the device holder 24 and the device 26 to be accurately rotated between a first position 42 (illustrated in FIGS. 6C, 6F), a second position 44 (illustrated in FIGS. 6E and 6F) and back to the first position 42. In these embodiments, the stage assembly 10 includes one or more features that allow device holder 24 to be precisely rotated between the positions 42, 44, and/or moved without influencing the flatness of the wafer and without deflecting and distorting the wafer. Stated another way, with the present design, the device holder 24 comes back to the same place and wafer flatness stays the same. Typically, in the second position 44, the device holder 24 and the device 26 are rotated 180 degrees relative to the first position 42. As provided herein, the holder assembly 22 can be designed to rotate the device 26 relative to the device table 20 (i) at least approximately 5 degrees; (ii) at least approximately 25 degrees, (iii) at least approximately 50 degrees, (iv) at least approximately 90 degrees, (v) at least approximately 120 degrees, (vi) at least approximately 180 degrees, and/or (vii) at least approximately 360 degrees.

The alignment device 36 can be used to align and determine the position of the wafer alignment marks of the wafer 26 relative to the device table 20 and the measurement system 16 when the wafer 26 is in the first position 42 and subsequently when the wafer 26 is in the second position 44. As a result thereof, the errors in the alignment device 36 can be averaged. This improves the positioning performance of the stage assembly 10. Further, for an exposure apparatus 28, this allows for more accurate positioning of the device 26 and the manufacture of higher precision devices 26, such has high density, semiconductor wafers.

Some of the Figures provided herein include a coordinate system that designates an X axis, a Y axis, and a Z axis. It should be understood that the coordinate system is merely for reference and can be varied. For example, the X axis can be switched with the Y axis and/or the stage assembly 10 can be rotated.

In each embodiment illustrated herein, the device table 20 is moved relative to the stage base 12 along the X axis, along the Y axis, and about the Z axis (collectively "the planar degrees of freedom"). More specifically, the stage mover assembly 14 moves and positions the stage 15 and the device table 20 along the X axis, along the Y axis, and about the Z axis under the control of the control system 18 that is connected to the stage mover assembly 14. Additionally, the stage mover assembly 14 could also be designed to move and position the device table 20 along the Z axis, about the X axis and about the Y axis relative to the stage base 12. Alternately, for example, the stage mover assembly 14 could be designed to move the device table 20 with less than three degrees of freedom. In each embodiment illustrated herein, the stage assembly 10 includes one device table 20. Alternately, however, the stage assembly 10 could be designed to include more than one device table 20.

The stage base 12 supports a portion of the stage assembly 10 above a mounting base 46 (illustrated in FIG. 7). The design of the stage base 12 can be varied to suit the design requirements of the stage assembly 10. In the embodiment illustrated in FIG. 1, the stage base 12 is generally rectangular shaped and includes a planar base top (sometimes referred to as a guide face).

Referring to FIG. 7, the stage base 12 can be secured with resilient base isolators 48 to the mounting base 46. The base isolators 48 reduce the effect of vibration of the mounting base 46 causing vibration on the stage base 12. Typically, three spaced apart base isolators 48 are utilized. Each base isolator 48 can include a pneumatic cylinder (not shown) and an actuator (not shown). Suitable base isolators 48 are sold by Technical Manufacturing Corporation, located in Peabody, Mass., or Newport Corporation located in Irvine, Calif. Alternately, for example, the stage base 12 can be secured directly to the mounting base 46.

As provided above, the stage mover assembly 14 controls and moves the stage 15 and the device table 20 relative to the stage base 12. The design of the stage mover assembly 14 and the movement of the stage 15 and the device table 20 can be varied to suit the movement requirements of the stage assembly 10. In the embodiment illustrated in FIG. 1, the stage mover assembly 14 moves the stage 15 and the device table 20 with a relatively large displacement along the X axis, a relatively large displacement along the Y axis, and a limited displacement about the Z axis (theta Z) relative to the stage base 12. In this embodiment, the stage mover assembly 14 includes a left X stage mover 50A, a right X stage mover 50B, a guide bar 52, and a Y stage mover 54 (illustrated in phantom in FIG. 1). More specifically, (i) the X stage movers 50A, 50B move the guide bar 52, the stage 15 and the device table 20 with a relatively large displacement along the X axis and with a limited range of motion about the Z axis, and (ii) the Y stage mover 54 moves the stage 15 and the device table 20 with a relatively large displacement along the Y axis relative to the guide bar 52.

The design of each stage mover 50A, 50B, 54 can be varied to suit the movement requirements of the stage assembly 10. For example, each of the stage movers 50A, 50B, 54 can include one or more rotary motors, voice coil motors, linear motors utilizing a Lorentz force to generate drive force, electromagnetic actuators, or some other force actuators. In the embodiment illustrated in FIG. 1, each of the stage movers 50A, 50B, 54 is a linear motor.

The guide bar 52 moves the stage 15 along the X axis and about the Z axis and guides the movement of the stage 15 along the Y axis. The design of the guide bar 52 can be varied to suit the design requirements of the stage assembly 10. In the embodiment illustrated in the FIG. 1, the guide bar 52 is somewhat rectangular beam shaped. A bearing (not shown) maintains the guide bar 52 spaced apart along the Z axis relative to the stage base 12 and allows for motion of the guide bar 52 along the X axis and about the Z axis relative to the stage base 12. The bearing can be a vacuum preload type fluid bearing that maintains the guide bar 52 spaced apart from the stage base 12 in a non-contact manner. Alternately, the guide bar 52 can be supported spaced apart from the stage base 12 in other ways. For example, a magnetic type bearing or a ball bearing type assembly could be utilized that allows for motion of the guide bar 52 relative to the stage base 12.

The design of the stage 15 can be varied to suit the design requirements of the stage assembly 10. In the embodiment illustrated in the Figures, the stage 15 moves with the guide bar 52 along the X axis and about the Z axis and the stage 15 moves along the Y axis relative to the guide bar 52. In this embodiment, the stage 15 is generally rectangular shaped and includes a rectangular shaped opening for receiving a portion of the guide bar 52. A bearing (not shown) maintains the stage 15 spaced apart along the Z axis relative to the stage base 12 and allows for motion of the stage 15 along the X axis, along the Y axis and about the Z axis relative to the stage base 12. The bearing can be a vacuum preload type fluid bearing that maintains the stage 15 spaced apart from the stage base 12 in a non-contact manner. Alternately, the stage 15 can be supported spaced apart from the stage base 12 in other ways. For example, a magnetic type bearing or a ball bearing type assembly could be utilized that allows for motion of the stage 15 relative to the stage base 12.

Further, the stage 15 is maintained apart from the guide bar 52 with opposed bearings (not shown) that allow for motion of the stage 15 along the Y axis relative to the guide bar 52. Further, the bearings inhibit motion of the stage 15 relative to the guide bar 52 along the X axis and about the Z axis. Each bearing can be a fluid bearing that maintains the stage 15 spaced apart from the guide bar 52 in a non-contact manner. Alternately, the stage 15 can be supported spaced apart from the guide bar 52 in other ways. For example, a magnetic type bearing or a ball bearing type assembly could be utilized that allows for motion of the stage 15 relative to the guide bar 52.

The design of the device table 20 can be varied to suit the design requirements of the stage assembly 10. In the embodiment illustrated in the Figures, the device table 20 is generally rectangular plate shaped and includes four sides, a table top 66A, a table bottom 66B and a table central axis 66C. Typically, the device table 20 also includes an X mirror (not shown) and a Y mirror (not shown) for the measurement system 16. In the embodiment illustrated in FIGS. 1–2C, the device table 20 is fixedly secured to the stage 15 and moves concurrently with the stage 15. Alternately, for example, the stage mover assembly 14 can include a table mover assembly (not shown) that moves and adjusts the position of the device table 20 relative to the stage 15. The design of the table mover assembly can be varied to suit the design requirements to the stage assembly 10. For example, the table mover assembly can adjust the position of the device table 20 relative to the stage 15 with six degrees of freedom. Alternatively, for example, the table mover assembly can be designed to move the device table 20 relative to the stage 15 with only three degrees of freedom. The table mover assembly can include one or more rotary motors, voice coil motors, linear motors, electromagnetic actuators, or other type of actuators.

Referring to FIG. 7, the measurement system 16 monitors movement of the device table 20 relative to the optical assembly 40 or some other reference. With this information, the stage mover assembly 14 can be used to precisely position the device 26. The design of the measurement system 16 can be varied. For example, the measurement system 16 can utilize laser interferometers, encoders, and/or other measuring devices to monitor the position of the device table 20. A suitable encoder or interferometer can be made with components obtained from Agilent Technologies in Palo Alto, Calif.

In the embodiment illustrated in FIG. 7, the measurement system 16 monitors the position of the device table 20 along the X axis, along the Y axis, and about the Z axis in both the alignment position 32 and the operational position 34. In this embodiment, the measurement system 16 utilizes a linear encoder (not shown) that measures the amount of movement of stage 15 relative to the guide bar 52. Additionally, the measurement system 16 includes an X interferometer 56 and a Y interferometer 58 to monitor the position of the device table 20. The X interferometer 56 includes an X mirror (not shown) that is secured to the device table 20. The X interferometer 56 generates a laser beam toward the X mirror and detects the beam that is reflected off of the X mirror. With this information, the location of the device table 20 along the X axis can be monitored. Similarly, the Y interferometer 58 includes a Y mirror (not shown) that is secured to the device table 20. The Y interferometer 58 generates a pair of laser beams toward the Y mirror and detects the beams that are reflected off of the Y mirror. With this information, the location of the device table 20 along the Y axis and about the Z axis can be monitored.

The control system is connected to at least each of the stage movers 50A, 50B, 54 of the stage mover assembly 14 and the X interferometer 56 and the Y interferometer 58 of the measurement system 16. The control system 18 receives information from the measurement system 16 and controls the stage mover assembly 14 to precisely position the device table 20 and the device 26. In the embodiment illustrated in FIG. 7, the control system 18 directs and controls the current to each of the stage movers 50A, 50B, 54 to control movement of the stage 15 and the device table 20 along the X axis, along the Y axis and about the Z axis.

The holder assembly 22 allows for the accurate rotation and/or movement of the device 26. The design of the holder assembly 22 can be varied to suit the design requirements of the stage assembly 10. A number of alternate embodiments of the holder assembly 22 and methods for rotating the device 26 are provided herein.

In the embodiment illustrated in FIGS. 1–2C, the holder assembly 22 includes the device holder 24, a carrier 60, a holder connector assembly 62 and a rotation assembly 64. The design of each of the components can be varied pursuant to the teachings provided herein to suit the design requirements of the stage assembly 10. In this embodiment, during rotation between the positions 42, 44, all of the clamping, rotating, loading/unloading and bearing forces are applied to the carrier 60 instead of the device holder 24. Further, the holder connector assembly 62 can inhibit distortion of the carrier 60 causing distortion to the device holder 24 during movement with the stage mover assembly 14. As a result thereof, the holder assembly 22 can minimize distortion to the device 26 during rotation of the device 26 between the positions 42, 44 and/or movement of the device 26.

The device holder 24 retains the device 26. The device holder 24 can include a vacuum chuck, an electrostatic chuck, or some other type of clamp. In the embodiment illustrated in FIGS. 1–2C, the device holder 24 uses a vacuum chuck. Further, the device holder 24 is disk shaped and includes a holder top 68A, a holder bottom 68B, and a holder central axis 68C.

The carrier 60 supports the device holder 24 and facilitates rotation and/or movement of the device holder 24 and the device 26 without deforming the device holder 24 and the device 26. With the design illustrated in FIGS. 1–2C, when the carrier 60 distorts, the device holder 24 moves, but because of the holder connector assembly 62, the device holder 24 does not significantly deform. As a result thereof, deformation of the carrier 60 does not significantly influence the device holder 24. Stated another way, the device holder 24 can be rotated and/or moved without deforming the device holder 24.

The design of the carrier 60 can be varied according to the design of the rest of the components of the holder assembly 22. In the embodiment illustrated in FIGS. 1–2C, the carrier 60 is positioned between the device table 20 and the device holder 24. Further, the carrier 60 is generally disk shaped and includes a carrier top 70A, a carrier bottom 70B and a carrier central axis 70C.

The holder connector assembly 62 mechanically and flexibly connects the device holder 24 to the carrier 60. As a result thereof, movement of the carrier 60 results in movement of the device holder 24. The design of the holder connector assembly 62 can be varied pursuant to the teachings provided herein. In the embodiments illustrated herein, the holder connector assembly 62 kinematically connects the device holder 24 to the carrier 60. With this design, deformation of the carrier 60 does not result in deformation of the device holder 24 or the device 26. Alternately, for example, the holder connector assembly 62 can connect the device holder 24 to the carrier 60 in a non-kinematic manner.

Figure 2A:
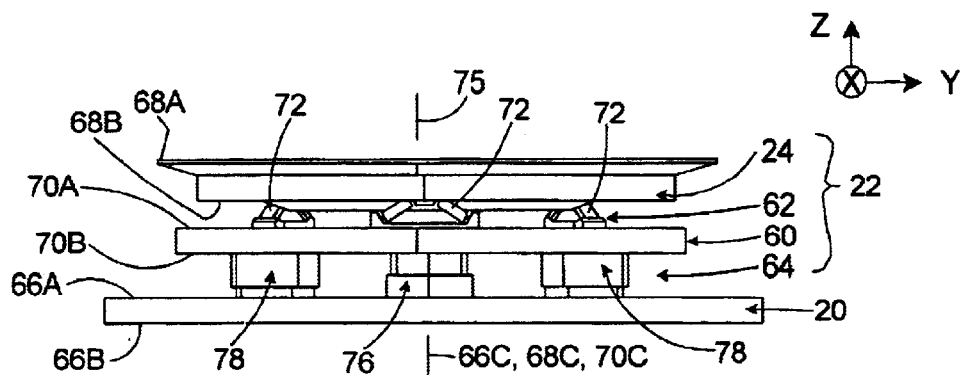
FIG. 2A is a side view of a holder assembly and a device table having features of the present invention.
Figure 2D:
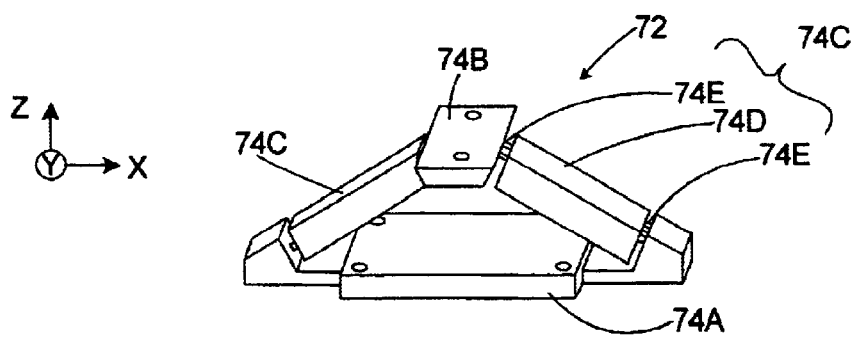
FIG. 2D is a perspective view of a portion of a holder connector assembly having features of the present invention.

In the embodiment illustrated in FIGS. 2A–2C, the holder connector assembly 62 includes three spaced apart flexures 72 that extend between the device holder 24 and the carrier 60. As used herein, the term "flexure" shall mean a part that has relatively high stiffness in some directions and relatively low stiffness in other directions. In the embodiment illustrated in FIG. 2D, the flexure 72 has (i) a relatively high stiffness along the Z axis and along the X axis and (ii) is relatively flexible along the Y axis and about the X, Y and Z axes. The ratio of relatively high stiffness to relatively low stiffness is at least approximately 100/1, and can be at least approximately 1000/1.

In FIGS. 2A–2C, the flexures 72 provide three points of contact between the device holder 24 and the carrier 60 and restrain movement of the device holder 24 relative to the carrier 60 along the X axis, the Y axis and the Z axis and about the X axis, the Y axis and the Z axis. In this embodiment, referring to FIGS. 2A–2D, each of the flexures 72 is a generally triangular shaped and includes (i) a generally flat flexure bottom 74A that is secured to the carrier top 70A of the carrier 60, (ii) a generally flat flexure top 74B that is secured to the holder bottom 68B of the device holder 24, and (iii) a pair of spaced apart flexure sides 74C that converge together and extend between the flexure bottom 74A and the flexure top 74B. Each of the flexure sides 74C includes a relatively rigid, stiff section 74D positioned between a pair of relatively resilient, flexible sections 74E. For each flexure side 74C, one of the flexible sections 74E is positioned near the flexure bottom 74A and the other flexible section 74E is positioned near the flexure top 74B. It should be noted that the length and rigidity of the stiff section 74D and the length and resiliency of the flexible sections 74E can be varied to adjust the overall stiffness of each flexure 72. In the embodiment illustrated in FIGS. 2A–2D, for each flexure 72, the length of each stiff section 74D is significantly longer than the length of each flexible section 74E. With this design, as discussed above, each flexure 72 is relative stiff in two degrees of freedom, and flexible in the other four degrees of freedom. It should also be noted that in the embodiment illustrated in FIGS. 2A–2C, that the flexures 72 directly connect, couple and extend between the holder bottom 68B and the carrier top 70A. Stated another way, the flexures 72 act directly on the holder bottom 68B to support the device holder 24.

Figure 2E:
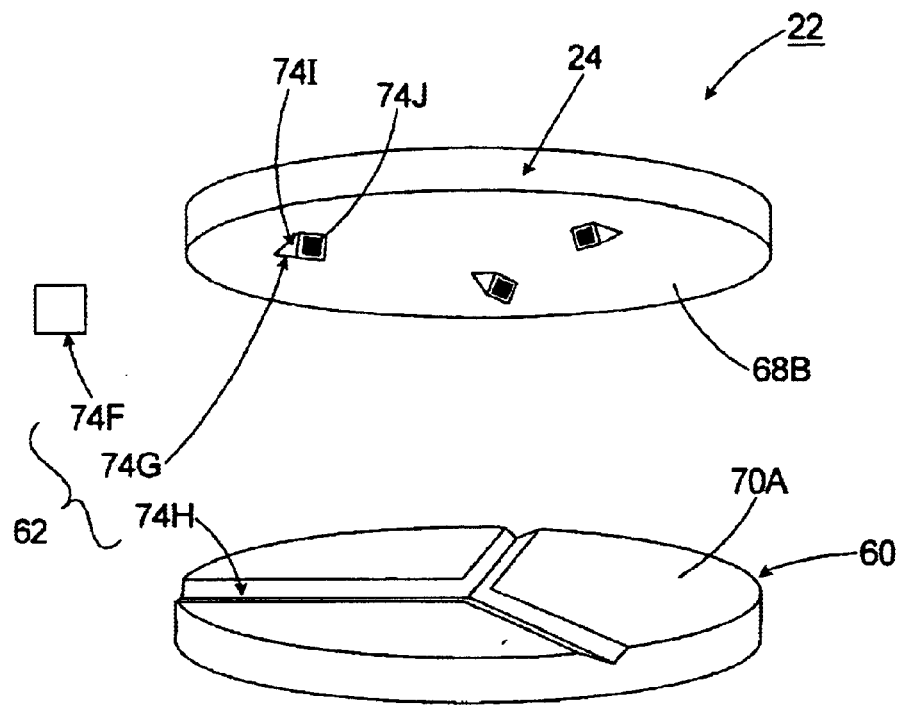
FIGS. 2E–2J each illustrate an alternate exploded perspective view of a holder assembly having features of the present invention.

It should be noted that other designs for the holder connector assembly 62 are possible. For example, FIG. 2E illustrates an alternate embodiment of the holder connector assembly 62. FIG. 2E illustrates only the device holder 24, the carrier 60 and the holder connector assembly 62. The carrier 60 and the device holder 24 are somewhat similar to the corresponding components described above and illustrated in FIGS. 2A–2C. Further, these components can be incorporated into the stage assembly of FIG. 1. However, the holder connector assembly 62 is different in design from the holder connector assembly 62 illustrated in FIGS. 2A–2C and described above.

In FIG. 2E, the holder connector assembly 62 includes one or more fluid bearings that cooperate to connect the device holder 24 to the carrier 60 in a non-contact manner. As a result thereof, movement of the carrier 60 results in movement of the device holder 24. In this embodiment, the holder connector assembly 62 includes six spaced apart fluid bearings that kinematically connect the device holder 24 to the carrier 60. With this design, deformation of the carrier 60 does not result in significant deformation of the device holder 24 or the device 26 (not shown in FIG. 2E).

More specifically, in the embodiment illustrated in FIG. 2E, the holder connector assembly 62 includes a fluid source 74F (illustrated as a block), three spaced apart, connector fluid bearing assemblies 74G and three spaced apart connector receivers 74H that cooperate to connect the device holder 24 to the carrier 60. Each of the connector fluid bearing assemblies 74G interacts with one of the connector receivers 74H. Further, each of the connector fluid bearing assemblies 74G includes a bearing body 74I having a substantially triangular shaped cross-section and a pair of bearing pads 74J. Each bearing body 74I has a pair of bearing sides that are positioned at an angle relative to each other. The angle of the bearing sides can be varied to suit the design requirements of the holder connector assembly 62. For example, the angle of the bearing sides can be between thirty degrees and one hundred and twenty degrees. One of bearing pads 74J is positioned on each of the bearing sides. Each bearing pad 74J includes one or more fluid outlets connected in fluid communication to the fluid source 74F. Each connector receiver 74H can be a groove having a substantially triangular shaped cross-section that corresponds to the shape of the bearing body 74I. However, the size of each receiver 74H can be slightly larger than the bearing body 74I. Each of the connector receivers 74H illustrated in FIG. 2E extends radially. Further, each bearing body 74I extends downward from the holder bottom 68B of the device holder 24 and each connector receiver 74H is positioned in the carrier top 70A of the carrier 60.

In the embodiments illustrated in FIG. 2E, pressurized fluid (not shown) from the fluid source 74F is released from the fluid outlets of the fluid pads 74J towards the sides of the connector receivers 74H to create six fluid bearings between the device holder 24 and the carrier 60. More specifically, a pair of somewhat opposed fluid bearings maintains each of the bearing bodies 74I spaced apart from the respective connector receiver 74H. Each of the opposed pairs of fluid bearings maintains the device holder 24 relative to the carrier 60 with relative high stiffness with two degrees of freedom. Stated another way, each bearing assembly 74G is relatively stiff in two degrees of freedom, and flexible in the other four degrees of freedom.

It should be noted that in the embodiment of FIG. 2E, the stiffness of the holder connector assembly 62 can be varied by adjusting the fluid pressure. Further, each bearing pad 74J can also include one or more fluid inlets (not shown). In this design, a vacuum can be pulled in the fluid inlets to create a vacuum preload type, fluid bearing between the device holder 24 and the carrier 60. The vacuum preload type fluid bearings maintain the device holder 24 spaced apart from the carrier 60.

Figure 2F:
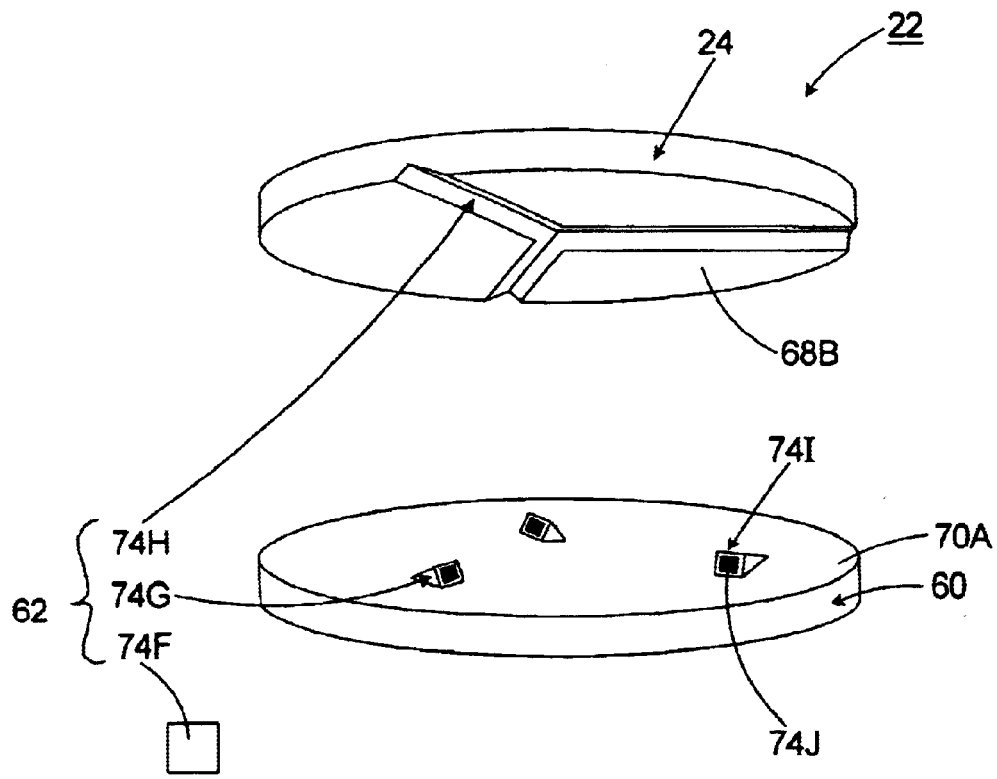

FIG. 2F illustrates another embodiment of the holder connector assembly 62. FIG. 2F illustrates only the device holder 24, the carrier 60 and the holder connector assembly 62. The carrier 60 and the device holder 24 are somewhat similar to the corresponding components described above and illustrated in FIGS. 2A–2C. Further, these components can be incorporated into the stage assembly of FIG. 1. The holder connector assembly 62 is similar to the design illustrated in FIG. 2E and described above.

In FIG. 2F, the holder connector assembly 62 includes one or more fluid bearings that cooperate to connect the device holder 24 to the carrier 60 in a non-contact manner. As a result thereof, movement of the carrier 60 results in movement of the device holder 24. In this embodiment, the holder connector assembly 62 again includes six spaced apart fluid bearings that kinematically connect the device holder 24 to the carrier 60. With this design, deformation of the carrier 60 does not result in significant deformation of the device holder 24 or the device 26 (not shown in FIG. 2F).

More specifically, in the embodiment illustrated in FIG. 2F, the holder connector assembly 62 includes the fluid source 74F (illustrated as a block), three spaced apart, connector fluid bearing assemblies 74G and three spaced apart connector receivers 74H that cooperate to connect the device holder 24 to the carrier 60. Each of the connector fluid bearing assemblies 74G interacts with one of the connector receivers 74H. Further, each of the connector fluid bearing assemblies 74G includes the bearing body 74I having a substantially triangular shaped cross-section and a pair of bearing pads 74J. Each bearing body 74I has a pair of bearing sides that are positioned at an angle relative to each other. The angle of the bearing sides can be varied to suit the design requirements of the holder connector assembly 62. For example, the angle of the bearing sides can be between thirty degrees and one hundred and twenty degrees. One of bearing pads 74J is positioned on each of the bearing sides. Each bearing pad 74J includes one or more fluid outlets connected in fluid communication to the fluid source 74F. Each connector receiver 74H can be a groove having a substantially triangular shaped cross-section that corresponds to the shape of the bearing body 74I. However, the size of each receiver 74H can be slightly larger than the bearing body 74I. Each of the connector receivers 74H illustrated in FIG. 2F extends radially. In the embodiment illustrated in FIG. 2F, each bearing body 74I extends upward from the carrier top 70A of the carrier 60 and each of the connector receivers 74H is positioned in the holder bottom 68B of the device holder 24.

In the embodiments illustrated in FIG. 2F, pressurized fluid (not shown) from the fluid source 74F is released from the fluid outlets of the fluid pads 74J towards the sides of the connector receivers 74H to create six fluid bearings between the device holder 24 and the carrier 60. More specifically, a pair of somewhat opposed fluid bearings maintains each of the bearing bodies 74I spaced apart from the respective connector receiver 74H. Each of the opposed pairs of fluid bearings maintains the device holder 24 relative to the carrier 60 with relative high stiffness with two degrees of freedom. Stated another way, each bearing assembly 74G is relatively stiff in two degrees of freedom, and flexible in the other four degrees of freedom.

In this embodiment, adjusting the fluid pressure can vary the stiffness of the holder connector assembly 62. Further, each fluid pad can also include one or more fluid inlets. In this design, a vacuum can be pulled in the fluid inlets to create a vacuum preload type, fluid bearing between the device holder 24 and the carrier 60. The vacuum preload type fluid bearings maintain the device holder 24 spaced apart from the carrier 60.

Figure 2G:
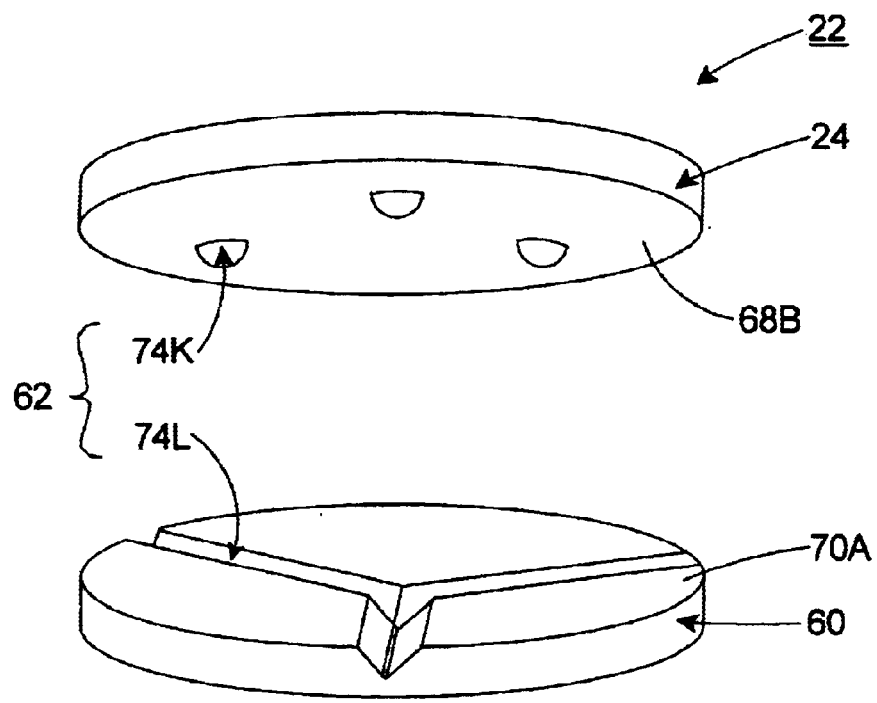

FIG. 2G illustrates another embodiment of the holder connector assembly 62. FIG. 2G illustrates only the device holder 24, the carrier 60 and the holder connector assembly 62. The carrier 60 and the device holder 24 are somewhat similar to the corresponding components described above and illustrated in FIGS. 2A–2C. Further, these components can be incorporated into the stage assembly of FIG. 1. The holder connector assembly 62 is different from the design illustrated in FIGS. 2A–2C and described above.

In FIG. 2G, the holder connector assembly 62 includes three spaced apart protrusions 74K and three spaced apart receivers 74L that cooperate to connect the device holder 24 to the carrier 60. As a result thereof, movement of the carrier 60 results in movement of the device holder 24. In this embodiment, the holder connector assembly 62 kinematically connects the device holder 24 to the carrier 60. With this design, deformation of the carrier 60 does not result in deformation of the device holder 24 or the device 26.

In the embodiment illustrated in FIG. 2G, each of the protrusions 74K is substantially spherical shaped and fits into one of the connector receivers 74L to connect the device holder 24 to the carrier 60. Each connector receiver 74L can be a groove having a substantially triangular shaped cross-section. Each of the connector receivers 74L illustrated in FIG. 2G extends radially. With this design, each protrusion 74K primarily contacts two surfaces of one of the receivers 74L. At each contact point, there is exactly one constraint assuming there can be sliding between the parts. Because there are two contact points per protrusion 74K, the holder connector assembly 62 illustrated in FIG. 2G has a total of six degrees of constraint.

In FIG. 2G, the holder bottom 68B of the device holder 24 includes three spaced apart, semi-spherical shaped indentations that each receive one of the protrusions 74K and each connector receiver 74L is positioned in the carrier top 70A of the carrier 60. It should be noted that the protrusions 74K extend directly between the holder bottom 68B of the device holder 24 and the carrier top 70A of the carrier 60. Still alternately, instead of the protrusions 74K fitting into indentations, each of the protrusions can have a semi-circular shaped cross-section and can be formed directly into the holder bottom 68B.

Figure 2H:
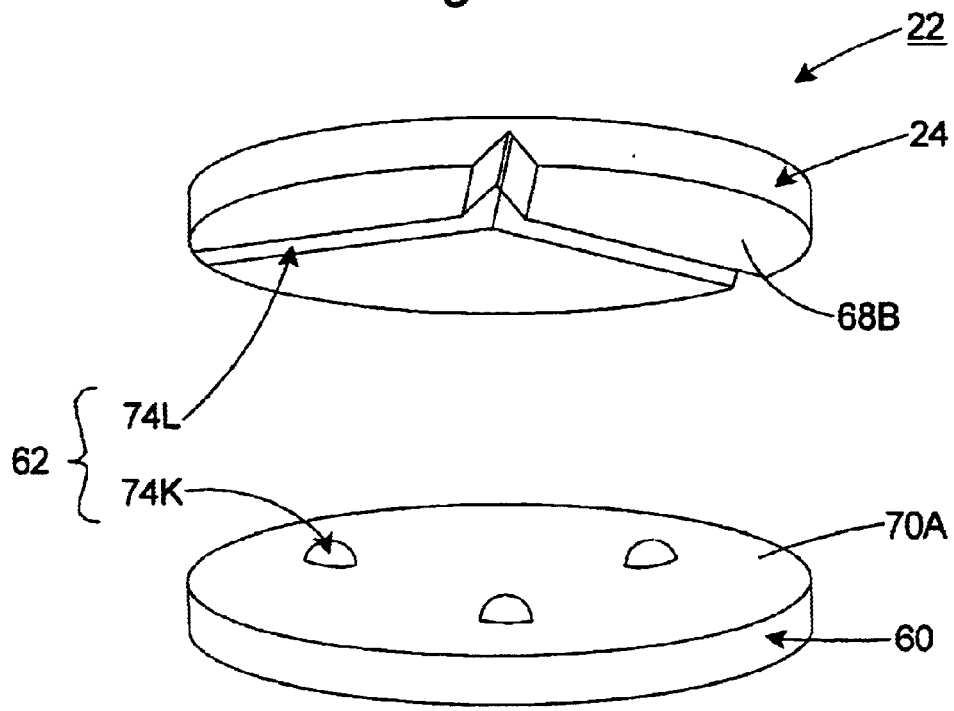

FIG. 2H illustrates another embodiment of the holder connector assembly 62. FIG. 2H illustrates only the device holder 24, the carrier 60 and the holder connector assembly 62. The carrier 60 and the device holder 24 are somewhat similar to the corresponding components described above and illustrated in FIGS. 2A–2C. Further, these components can be incorporated into the stage assembly of FIG. 1. The holder connector assembly 62 is similar to the design illustrated in FIG. 2G and described above.

In FIG. 2H, the holder connector assembly 62 includes three spaced apart protrusions 74K and three spaced apart receivers 74L that cooperate to connect the device holder 24 to the carrier 60. As a result thereof, movement of the carrier 60 results in movement of the device holder 24. In this embodiment, the holder connector assembly 62 kinematically connects the device holder 24 to the carrier 60. With this design, deformation of the carrier 60 does not result in deformation of the device holder 24 or the device 26.

In the embodiment illustrated in FIG. 2H, each of the protrusions 74K is substantially spherical shaped and fits into one of the connector receivers 74L to connect the device holder 24 to the carrier 60. Each connector receiver 74L can be a groove having a substantially triangular shaped cross-section. Each of the connector receivers 74L illustrated in FIG. 2H extends radially. With this design, each protrusion 74K contacts two surfaces of one of the receivers 74L. At each contact point, there is exactly one constraint. Because there are two contact points per protrusion 74K, the holder connector assembly 62 illustrated in FIG. 2G has a total of six degrees of constraint.

In FIG. 2H, the carrier top 70A of the carrier 60 includes three spaced apart, semi-spherical shaped indentations that each receive one of the protrusions 74K and each of the connector receivers 74L is positioned in the holder bottom 68B of the device holder 24. It should be noted that the protrusions 74K extend directly between the holder bottom 68B of the device holder 24 and the carrier top 70A of the carrier 60. Still alternately, instead of the protrusions 74K fitting into indentations, each of the protrusions can have a semi-circular shaped cross-section and can be formed directly into the carrier top 70A.

Figure 2I:
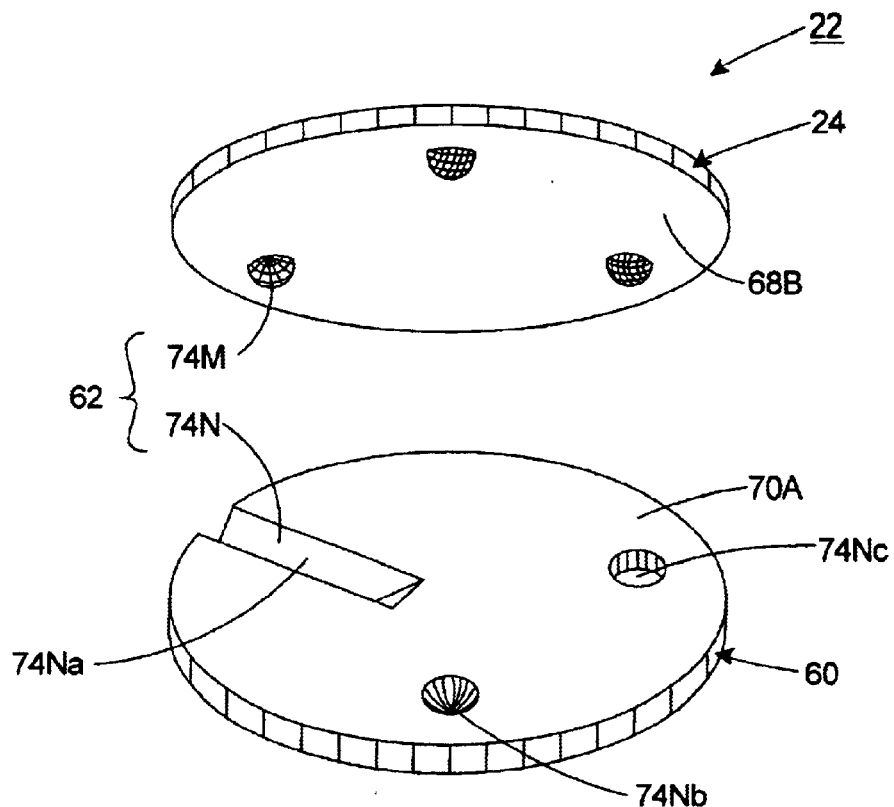

FIG. 2I illustrates another embodiment of the holder connector assembly 62. FIG. 2I illustrates only the device holder 24, the carrier 60 and the holder connector assembly 62. The carrier 60 and the device holder 24 are somewhat similar to the corresponding components described above and illustrated in FIGS. 2A–2C. Further, these components can be incorporated into the stage assembly of FIG. 1. The holder connector assembly 62 is different from the design illustrated in FIGS. 2A–2C and described above.

In FIG. 2I, the holder connector assembly 62 includes three spaced apart protrusions 74M and three spaced apart receivers 74N that cooperate to connect the device holder 24 to the carrier 60. As a result thereof, movement of the carrier 60 results in movement of the device holder 24. In this embodiment, the holder connector assembly 62 kinematically connects the device holder 24 to the carrier 60.

In the embodiment illustrated in FIG. 2I, each of the protrusions 74M is substantially spherical shaped and fits into one of the receivers 74N to connect the device holder 24 to the carrier 60. Each of the receivers 74N has an alternate shape. For example, one of the receivers 74Na is a groove that has a substantially triangular shaped cross-section and extends radially. Another receiver 74Nb includes a cone shaped aperture having a radius that is similar to the radius of one of the protrusions 74M. The final receiver 74Nc includes a right cylindrical shaped aperture and a flat bottom, the aperture has a radius that is larger than the radius of one of the protrusions 74M. With this design, (i) the protrusion 74M and the groove shaped receiver 74Na provides two degrees of constraint; (ii) the protrusion 74M in the cone shaped receiver 74Nb creates three degrees of constraint; and (iii) the protrusion 74M contacts the flat bottom of the cylindrical shaped receiver 74Nc and provides one degree of constraint. Thus, the holder connector assembly 62 provides a total of six degrees of constraint and a kinematic constraint of the device holder 24.

In FIG. 2I, the holder bottom 68B of the device holder 24 includes three spaced apart, semi-spherical shaped indentations that each receive one of the protrusions 74M and each receiver 74N is positioned in the carrier top 70A of the carrier 60. It should be noted that in this embodiment, the protrusions 74M extend directly between the holder bottom 68B of the device holder 24 and the carrier top 70A of the carrier 60.

Still alternately, instead of the protrusions 74M fitting into indentations, each of the protrusions 74M can have a semi-spherical shaped cross-section and can be formed directly into the holder bottom 68B. Alternately, other shapes of the protrusions and the receivers that provide six degrees of constraint can also be utilized. Still alternately, for example, the holder connector assembly 62 could include six wires (not shown) that extend between the device holder 24 and the carrier 60.

Figure 2J:
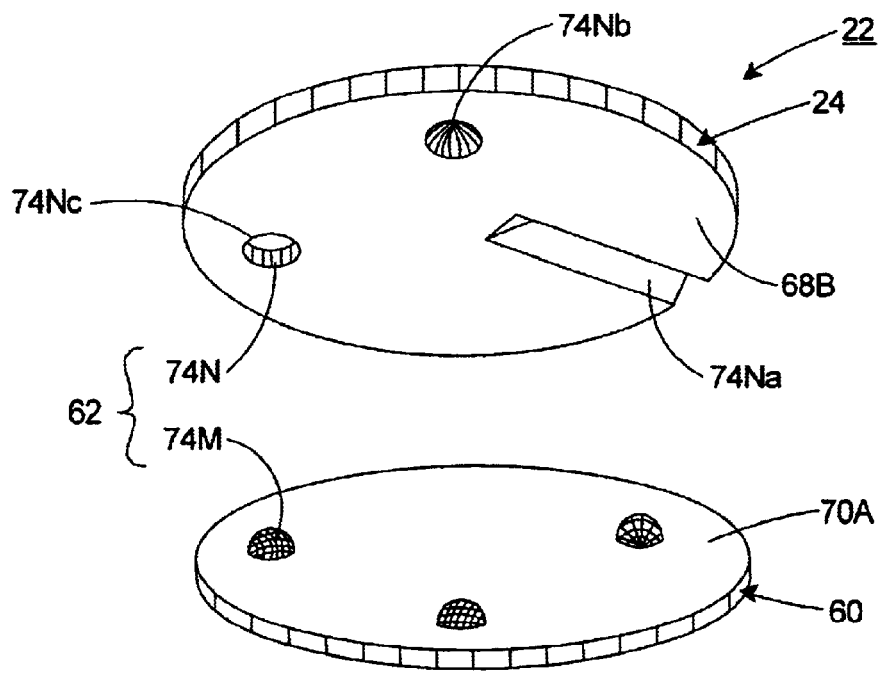

FIG. 2J illustrates yet another embodiment of the holder connector assembly 62. FIG. 2J illustrates only the device holder 24, the carrier 60 and the holder connector assembly 62. The carrier 60 and the device holder 24 are somewhat similar to the corresponding components described above and illustrated in FIGS. 2A–2C. Further, these components can be incorporated into the stage assembly of FIG. 1. The holder connector assembly 62 is similar to the design illustrated in FIG. 2I and described above.

In FIG. 2J, the holder connector assembly 62 includes three spaced apart protrusions 74M and three spaced apart receivers 74N that cooperate to connect the device holder 24 to the carrier 60. As a result thereof, movement of the carrier 60 results in movement of the device holder 24. In this embodiment, the holder connector assembly 62 kinematically connects the device holder 24 to the carrier 60.

In the embodiment illustrated in FIG. 2J, each of the protrusions 74M is substantially spherical shaped and fits into one of the receivers 74N to connect the device holder 24 to the carrier 60. Each of the receivers 74N has an alternate shape. For example, one of the receivers 74Na is a groove that has a substantially triangular shaped cross-section and extends radially. Another receiver 74Nb includes a cone shaped aperture having a radius that is similar to the radius of one of the protrusions 74M. The final receiver 74Nc includes a right cylindrical shaped aperture and a flat bottom, the aperture has a radius that is larger than the radius of one of the protrusions 74M. With this design, (i) the protrusion 74M and the groove shaped receiver 74Na provides two degrees of constraint; (ii) the protrusion 74M in the cone shaped receiver 74Nb creates three degrees of constraint; and (iii) the protrusion 74M contacts the flat bottom of the cylindrical shaped receiver 74Nc and provides one degree of constraint. Thus, the holder connector assembly 62 provides a total of six degrees of constraint and a kinematic constraint of the device holder 24.

In FIG. 2J the carrier top 70A of the carrier 60 includes three spaced apart, semi-spherical shaped indentations that each receive one of the protrusions 74M and each of the receivers 74N is positioned in the holder bottom 68B of the device holder 24. It should be noted that in these embodiments the protrusions 74M extend directly between the holder bottom 68B of the device holder 24 and the carrier top 70A of the carrier 60.

Still alternately, instead of the protrusions 74M fitting into indentations, each of the protrusions 74M can have a semi-spherical shaped cross-section and can be formed directly into the carrier top 70A. Alternately, other shapes of the protrusions and the receivers that provide six degrees of constraint can also be utilized.

Referring to FIGS. 2A–2C, the rotation assembly 64 allows for the rotation of the device 26 relative to the device table 20. Further, the rotation assembly 64 can include a lock that selectively secures the carrier 60 to the device table 20 to selectively inhibit rotation of the carrier 60 and the device 26 relative to the device table 20. The design of the rotation assembly 64 can be varied to suit the design requirements of the holder connector assembly 62. In the embodiment illustrated in FIGS. 2A–2C, the rotation assembly 64 includes a bearing 76 and three spaced apart lift/lock assemblies 78. Further, in this embodiment, (i) the holder central axis 68C, the table central axis 66C, the carrier central axis 70C and the holder axis of rotation 75 are coaxial, (ii) the device holder 24 rotates about the holder central axis 68C and (iii) the carrier 60 rotates about the carrier central axis 70C.

In this embodiment, the bearing 76 is a mechanical roller type bearing that supports the carrier 60 and allows of the rotation of the carrier 60 about the carrier central axis 70C and inhibits unwanted motion of the carrier 60 along the X axis and the Y axis. The bearing 76 can, for example, include an upper bearing component 80A secured to the carrier bottom 70B of the carrier 60 and a lower bearing component 80B secured to the table top 66A of the device table 20. Alternately, for example, the bearing could be a fluid type bearing that supports the carrier 60 relative to the device table 20 in a non-contact fashion.

The lift/lock assemblies 78 selectively lift the carrier 60 to allow for rotation and subsequently lock the carrier 60 to the device table 20. In the embodiment illustrated in FIGS. 2A–2C, each lift/lock assembly 78, includes one or more fluid inlets and one or more fluid outlets. When fluid is released from the fluid outlets and a vacuum is created in the fluid inlets, a vacuum preload type fluid bearing is created that lifts the carrier 60 and allows for rotation of the carrier 60 and the device holder 24 about the Z axis relative to the device table 20. Subsequently, the fluid pressure is turned off and a vacuum remains in the fluid inlets. The vacuum in the lift/lock assemblies 78 clamps the carrier 60 to the device table 20 to inhibit relative rotation between the carrier 60 and the device table 20. It should be noted that the lift/lock assemblies 78 can include another type of mechanism that allows for rotating and locking of the carrier 60 to the device table 20. The mechanism should preferably be a type that does not generate significant heat near the device table 20 and is not too heavy.

Alternately, for example, the rotation assembly 64 can include a magnetic type bearing or other type of bearings that allows for motion of the carrier 60 relative to the device table 20 and another type of lock device.

Figure 3A:
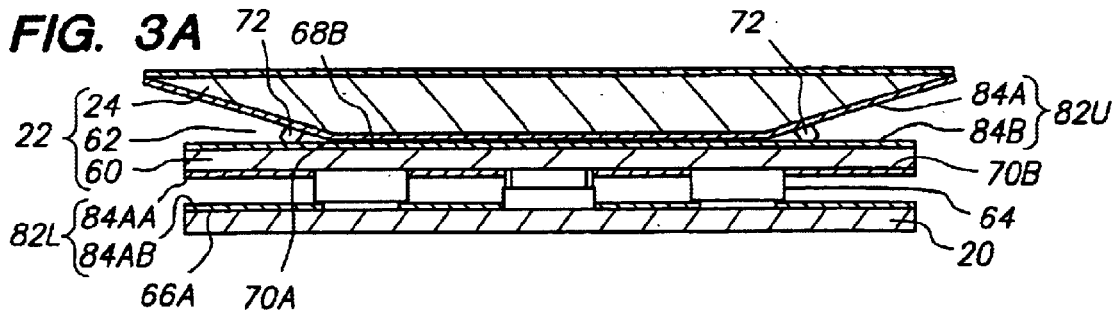
FIG. 3A is a cross-sectional view of a first embodiment of a holder damper assembly, and a holder assembly having features of the present invention.

In the embodiments in which the stage assembly 10 includes a carrier 60, there is a possibility that the device holder 24 will vibrate relative to the carrier 60. Further, there is a possibility that the carrier 60 will vibrate relative to the device table 20. Referring to FIG. 3A, to inhibit vibration of the device holder 24, the holder assembly 22 can include an upper holder damper assembly 82U that dampens vibration of the device holder 24 relative to the carrier 60 and/or a lower holder damper assembly 82L that dampens vibration of the carrier 60 relative to the device table 20. The design of the holder damper assemblies 82U, 82L can be varied.

A number of alternate designs of the holder damper assemblies 82U, 82L are provided herein. For example, FIG. 3A illustrates a cross-sectional view of the holder assembly 22 and a first embodiment of the holder damper assemblies 82U, 82L. FIG. 3A illustrates only the device holder 24, the carrier 60, the holder connector assembly 62, the device table 20, the rotation assembly 64, and the holder damper assemblies 82U, 82L. In this embodiment, the carrier 60, the holder 24, the device table 20, the rotation assembly 64, and the holder connector assembly 62, including flexures 72, are similar to the corresponding components described above and illustrated in FIGS. 2A–2C. Further, these components can be incorporated into the stage assembly of FIG. 1. However, the holder damper assemblies 82U, 82L are included in the embodiment illustrated in FIG. 3A.

In this embodiment, the upper holder damper assembly 82U includes an upper first damping layer 84A that covers substantially the entire holder bottom 68B of the device holder 24 and an upper second damping layer 84B that covers substantially the entire carrier top 70A of the carrier 60. Further, the lower holder damper assembly 82L includes a lower first damping layer 84AA that covers substantially the entire carrier bottom 70B of the carrier 60 and a lower second damping layer 84BB that covers substantially the entire table top 66A of the device table 20. Alternately, one or more of the damping layers 84A, 84AA, 84B, 84BB can cover just a portion of the respective surface. Still alternately, the stage assembly 10 may only include one or more of the damping layers 84A, 84AA, 84B, 84BB.

Each of the damping layers 84A, 84AA, 84B, 84BB can be made of a resilient material such as a viscoelastic material. In this embodiment, the adjacent damping layers 84A, 84B positioned between the device holder 24 and the carrier 60 cooperate to dampen vibration of the device holder 24 relative to the carrier 60 and the adjacent damping layers 84AA, 84BB positioned between the carrier 60 and the device holder 20 cooperate to dampen vibration of the carrier 60 relative to the device holder 20.

Figure 3B:
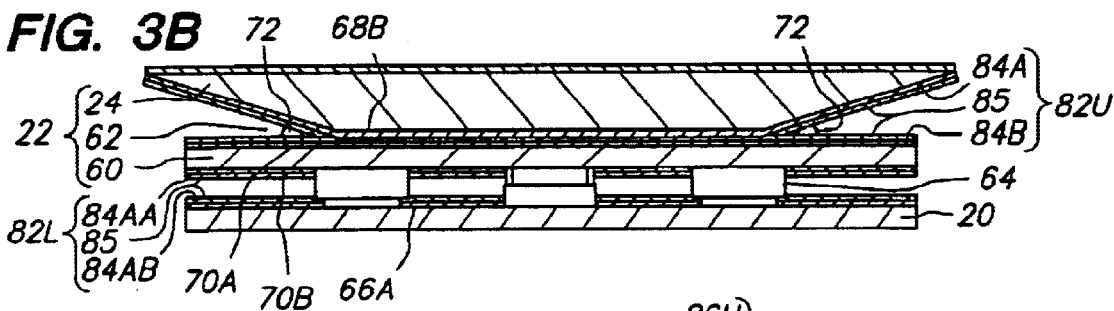
FIG. 3B is a cross-sectional view of another embodiment of the holder damper assembly, and the holder assembly.

FIG. 3B illustrates a cross-sectional view of the holder assembly 22 and another embodiment of the holder damper assemblies 82U, 82L. FIG. 3B illustrates only the device holder 24, the carrier 60, the holder connector assembly 62, the device table 20, the rotation assembly 64, and the holder damper assemblies 82U, 82L. In this embodiment, the carrier 60, the holder 24, the device table 20, the rotation assembly 64, and the holder connector assembly 62, including flexures 72, are similar to the corresponding components described above and illustrated in FIGS. 2A–2C. Further, these components can be incorporated into the stage assembly 10 of FIG. 1. Further, the holder damper assemblies 82U, 82L are somewhat similar to the holder damper assemblies 82U, 82L illustrated in FIG. 3A and described above.

More specifically, in FIG. 3B, the upper holder damper assembly 82 includes the upper first damping layer 84A that covers substantially the entire holder bottom 68B of the device holder 24 and the upper second damping layer 84B that covers substantially the entire carrier top 70A of the carrier 60. Further, the lower holder damper assembly 82L includes a lower first damping layer 84AA that covers substantially the entire carrier bottom 70 of the carrier 60 and a lower second damping layer 84BB that covers substantially the entire table top 66A of the device table 20.

Each of the damping layers 84A, 84B, 84AA, 84BB can be made of a resilient material such as a viscoelastic material. Further, in FIG. 3B, each holder damper assembly 82U, 82L includes a constraining layer 85 of material, such as metal, that covers one or more of the damping layers 84A, 84AA, 84B, 84BB to create a constrained layer type damper. Still alternately, the constraining layer 85 can cover just a portion of one or more of the damping layers 84A, 84AA, 84B, 84BB.

Figure 3C:
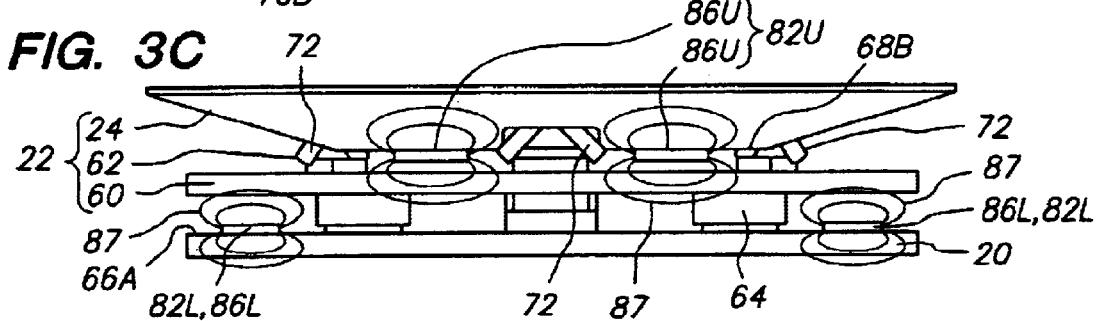
FIG. 3C is a side view of another embodiment of the holder damper assembly, and the holder assembly.

FIG. 3C illustrates side view of the holder assembly 22 and another embodiment of the holder damper assemblies 82U, 82L. FIG. 3C illustrates only the device holder 24, the carrier 60, the device table 20, the rotation assembly 64, the holder connector assembly 62 and the holder damper assemblies 82U, 82L. In this embodiment, the carrier 60, the holder 24, the device table 20, the rotation assembly 64, and the holder connector assembly 62, including flexures 72, are similar to the corresponding components described above and illustrated in FIGS. 2A–2C. Further, these components can be incorporated into the stage assembly of FIG. 1.

However, in FIG. 3C, the upper holder damper assembly 82U includes one or more spaced apart upper, permanent magnets 86U that are secured to the holder bottom 68B of the device holder 24 and the lower holder damper assembly 82L includes one or more spaced apart upper, permanent magnets 86L that are secured to the table top 68A of the device table 20. The magnets 86L, 86U are spaced apart from the carrier 60. In this embodiment, the magnets 86I, 86U generate flux 87 (illustrated as lines in FIG. 3C) that passes through the carrier 60. If the carrier 60 is made of a metal, such as aluminum, the flux 87 will cause eddy currents when there is relative motion between the device holder 24 and the carrier 60 and relative motion between the carrier 60 and the device table 20. The eddy currents will dissipate vibrational energy. This is referred to as eddy current type damping.

Figure 3D:
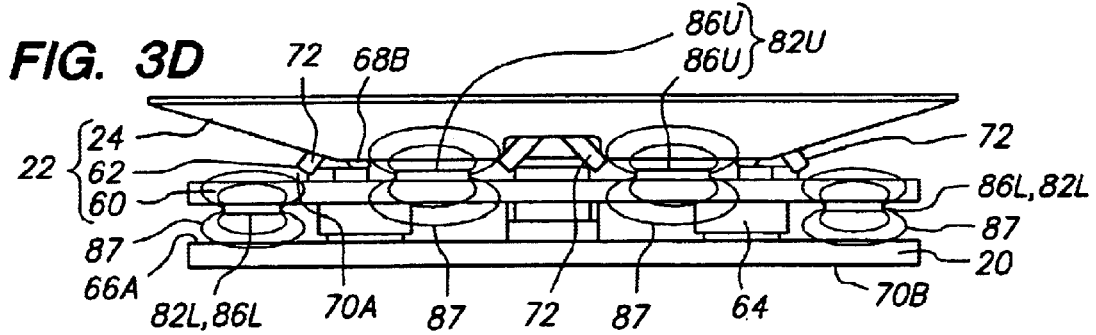
FIG. 3D is a side view of another embodiment of the holder damper assembly, and the holder assembly.

FIG. 3D illustrates side view of the holder assembly 22 and another embodiment of the holder damper assemblies 82U, 82L. FIG. 3D illustrates only the device holder 24, the carrier 60, the device table 20, the rotation assembly 64, the holder connector assembly 62 and the holder damper assemblies 82U, 82L. In this embodiment, the carrier 60, the holder 24, the device table 20, the rotation assembly 64, and the holder connector assembly 62, including flexures 72, are similar to the corresponding components described above and illustrated in FIGS. 2A–2C. Further, these components can be incorporated into the stage assembly 10 of FIG. 1.

The holder damper assemblies 82U, 82L illustrated in FIG. 3D are somewhat similar to the holder damper assemblies 82U, 82L described above and illustrated in FIG. 3C. However, in FIG. 3D, the upper holder damper assembly 82U includes one or more spaced apart permanent magnets 86U that are secured to the carrier top 70A of the carrier 60 and the lower holder damper assembly 82L includes one or more spaced apart permanent magnets 86L that are secured to the carrier bottom 70B of the carrier 60. The magnets 86U, 86L are spaced apart from the device holder 24 and the device table 20. In this embodiment, the magnets 86U, 86L generate flux 87 (illustrated as lines in FIG. 3D) that passes through the device holder 24 and the device table 20. If the device holder 24 and the device table 20 are made of a metal, such as aluminum, the flux 87 will cause eddy currents when there is relative motion between the device holder 24 and the carrier 60 and when there is relative motion between the carrier 60 and the device table 20. The eddy currents will dissipate vibrational energy.

Still alternately, the magnets can be secured to both the device holder 24 and the carrier 60.

Figure 3E:
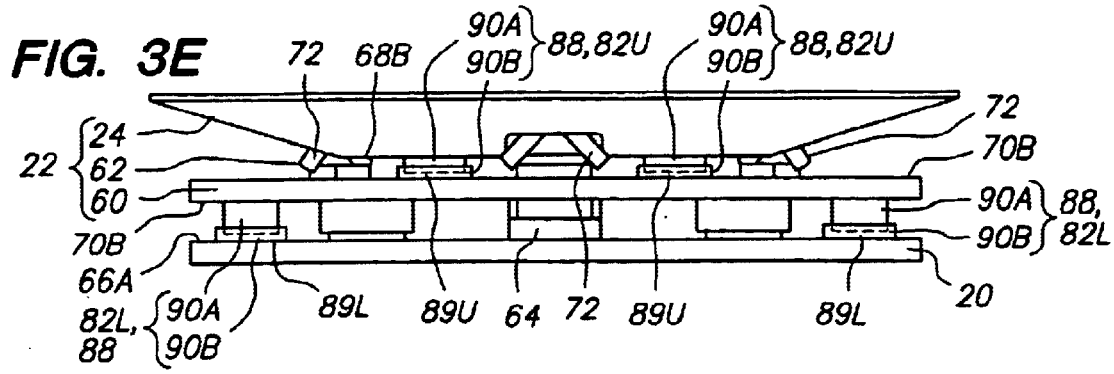
FIG. 3E is a side view of yet another embodiment of the holder damper assembly, and the holder assembly.

FIG. 3E illustrates side view of the holder assembly 22 and another embodiment of the holder damper assemblies 82U, 82L. FIG. 3E illustrates only the device holder 24, the carrier 60, the device table 20, the rotation assembly 64, the holder connector assembly 62 and the holder damper assemblies 82U, 82L. In this embodiment, the carrier 60, the holder 24, the device table 20, the rotation assembly 64, and the holder connector assembly 62, including flexures 72, are similar to the corresponding components described above and illustrated in FIGS. 2A–2C. Further, these components can be incorporated into the stage assembly of FIG. 1.

In FIG. 3E, the holder damper assemblies 82U, 82L utilizes squeeze film type damping. More specifically, a very thin upper gap 89U of fluid, e.g. air, positioned between the device holder 24 and the carrier 60 provides damping and a lower gap 89L of fluid is positioned between the carrier 60 and the device table 20 provides damping. The small gaps 89U, 89L of fluid can exist directly between the device holder 24 and the carrier 60 and directly between the carrier 60 and the device table 20. Alternately, as illustrated in FIG. 3E, each of the holder damper assemblies 82U, 82L can include one or more damping units 88 that create the small fluid gaps 89L, 89U and provide the squeeze-film damping. A portion of a damping unit 88 is illustrated in more detail in FIG. 3F. In this embodiment, each damping unit 88 includes a first damping component 90A and a second damping component 90B. Referring back to FIG. 3E, for each damping unit 88 for the upper damper assembly 82U, the first damping component 90A is secured to the holder bottom 68B of the device holder 24 and the second damping component 90B is secured to the carrier top 70A of the carrier 60. Similarly, for each damping unit 88 for the lower damper assembly 82L, the first damping component 90A is secured to the carrier bottom 70B of the carrier 60 and the second damping component 90B is secured to the table top 66A of the device table 20.

In FIG. 3E, each second damping component 90B has a receiving portion that receives a portion of the respective first damping component 90A. Alternately, for example, the first damping component 90A could include a receiving portion that is sized and shaped to receive a portion of the respective second damping component 90B. A number of alternate shapes of the damping components 90A, 90B are possible. For example, as illustrated in FIGS. 3E and 3F, the second damping component 90B can be substantially rectangular tube shaped and the first damping component 90A can be substantially rectangular shaped and sized to fit within the second damping component 90B. This design allows for damping along the X, Y, and Z axes, and about the X, Y, and Z axes. Alternately, for example, the first damping component 90A can be substantially cylindrical shaped and the second damping component 90B can be substantially annular tube shaped. This design allows for damping along the X axis, the Y axis and the Z axis and about the X axis and the Y axis.

It should be noted that in this embodiment, the rotation assembly 64 must lift the carrier 60 until the first damping component 90A is removed from the second damping component 90B prior to rotating the carrier 60 relative to the device table 20.

FIG. 3G illustrates another embodiment of a portion of the upper holder damper assembly 82U and a portion of a flexure 72. The flexure 72 is similar to the corresponding component described above and illustrated in FIGS. 2A–2C. Further, the upper holder damper assembly 82U can be incorporated into the stage assembly of FIG. 1. In FIG. 3G, the upper holder damper assembly 82U includes a flexure damping layer 92 (illustrated as cross-hatching in FIG. 3G) that covers a portion or all of one or more of the flexures 72 (only one is illustrated in FIG. 3G). The flexure damping layer 92 dampens vibration in the flexure 72. The flexure damping layer 92 can be a resilient material such as a viscoelastic material. Alternately, for example, the size, shape and material in each flexure 72 can be adjusted to provide damping.

FIG. 4A illustrates another embodiment of the stage assembly 10 for moving the device 26 and FIG. 4B illustrates a portion of the stage assembly 10 of FIG. 4A. In this embodiment, the stage assembly 10 includes the stage base 12, the stage mover assembly 14, the stage 15, the device table 20, and the holder assembly 22. The stage base 12, the stage mover assembly 14, the stage 15, and the device table 20 are similar to equivalent components described above and illustrated in FIG. 1. However, the holder assembly 22 is somewhat different from the holder assemblies described above.

More specifically, the holder assembly 22 illustrated in FIGS. 4A and 4B includes the device holder 24 and the rotation assembly 64 that are similar to the equivalent components described above and illustrated in FIGS. 2A–2C. The rotation assembly 64 allows for rotation of the device holder 24 relative to the device table 20 about the holder axis of rotation 75. The table central axis 66C, and the holder central axis 68C are also illustrated in FIG. 4B. The embodiment illustrated in FIGS. 4A and 4B does not include the carrier 60 or the holder connector assembly 62 illustrated in FIGS. 2A–2C. In this embodiment, the rotation assembly 64 secures the holder bottom 68B of the device holder 24 to the table top 66A of the device table 20 and inhibits rotation and/or movement of the device holder 24 and the device 26 relative to the device table 20. In the embodiment illustrated in FIGS. 4A and 4B, the rotation assembly 64 again includes the bearing 76 and the three spaced apart lift/lock assemblies 78 (only two are illustrated) that are similar to the corresponding components described above. However, in this embodiment, the bearing 76 and the lift/lock assemblies 78 act directly upon the device holder 24.

Figure 4C:
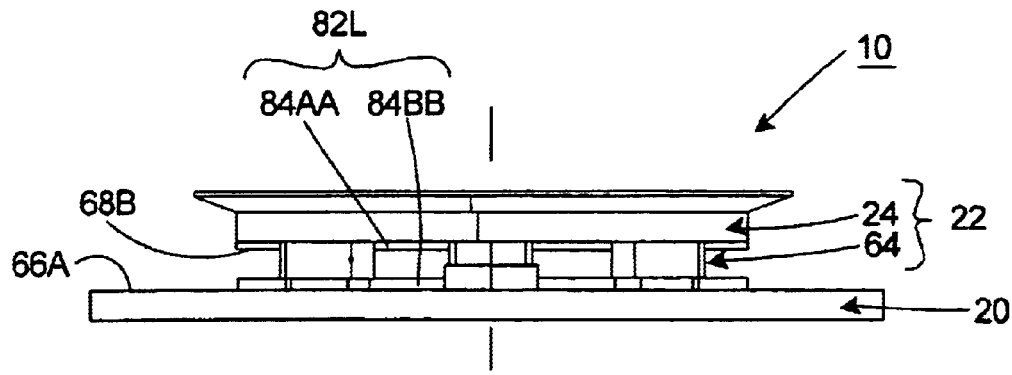
FIG. 4C is a side view of another embodiment of a holder damper assembly, and a holder assembly having features of the present invention.

FIGS. 4C–4G each illustrate a number of additional alternate designs of the lower holder damper assembly 82L that can be incorporated into the stage assembly 10 of FIG. 4A. For example, FIG. 4C illustrates a side view of the holder assembly 22 and the lower holder damper assembly 82L. FIG. 4C illustrates only the device holder 24, the device table 20, the holder rotation assembly 64, and the lower holder damper assembly 82L. In this embodiment, the device holder 24, the device table 20, and the holder rotation assembly 64 are similar to the corresponding components described above and illustrated in FIG. 4B. Further, these components can be incorporated into the stage assembly 10 of FIG. 4A.

In this embodiment, the lower holder damper assembly 82L includes the lower, first damping layer 84AA that covers substantially the entire holder bottom 68B of the device holder 24 and the lower, second damping layer 84BB that covers substantially the entire table top 66A of the device table 20. Each of the damping layers 84AA, 84BB can be made of a resilient material such as a viscoelastic material. In this embodiment, the adjacent damping layers 84AA, 84BB positioned between the device holder 24 and the device table 20 cooperate to dampen vibration of the device holder 24 relative to the device table 20.

Figure 4D:
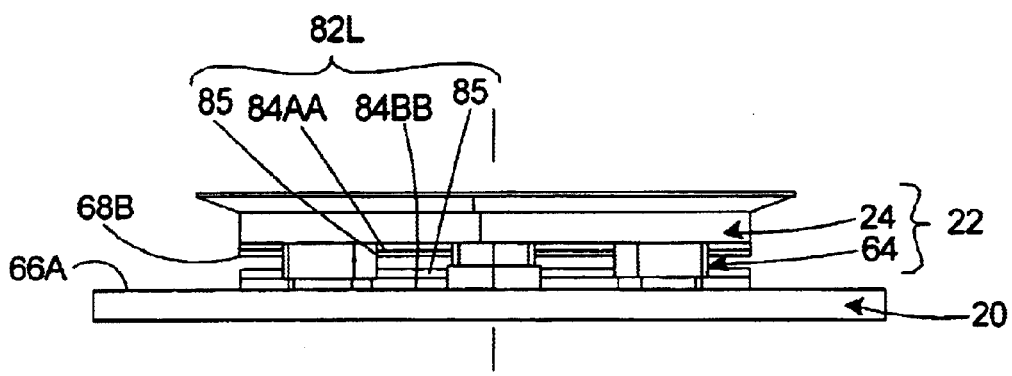
FIG. 4D is a side view of another embodiment of the holder damper assembly, and the holder assembly.

FIG. 4D illustrates a side view of the holder assembly 22 and another embodiment of the lower, holder damper assembly 82L. FIG. 4D illustrates only the device holder 24, the device table 20, the rotation assembly 64 and the lower, holder damper assembly 82L. In this embodiment, the device holder 24, the device table 20 and the rotation assembly 64 are similar to the corresponding components described above and illustrated in FIG. 4B. Further, these components can be incorporated into the stage assembly of FIG. 4A. Further, the lower holder damper assembly 82L is somewhat similar to the lower holder damper assembly 82L illustrated in FIG. 4C and described above.

More specifically, in FIG. 4D, the lower holder damper assembly 82L includes the lower first damping layer 84AA that covers substantially the entire holder bottom 68B of the device holder 24 and the lower second damping layer 84BB that covers substantially the entire table top 66A of the device table 20. Each of the lower damping layers 84AA, 84BB can be made of a resilient material such as a viscoelastic material. Further, in FIG. 4D, the lower holder damper assembly 82L includes the constraining layer 85 of material, such as metal, that covers one or both of the damping layers 84AA, 84BB to create a constrained layer type damper. Still alternately, the constraining layer 85 can cover just a portion of one or both of the damping layers 84AA, 84BB.

Figure 4E:
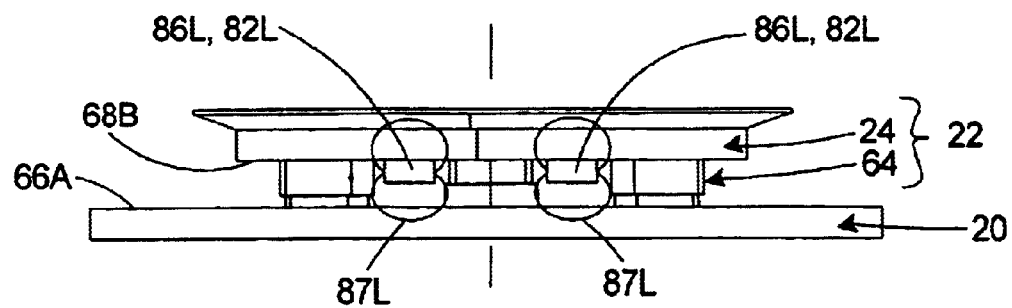
FIG. 4E is a side view of another embodiment of the holder damper assembly, and the holder assembly.

FIG. 4E illustrates a side view of the holder assembly 22 and another embodiment of the lower holder damper assembly 82L. FIG. 4E illustrates only the device holder 24, the device table 20, the rotation assembly 64 and the lower holder damper assembly 82L. In this embodiment, the device holder 24, the device table, and the rotation assembly 64, are similar to the corresponding components described above and illustrated in FIG. 4B. Further, these components can be incorporated into the stage assembly of FIG. 4A.

However, in FIG. 4E, the lower holder damper assembly 82L includes one or more spaced apart lower permanent magnets 86L that are secured to the holder bottom 68B of the device holder 24. The magnets 86L are spaced apart from the table top 66A of the device table 20. In this embodiment, the magnets 86L generate flux 87L (illustrated as lines in FIG. 4E) that passes through the device table 20. If the device table 20 is made of a metal, such as aluminum, the flux 87L will cause eddy currents when there is relative motion between the device holder 24 and the device table 20. The eddy currents will dissipate vibrational energy. This is referred to as eddy current type damping.

Figure 4F:
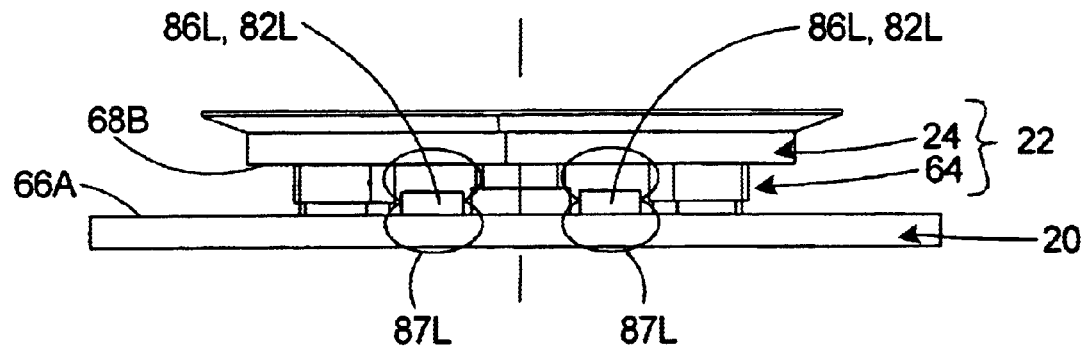
FIG. 4F is a side view of another embodiment of the holder damper assembly, and the holder assembly.

FIG. 4F illustrates a side view of the holder assembly 22 and another embodiment of the lower, holder damper assembly 82. FIG. 4F illustrates only the device holder 24, the device table 20, the rotation assembly 64, and the lower holder damper assembly 82L. In this embodiment, the device holder 24, the device table 20, and the rotation assembly 64 are similar to the corresponding components described above and illustrated in FIG. 4B. Further, these components can be incorporated into the stage assembly of FIG. 4A.

The lower holder damper assembly 82L illustrated in FIG. 4F is somewhat similar to the lower holder damper assembly 82L described above and illustrated in FIG. 4D. However, in FIG. 4F, the lower holder damper assembly 82L includes one or more spaced apart permanent magnets 86L that are secured to the table top 66A of the device table 20. The magnets 86L are spaced apart from the holder bottom 68B of the device holder 24. In this embodiment, the magnets 86L generate flux 87L (illustrated as lines in FIG. 4F) that passes through the device holder 24. If the device holder 24 is made of a metal, such as aluminum, the flux 87L will cause eddy currents when there is relative motion between the device holder 24 and the device table 20. The eddy currents will dissipate vibrational energy.

Still alternately, the magnets can be secured to both the device holder 24 and the device table 20.

Figure 4G:
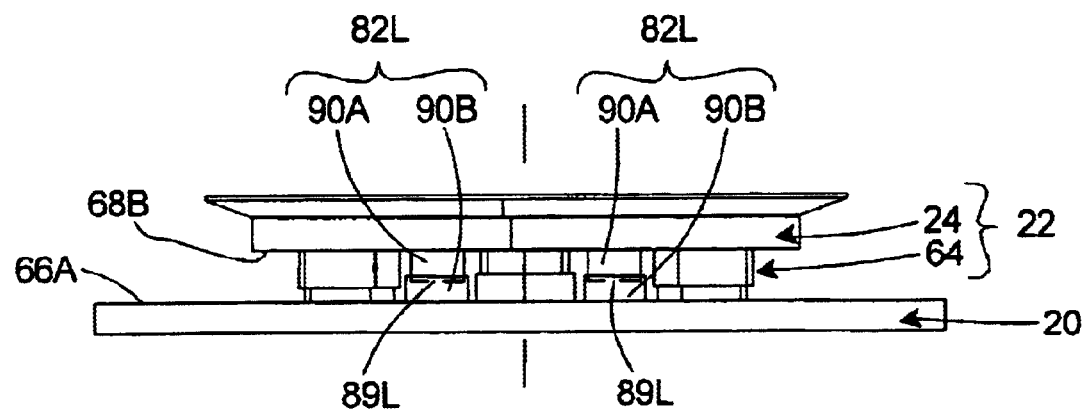
FIG. 4G is a side view of yet another embodiment of the holder damper assembly, and the holder assembly.

FIG. 4G illustrates side view of the holder assembly 22 and another embodiment of the lower holder damper assembly 82L. FIG. 4G illustrates only the device holder 24, the device table 20, the rotation assembly 64 and the lower holder damper assembly 82L. In this embodiment, the device holder 24, the device table 20 and the rotation assembly 64 are similar to the corresponding components described above and illustrated in FIG. 4B. Further, these components can be incorporated into the stage assembly of FIG. 4A.

In FIG. 4G, the lower holder damper assembly 82L utilizes squeeze film type damping. More specifically, a very thin gap 89L of fluid, e.g. air, positioned between the device holder 24 and the device table 20 provides damping. The small gap 89L of fluid can exist directly between the device holder 24 and the device table 20. Alternately, as illustrated in FIG. 4G, the lower holder damper assembly 82L includes one or more lower damping units 88 that create the small fluid gap 89L and provide the squeeze-film damping. The damping unit 88 can be similar to the damping unit illustrated in FIG. 3F and described above. In this embodiment, each damping unit 88 includes the first damping component 90A secured to the holder bottom 68B of the device holder 24 and the second damping component 90B secured to the table top 66A of the device table 20. In FIG. 4G, the lower second damping component 90B has a receiving portion that receives a portion of the first damping component 90A. Alternately, for example, the first damping component 90A could include a receiving portion that is sized and shaped to receive a portion of the lower second damping component 90B.

A number of alternate shapes of the damping components 90A, 90B are possible. For example, the second damping component 90B can be substantially rectangular tube shaped and the first damping component 90A can be substantially rectangular shaped and sized to fit within the second damping component 90B. This design allows for damping along the X, Y, and Z axes, and about the X, Y, and Z axes. Alternately, for example, the first damping component 90A can be substantially cylindrical shaped and the lower second damping component 90B can be substantially annular tube shaped. This design allows for damping along the X axis, the Y axis and the Z axis and about the X axis and the Y axis.

It should be noted in this embodiment, the rotation assembly 64 must lift device holder 24 until the first damping component 90A is removed from the second damping component 90B prior to rotating the device holder 24 relative to the device table 20.

Figure 5A:
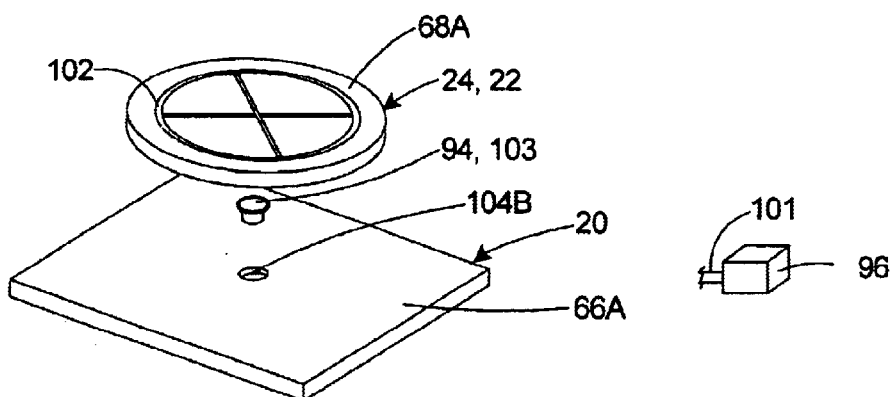
FIG. 5A is an exploded perspective view of a first embodiment of a fluid connector, a portion of the holder assembly, and a device table having features of the present invention.
Figure 5B:
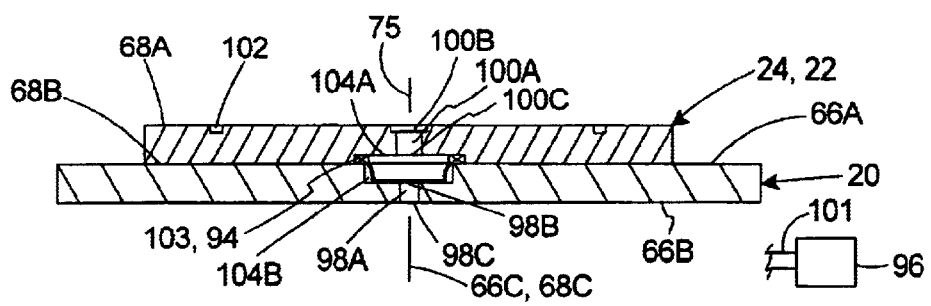
FIG. 5B is a cutaway view of the fluid connector, the holder assembly and the device table of FIG. 5A.

Referring to FIGS. 5A and 5B, if the device holder 24 utilizes a vacuum chuck, the holder assembly 22 can include a fluid connector 94 that connects the device holder 24 in fluid communication with a fluid source 96, such as a vacuum source, and allows the device holder 24 to be easily moved relative to the device table 20. More specifically, FIG. 5A illustrates an exploded perspective view and FIG. 5B illustrates a cut-away view of a first embodiment of the fluid connector 94. FIGS. 5A and 5B illustrate only the device holder 24, the device table 20, and the fluid connector 94. The rotation assembly 64 is not illustrated in FIGS. 5A and 5B. The device holder 24 and the device table 20 are similar to the corresponding components described above and illustrated in FIGS. 4A and 4B. Further, these components can be incorporated into the stage assembly of FIG. 4A.

In FIGS. 5A and 5B, (i) the device table 20 includes a table aperture 98A having a table inlet 98B and a table outlet 98C that are positioned along the table central axis 66C of the device table 20, and (ii) the device holder 24 includes a holder aperture 100A having a holder inlet 100B and a holder outlet 100C that are positioned along the holder housing central axis 68C of the device holder 24. In this embodiment, the holder inlet 100B is in fluid communication with a channel 102 in the holder top 68A that includes an annular shaped section and a cross shaped section. The fluid source 96 creates a vacuum in the channel 102 that pulls the device 26 (not shown in FIGS. 5A and 5B) against the holder top 68A of the device holder 24. A fluid conduit 101 connects the fluid source 96 in fluid communication with the table outlet 98C.

In FIGS. 5A and 5B, the fluid connector 94 connects the table inlet 98B in fluid communication with the holder outlet 100C while allowing the device holder 24 to be lifted, moved and/or rotated relative to the device table 20 with minimal resistance and vacuum loss from the channel 102.

In this embodiment, the fluid connector 94 includes a flexible seal 103 that maintains fluid communication between the table inlet 98B and the holder outlet 100C with minimal leakage while allowing the device holder 24 to be lifted and rotated relative to the device table 20. More specifically, in this embodiment, the holder bottom 68B includes a cylindrical shaped, first groove 104A and the table top 66A includes a cylindrical shaped second groove 104B. The flexible seal 103 is an annular shaped flexible flap that is made of a resilient material such as rubber. The flexible seal 103 includes a first end that is positioned in the first groove 104A and contacts the device holder 24 and an opposed second end that is positioned in the second groove 104B and contacts the device table 20. Stated another way, (i) the flexible seal 103 is positioned adjacent to and covers the table inlet 98B, (ii) the flexible seal 103 extends upward from the device table 20 against the device holder 24 and, (iii) the flexible seal 103 is positioned adjacent to and covers the holder outlet 100C.

It should be noted that the outer diameter of the flexible seal 103 increases gradually and tapers from approximately half-way between the top and the bottom of the flexible seal 103 to near the top of the flexible seal 103. Stated another way, the top of the flexible seal 103 is flared outward. With this design, when the device holder 24 is lifted prior to rotation, the flexible seal 103 maintains contact with the device holder 24 and the device table 20. Typically, as provided herein, the flexible seal 103 has a height between the ends of between 1 and 10 mm. In one embodiment, the second end of the seal 103 is fixedly secured to the device table 20 and the first end of the seal 103 is not fixedly secured to the device holder 24. Further, the vacuum assists in maintaining the seal 103 in contact with the device holder 24 and the device table 20. Alternately, for example, the first end could be fixedly secured or neither end could be fixedly secured.

It should also be noted that the flexible seal 103 is substantially centered along the housing axis of rotation 75 and the holder central axis 68C. This design allows the flexible seal 103 to maintain contact during rotation of the device holder 24. If the stage assembly 10 includes a bearing 76 (illustrated in FIG. 4B) to rotate the device holder 24, the bearing 76 can include a central channel (not shown) for receiving the seal 103 and the bearing can encircle the flexible seal 103.

Figure 5C:
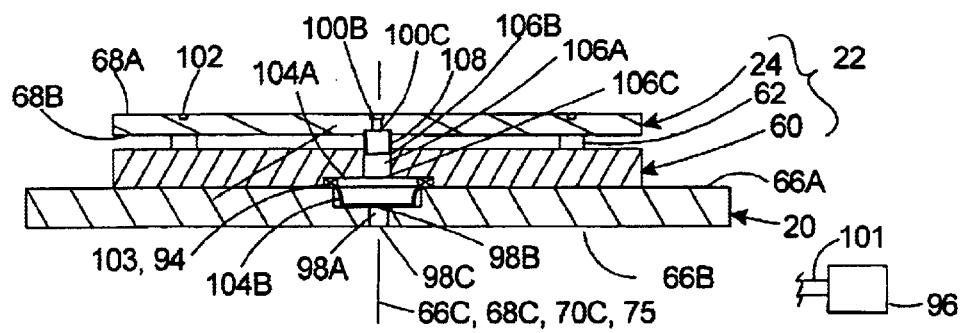
FIG. 5C is a cutaway view of another embodiment of the fluid connector, the holder assembly and the device table.

FIG. 5C illustrates a cross-sectional view of another embodiment of the fluid connector 94 that connects the device holder 24 in fluid communication with the fluid source 96, and allows the device holder 24 to be easily moved relative to the device table 20. FIG. 5C illustrates only the device holder 24, the carrier 60, and the holder connector assembly 62, the device table 20, and the fluid connector 94. The rotation assembly is not illustrated in FIG. 5C for clarity. The device holder 24, the carrier 60, the holder connector assembly 62, and the device table 20 are similar to the corresponding components described above and illustrated in FIGS. 2A–2C. Further, these components can be incorporated into the stage assembly of FIG. 1. The fluid connector 94 illustrated in FIG. 5C is somewhat similar to the fluid connector 94 illustrated in FIGS. 5A and 5B.

In FIG. 5C, (i) the device table 20 includes the table aperture 98A having the table inlet 98B and the table outlet 98C that are positioned along the table central axis 66C of the device table 20, (ii) the device holder 24 includes the holder aperture 100A having the holder inlet 100B and the holder outlet 100C that are positioned along the holder housing central axis 68C of the device holder 24, and (iii) the carrier 60 having a carrier aperture 106A that includes a carrier inlet 106B and a carrier outlet 106C that are positioned along the carrier central axis 70C of the carrier 60. The holder inlet 100B is in fluid communication with the channel 102 in the holder top 68A. The fluid source 96 creates a vacuum in the channel 102 that pulls the device 26 (not shown in FIG. 5C) against the holder top 68A of the device holder 24. The fluid conduit 101 connects the fluid source 96 in fluid communication with the table outlet 98C.

In this embodiment, the fluid connector 94 includes the flexible seal 103 that is similar to the flexible seal 103 described above and illustrated in FIGS. 5A and 5B. However, in this embodiment, the flexible seal 103 extends between the table inlet 98B and the carrier outlet 106C and maintains fluid communication between the table inlet 98B and the carrier outlet 106C with minimal leakage while allowing the device holder 24 and the carrier 60 to be lifted, rotated, and/or moved relative to the device table 20.

In this embodiment, the carrier bottom 70B includes a cylindrical shaped, first groove 104A and the table top 66A includes a cylindrical shaped second groove 104B. The flexible seal 103 is an annular shaped flexible flap that is made of a resilient material such as rubber. The flexible seal 103 includes a first end that is positioned in the first groove 104A and contacts the carrier 60 and an opposed second end that is positioned in the second groove 104B and contacts the device table 20. Stated another way, (i) the flexible seal 103 is positioned adjacent to and covers the table inlet 98B, (ii) the flexible seal 103 extends upward from the device table 20 against the carrier 60 and, (iii) the flexible seal 103 is positioned adjacent to and covers the carrier outlet 106C.

It should be noted that the outer diameter of the flexible seal 103 increases gradually and tapers from approximately half-way between the top and the bottom of the flexible seal 103 to near the top of the flexible seal 103. Stated another way, the top of the flexible seal 103 is flared outward. With this design, when the device holder 24 is lifted prior to rotation, the flexible seal 103 maintains contact with the carrier 60 and the device table 20. Typically, as provided herein, the flexible seal 103 has a height between the ends of between 1 and 10 mm. In one embodiment, the second end of the seal 103 is fixedly secured to the device table 20 and the first end of the seal 103 is not fixedly secured to the carrier 60. Further, the vacuum assists in maintaining the seal 103 in contact with the carrier 60 and the device table 20. Alternately, for example, the first end could be fixedly secured or neither end could be fixedly secured.

It should also be noted that the flexible seal 103 is substantially centered along the housing axis of rotation 75 and the carrier central axis 70C. This design allows the flexible seal 103 to maintain contact during rotation of the device holder 24. If the stage assembly 10 includes a bearing 76 (illustrated in FIG. 2A) to rotate the device holder 24, the bearing 76 can include a central channel (not shown) for receiving the seal 103 and the bearing can encircle the flexible seal 103.

Moreover, the fluid connector 94 includes a tubular shaped connector hose 108 that connects the carrier inlet 106B in fluid communication with the holder outlet 100C. In this embodiment, because the device holder 24 and the carrier 60 move and rotate simultaneously, the connector hose 108 will not inhibit the movement of the device holder 24 relative to the device table 20. The fluid connector 94 and the flexible seal 103 are both substantially centered on the holder axis of rotation 75. Alternately, for example, the connector hose 108, the holder outlet 100C and the carrier inlet 106B do not need to be on the holder axis of rotation 75.

Figure 5D:
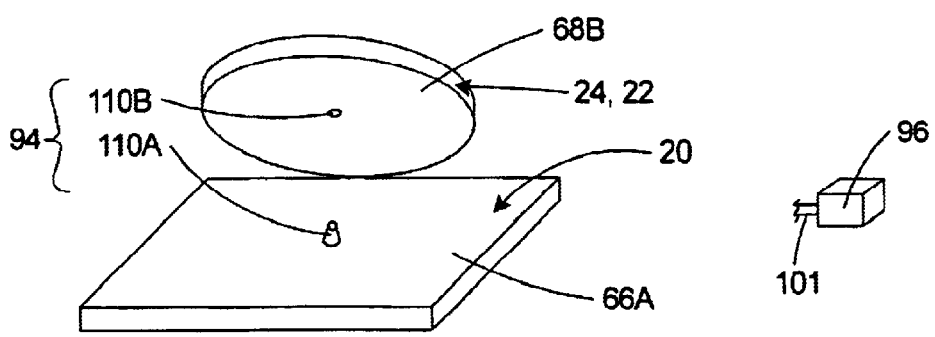
FIG. 5D is an exploded perspective view of another embodiment of the fluid connector, the holder assembly and the device table.
Figure 5E:
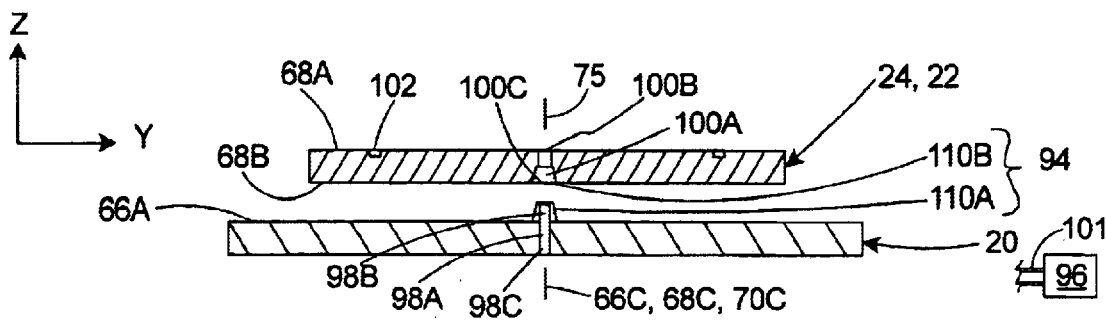
FIG. 5E is an exploded cut-away view of the fluid connector, the holder assembly and the device table of FIG. 5D.

FIG. 5D illustrates an exploded perspective view and FIG. 5E illustrates an exploded cut-away view of another embodiment of the fluid connector 94 that connects the device holder 24 in fluid communication with the fluid source 96 and allows the device holder 24 to be easily moved relative to the device table 20. FIGS. 5D and 5E illustrate only the device holder 24, the device table 20, and the fluid connector 94. The rotation assembly is not illustrated in FIGS. 5D and 5E. The device holder 24 and the device table 20 are somewhat similar to the corresponding components described above and illustrated in FIGS. 4A and 4B. Further, these components can be incorporated into the stage assembly of FIG. 4A.

In FIGS. 5D and 5E, (i) the device table 20 includes the table aperture 98A having the table inlet 98B and the table outlet 98C that are positioned along the table central axis 66C of the device table 20, and (ii) the device holder 24 includes the holder aperture 100A having the holder inlet 100B and the holder outlet 100C that are positioned along the holder housing central axis 68C of the device holder 24. In this embodiment, the holder inlet 100B is in fluid communication with the channel 102 in the holder top 68A. The fluid source 96 creates a vacuum in the channel 102 that pulls the device (not shown in FIGS. 5D and 5E) against the holder top 68A of the device holder 24. The fluid conduit 101 connects the fluid source 96 in fluid communication with the table outlet 98C.

In FIGS. 5D and 5E, the fluid connector 94 connects the table inlet 98B in fluid communication with the holder outlet 100C while allowing the device holder 24 to be lifted, moved and/or rotated relative to the device table 20 with minimal resistance and vacuum loss from the channel 102. In this embodiment, the fluid connector 94 includes a needle 110A and a needle aperture 110B that are designed to maintain fluid communication with minimal leakage while allowing the device holder 24 to be lifted and/or rotated relative to the device table 20.

In this embodiment, the needle 110A is tube shaped and has a proximal end and a cantilevering distal end. The outer diameter of the needle 110A tapers from the proximal end to the distal end. It should be noted that the taper is exaggerated in the Figures for clarity. The amount of taper of the needle 110A can be varied. In the embodiments provided herein, the angle of the outer diameter of the needle relative to the Z axis is between approximately five degrees and thirty degrees and the angle relative to the Y axis is between approximately ninty-five degrees to seventy degrees. However, other angles are possible.

The needle aperture 110B is sized and shaped to receive the needle 110A. More specifically, in embodiments illustrated in FIGS. 5D and 5E, the needle aperture 110B is shaped similar to a right circular cone and has a taper that corresponds to the taper of the needle 110A. With this design, as the device holder 24 is lifted, the needle 110A still fits in the narrow needle aperture 110B and vacuum pressure is not lost at the device holder 24. Stated another way, the gap between the needle 110A and the needle aperture 110B increases a relatively small amount when compared to the increasing gap between the device table 20 and the device holder 24 as the device holder 24 is lifted.

The relationship between (i) the change in the gap ($\Delta G$) between the needle 110A and the needle aperture 110B and (ii) the change in gap ($\Delta Z$) between the device table 20 and the device holder 24 can be determined by the formula $\Delta G = \Delta Z \sin \theta$ (where $\theta$ is the angle of the outer diameter of the needle 110A relative to the Z axis). For example, if the device holder 24 is lifted approximately five microns ($\Delta Z = 5$ microns) relative to the device table 20, and $\theta$ is approximately equal to 15 degrees, the change in the gap ($\Delta G$) between the needle 110A and the needle aperture 110B is approximately 1.3 microns. It should be noted that the gap ($\Delta G$) allows the device holder 24 to rotate relative to the device table 20 without restriction and with minimal vacuum leakage. Further, the fluid connector 94 maintains fluid communication between the device holder 24 and the device table 20 in a non-contact fashion.

Further, in the embodiments illustrated in FIGS. 5D and 5E, the needle 110A and the needle aperture 110B are positioned substantially along the housing axis of rotation 75. This allows the device holder 24 to be rotated and/or moved relative to the device table 20 without interference from the fluid connector 94. If the stage assembly includes a bearing 76 (illustrated in FIG. 4B) to rotate the device holder 24, the bearing 76 can include a central channel for receiving the needle 110A and the bearing 76 can encircle the needle 110A. Alternatively, the needle 110A and the needle aperture 110B can act and function as the bearing 76.

In FIGS. 5D and 5E, the needle 110A extends upward from the table top 66A around the table inlet 98B and is integrally formed with the device table 20. Further, the needle aperture 110B is integrally formed in the holder bottom 68B of the device holder 24. Alternately, for example, the needle 110A can be added to the table top 66A.

Figure 5F:
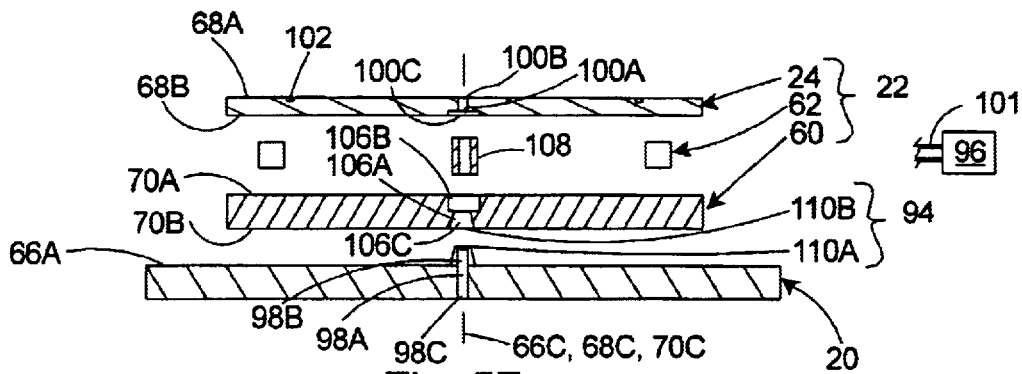
FIG. 5F is an exploded cut-away view of still another embodiment of the fluid connector, the holder assembly and the device table.

FIG. 5F illustrates a cross-sectional view of another embodiment of the fluid connector 94 that connects the device holder 24 in fluid communication with the fluid source 96 and allows the device holder 24 to be easily moved relative to the device table 20. FIG. 5F illustrates only the device holder 24, the carrier 60, and the holder connector assembly 62, the device table 20, and the fluid connector 94. The rotation assembly 64 is not illustrated in FIG. 5F. The device holder 24, the carrier 60, the holder connector assembly 62, and the device table 20 are somewhat similar to the corresponding components described above and illustrated in FIGS. 2A–2C. Further, these components can be incorporated into the stage assembly of FIG.

1. The fluid connector 94 illustrated in FIG. 5F is somewhat similar to the fluid connector 94 illustrated in FIGS. 5D and 5E.

In FIG. 5F, (i) the device table 20 includes the table aperture 98A having the table inlet 98B and the table outlet 98C that are positioned along the table central axis 66C of the device table 20, (ii) the device holder 24 includes the holder aperture 100A having the holder inlet 100B and the holder outlet 100C that are positioned along the holder housing central axis 68C of the device holder 24, and (iii) the carrier 60 having carrier aperture 106A that includes the carrier inlet 106B and the carrier outlet 106C that are positioned along the carrier central axis 70C. The holder inlet 100B is in fluid communication with the channel 102 in the holder top 68A. The fluid source 96 creates a vacuum in the channel 102 that pulls the device 26 against the holder top 68A of the device holder 24. The fluid conduit 101 connects the fluid source 96 in fluid communication with the table outlet 98C.

In FIG. 5F, the fluid connector 94 connects the table inlet 98B in fluid communication with the carrier outlet 106C while allowing the device holder 24 to be lifted, moved and/or rotated relative to the device table 20 with minimal resistance and vacuum loss from the channel 102. More specifically, the fluid connector 94 connects the table inlet 98B in fluid communication with the carrier outlet 106C while allowing the device holder 24 to be lifted, moved and/or rotated relative to the device table 20 with minimal resistance and vacuum loss from the channel 102. In this embodiment, the fluid connector 94 includes the needle 110A and the needle aperture 110B that are designed to maintain fluid communication with minimal leakage while allowing the device holder 24 to be lifted and/or rotated relative to the device table 20.

In this embodiment, the needle 110A is tube shaped and has a proximal end and a cantilevering distal end. The outer diameter of the needle 110A tapers from the proximal end to the distal end. The taper is exaggerated in the Figures for clarity. The amount of taper of the needle 110A can be varied. In the embodiments provided herein, the angle of the outer diameter of the needle relative to the Z axis is between approximately five degrees and thirty degrees. However, other angles are possible.

The needle aperture 110B is sized and shaped to receive the needle 110A. More specifically, in embodiments illustrated in FIG. 5F, the needle aperture 110B is shaped similar to a right circular cone and has a taper that corresponds to the taper of the needle 110A. With this design, as the device holder 24 is lifted, the needle 110A still fits in the narrow needle aperture 110B and vacuum pressure is not lost at the device holder 24. Stated another way, the gap between the needle 110A and the needle aperture 110B increases a relatively small amount when compared to the increasing gap between the device table 20 and the device holder 24 as the device holder 24 is lifted.

The relationship between (i) the change in the gap ($\Delta G$) between the needle 110A and the needle aperture 110B and (ii) the change in gap ($\Delta Z$) between the device table 20 and the carrier 60 is determined by the formula $\Delta G = \Delta Z \sin \theta$ (where $\theta$ is the angle of the outer diameter of the needle 110A relative to the Z axis). For example, if the carrier 60 is lifted approximately five microns ($\Delta Z = 5$ microns) relative to the device table 20, and $\theta$ is approximately equal to 15 degrees, the change in the gap ($\Delta G$) between the needle 110A and the needle aperture 110B is approximately 1.3 microns. It should be noted that the gap ($\Delta G$) allows the device holder 24 to rotate relative to the device table 20 without restriction and with minimal vacuum leakage. Further, the fluid connector 94 maintains fluid communication between the carrier 60 and the device table 20 in a non-contact fashion.

Further, in the embodiment illustrated in FIG. 5F, the needle 110A and the needle aperture 110B are positioned substantially along the housing axis of rotation 75. This allows the device holder 24 and carrier 60 to be rotated and/or moved relative to the device table 20 without interference from the fluid connector 94. If the stage assembly 10 includes a bearing 76 (illustrated in FIG. 2A) to rotate the device holder 24, the bearing 76 can include a central channel for receiving the needle 110A and the bearing 76 can encircle the needle 110A. Alternatively, the needle 110A and the needle aperture 110B can act and function as the bearing 76.

In FIG. 5F, the needle 110A extends upward from the table top 66A and the needle aperture 110B is integrally formed in the carrier bottom 70B of the device holder 24. Moreover, the fluid connector 94 includes the tubular shaped connector hose 108 that extends between the holder bottom 68B and the carrier top 70A and connects the carrier inlet 106B in fluid communication with the holder outlet 100C. In this embodiment, because the device holder 24 and the carrier 60 move and rotate simultaneously, the connector hose 108 will not inhibit the movement of the device holder 24 relative to the device table 20.

Figure 5G:
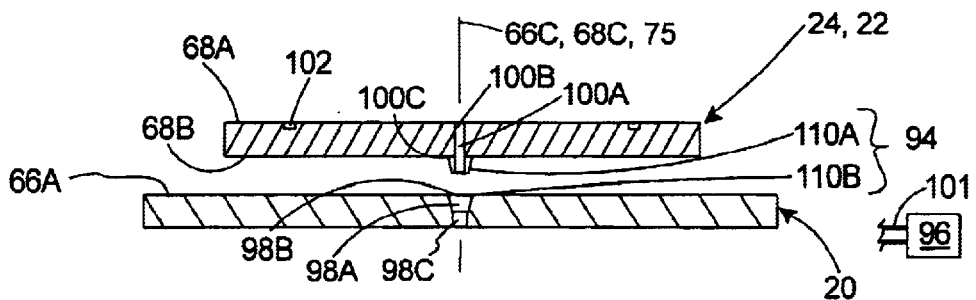
FIG. 5G is an exploded cut-away view of yet another embodiment of the fluid connector.

FIG. 5G illustrates an exploded cut-away view of another embodiment of the fluid connector 94 that connects the device holder 24 in fluid communication with the fluid source 96 and allows the device holder 24 to be easily moved relative to the device table 20. FIG. 5G illustrates only the device holder 24, the device table 20, and the fluid connector 94. The rotation assembly 64 is not illustrated in FIG. 5G. The device holder 24 and the device table 20 are somewhat similar to the corresponding components described above and illustrated in FIGS. 4A and 4B. Further, these components can be incorporated into the stage assembly of FIG. 4A. The fluid connector 94 illustrated in FIG. 5G is somewhat similar to the fluid connector 94 illustrated in FIGS. 5D and 5E.

In FIG. 5G, (i) the device table 20 includes the table aperture 98A having the table inlet 98B and the table outlet 98C that are positioned along the table central axis 66C of the device table 20, and (ii) the device holder 24 includes the holder aperture 100A having the holder inlet 100B and the holder outlet 100C that are positioned along the holder housing central axis 68C of the device holder 24. In this embodiment, the holder inlet 100B is in fluid communication with the channel 102 in the holder top 68A. The fluid source 96 creates a vacuum in the channel 102 that pulls the device (not shown in FIG. 5G) against the holder top 68A of the device holder 24. The fluid conduit 101 connects the fluid source 96 in fluid communication with the table outlet 98C.

In FIG. 5G, the fluid connector 94 connects the table inlet 98B in fluid communication with the holder outlet 100C while allowing the device holder 24 to be lifted, moved and/or rotated relative to the device table 20 with minimal resistance and vacuum loss from the channel 102. In this embodiment, the fluid connector 94 includes the needle 110A and the needle aperture 110B that are designed to maintain fluid communication with minimal leakage while allowing the device holder 24 to be lifted and/or rotated relative to the device table 20.

In this embodiment, the needle 110A and the needle aperture 110B are similar to the corresponding components described above and illustrated in FIGS. 5C and 5D. However, in FIG. 5G, the needle 110A extends downward from the holder bottom 68B around the holder outlet 100C and is integrally formed with the device holder 24. Further, the needle aperture 110B is integrally formed in the table top 66A of the device table 20. Alternately, for example, the needle 110A can be added to the device holder 24. Further, in the embodiment illustrated in FIG. 5G, the needle 110A and the needle aperture 110B are positioned substantially along the housing axis of rotation 75. This allows the device holder 24 to be rotated and/or moved relative to the device table 20 without interference from the fluid connector 94. If the stage assembly includes a bearing 76 (illustrated in FIG. 4B) to rotate the device holder 24, the bearing 76 can include a central channel for receiving the needle 110A and the bearing 76 can encircle the needle 110A. Alternatively, the needle 110A and the needle aperture 110B can act and function as the bearing 76.

Figure 5H:
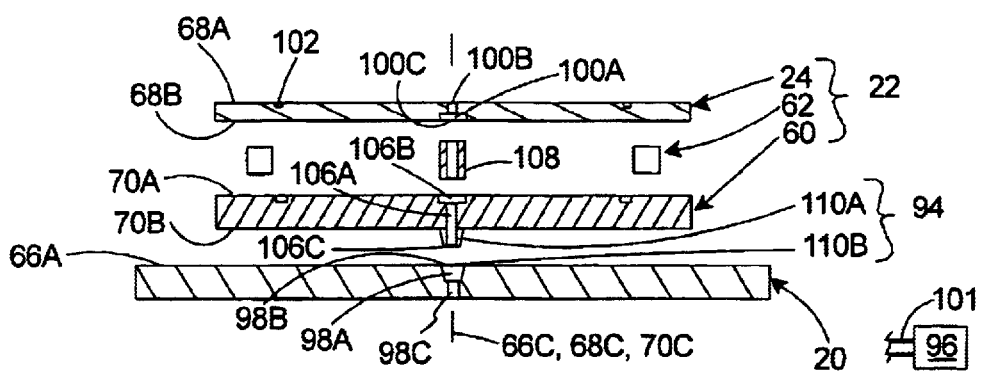
FIG. 5H is an exploded cut-away view of still another embodiment of the fluid connector, the holder assembly and the device table.

FIG. 5H illustrates an exploded cross-sectional view of another embodiment of the fluid connector 94 that connects the device holder 24 in fluid communication with the fluid source 96 and allows the device holder 24 to be easily moved relative to the device table 20. FIG. 5H illustrates only the device holder 24, the carrier 60, and the holder connector assembly 62, the device table 20, and the fluid connector 94. The rotation assembly 64 is not illustrated in FIG. 5H for clarity. The device holder 24, the carrier 60, the holder connector assembly 62, and the device table 20 are somewhat similar to the corresponding components described above and illustrated in FIGS. 2A–2C. Further, these components can be incorporated into the stage assembly 10 of FIG. 1. The fluid connector 94 illustrated in FIG. 5H is somewhat similar to the fluid connector 94 illustrated in FIG. 5F.

In FIG. 5H, (i) the device table 20 includes the table aperture 98A having a table inlet 98B and the table outlet 98C that are positioned along the table central axis 66C of the device table 20, (ii) the device holder 24 includes the holder aperture 100A having the holder inlet 100B and the holder outlet 100C that are positioned along the holder housing central axis 68C of the device holder 24, and (iii) the carrier 60 has the carrier aperture 106A that includes the carrier inlet 106B and the carrier outlet 106C that are positioned along the carrier central axis 70C of the carrier 60. The holder inlet 100B is in fluid communication with the channel 102 in the holder top 68A. The fluid source 96 creates a vacuum in the channel 102 that pulls the device (not shown in FIG. 5H) against the holder top 68A of the device holder 24. The fluid conduit 101 connects the fluid source 96 in fluid communication with the table outlet 98C.

In FIG. 5H, the fluid connector 94 connects the table inlet 98B in fluid communication with the carrier outlet 106C while allowing the device holder 24 to be lifted, moved and/or rotated relative to the device table 20 with minimal resistance and vacuum loss from the channel 102. More specifically, the fluid connector 94 connects the table inlet 98B in fluid communication with the carrier outlet 106C while allowing the device holder 24 and the carrier 60 to be lifted, moved and/or rotated relative to the device table 20 with minimal resistance and vacuum loss from the channel 102. In this embodiment, the fluid connector 94 includes the needle 110A and the needle aperture 110B that are designed to maintain fluid communication with minimal leakage while allowing the carrier 60 to be lifted and/or rotated relative to the device table 20.

In FIG. 5H, the needle 110A extends downward from the carrier bottom 70B and the needle aperture 110B is integrally formed in the table top 66A of the device table 20. The needle 110A and the needle aperture 110B are similar to the corresponding components described above and illustrated in FIG. 5F. Moreover, the fluid connector 94 includes the tubular shaped connector hose 108 that connects the carrier inlet 106B in fluid communication with the holder outlet 100C similar to the embodiment illustrated in FIG. 5F. In this embodiment, because the device holder 24 and the carrier 60 move and rotate simultaneously, the connector hose 108 will not inhibit the movement of the device holder 24 relative to the device table 20.

Further, in the embodiment illustrated in FIG. 5H, the needle 110A and the needle aperture 110B are positioned substantially along the housing axis of rotation 75. This allows the device holder 24 and the carrier 60 to be rotated and/or moved relative to the device table 20 without interference from the fluid connector 94. If the stage assembly 10 includes a bearing 76 (illustrated in FIG. 2A) to rotate the device holder 24, the bearing 76 can include a central channel for receiving the needle 110A and the bearing 76 can encircle the needle 110A. Alternatively, the needle 110A and the needle aperture 110B can act and function as the bearing 76.

Figure 6A:
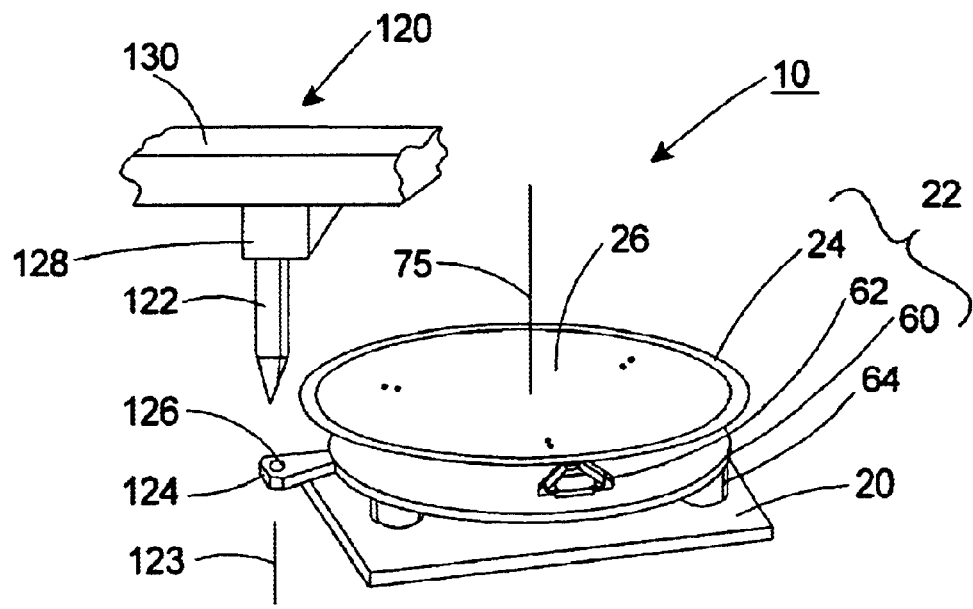
FIG. 6A is a perspective view of a first embodiment of a holder mover, the holder assembly and the device table having features of the present invention.

Referring to FIG. 6A, in some embodiments, the stage assembly 10 can include a holder mover 120 that accurately moves and/or rotates the device holder 24 relative to the device table 20. The design of the holder mover 120 can be varied to suit the design requirements of the rest of the stage assembly 10. A number of embodiments of the holder mover 120 are provided herein.

FIG. 6A illustrates (i) the holder assembly 22 including the device holder 24 that retains the device 26, the carrier 60, the holder connector assembly 62, and the rotation assembly 64, (ii) the device table 20, and (iii) the holder mover 120. The holder assembly 22 and the device table 20 are somewhat similar to the corresponding components described above and illustrated in FIGS. 2A–2C. Further, these components can be incorporated into the stage assembly 10 of FIG. 1.

In FIG. 6A, the holder mover 120 includes a stop 122 that selectively creates a stop axis of rotation 123. In this embodiment, the carrier 60 includes a stop tab 124 having a stop aperture 126 and the stop 122 is a pin that includes a distal tip that fits into the stop aperture 126 to selectively retain the carrier 60 at that location. Further, in this embodiment, the holder mover 120 includes a stop mover 128 that selectively lifts and lowers the stop 122 so that the stop 122 selectively engages the stop tab 124. The stop 122 and the stop mover 128 can be secured to a fixed structure such as an apparatus frame 130 of the exposure apparatus 28. With this design, the stage mover assembly 14 (illustrated in FIG. 1) moves the device table 20 and holder assembly 22 to where the stop 122 can engage the holder assembly 22. The stop mover 128 can include one or more rotary motors, voice coil motors, linear motors, electromagnetic actuators, or other actuators.

In this embodiment, with the stop 122 engaging the carrier 60 and creating the stop axis of rotation 123, the stage mover assembly 14 moves the device table 20 in a semicircular pattern. During this motion, the device holder 24 is rotated 180 degrees between the positions 42, 44 about the stop 122 relative to the rest of the stage assembly 10 and about the holder axis of rotation 75 relative to the device table 20. With this design, the motors used to rotate the device holder 24 can be positioned away from the device holder 24. This minimizes the heat near the device holder 24 generated during rotation of the device holder 24. Alternately, for example, the stop mover 128 could be designed to move the stop 122, the carrier 60 and the device holder 24 in a semi-circular pattern to rotate the device holder 24.

As provided above, the stop 122 engages the stop aperture 126 in the stop tab 124. It should be noted that the stop aperture 126 could include a bearing to reduce friction at the stop 122 during rotation of the device holder 24. Alternately, for example, (i) the stop 122 could engage a flat area in the carrier 60, or the device holder 24, (ii) the stop 122 could include a ball that engages a cone shaped aperture in the carrier 60 or the device holder 24, (iii) the stop 122 could extend upwardly from below the device holder 24, (iv) the stop 122 could include a magnet that retains a point on the carrier 60 or the device holder 24 and/or (v) the stop 122 could have a flexible tip. It should be noted that the amount of movement required by the device table 20 to rotate the device holder 24 between the positions 42, 44 decreases as distance between where the stop 122 engages the holder assembly 22 and the holder axis of rotation 75 decreases.

Figure 6B:
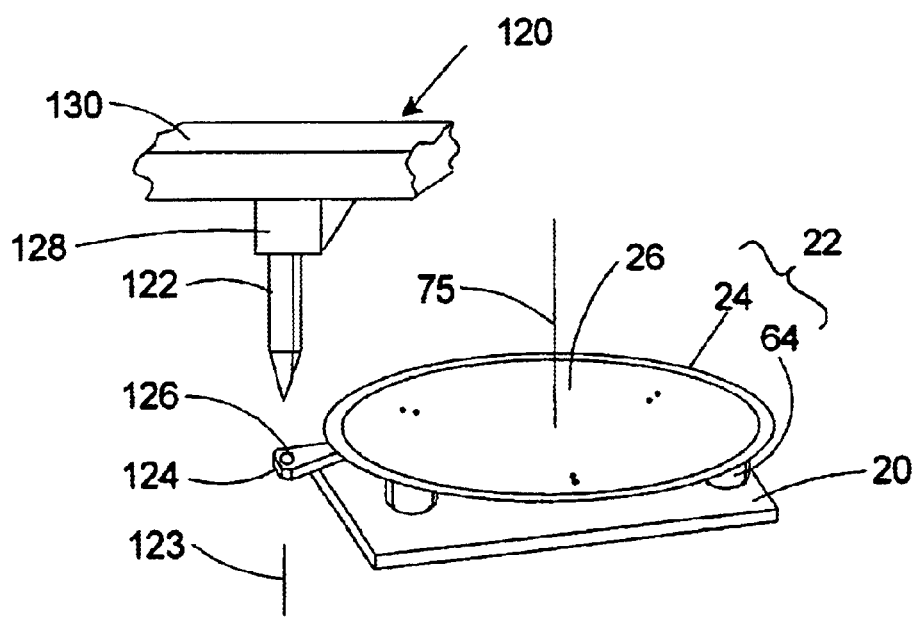
FIG. 6B is a perspective view of another embodiment of the holder mover, the holder assembly and the device table.

FIG. 6B illustrates a second embodiment of the holder mover 120. FIG. 6B illustrates (i) the holder assembly 22 including the device holder 24 that retains the device 20 and the rotation assembly 64, (ii) the device table 20, and (iii) the holder mover 120. The holder assembly 22 and the device table 20 are somewhat similar to the corresponding components described above and illustrated in FIG. 4B. Further, these components can be incorporated into the stage assembly 10 of FIG. 4A.

The holder mover 120 illustrated in FIG. 6B is similar to the embodiment illustrated in FIG. 6A. However, in FIG. 6B, the holder assembly 22 does not include the carrier 60 and the device holder 24 includes the stop tab 124 and the stop aperture 126 that is engaged by the stop 120. In this embodiment, with the stop 122 inhibiting a point of the device holder 24 from moving, the stage mover assembly 14 (illustrated in FIG. 4A) moves the device table 20 in a semicircular pattern. During this motion, the device holder 24 is rotated 180 degrees between the positions 42, 44 about the stop 122 and about the holder axis of rotation 75.

More specifically, in FIG. 6B, the holder mover 120 includes the stop 122 that selectively creates the stop axis of rotation 123. Further, in this embodiment, the holder mover 120 includes the stop mover 128 that selectively lifts and lowers the stop 122 so that the stop 122 selectively engages the stop tab 124. The stop 122 and the stop mover 128 can be secured to the apparatus frame 130. With this design, the stage mover assembly 14 moves the device table 20 and holder assembly 22 to where the stop 122 can engage the holder assembly 22. The stop mover 128 can include one or more rotary motors, voice coil motors, linear motors, electromagnetic actuators, or other actuators.

In this embodiment, with the stop 122 engaging the device holder 24 and creating the stop axis of rotation 123, the stage mover assembly 14 moves the device table 20 in a semicircular pattern. During this motion, the device holder 24 is rotated 180 degrees between the positions 42, 44 about the stop 122 relative to the rest of the stage assembly 10 and about the holder axis of rotation 75 relative to the device table 20. With this design, the motors used to rotate the device holder 24 can be positioned away from the device holder 24. Alternately, for example, the stop mover 128 could be designed to move the stop 122, the carrier 60 and the device holder 24 in a semi-circular pattern to rotate the device holder 24.

As provided above, the stop 122 engages the stop aperture 126 in the stop tab 124. It should be noted that the stop aperture 126 could include a bearing to reduce friction at the stop 122 during rotation of the device holder 24. Alternately, for example, (i) the stop 122 could engage a flat area in the carrier 60, or the device holder 24, (ii) the stop 122 could include a ball that engages a cone shaped aperture in the carrier 60 or the device holder 24, (iii) the stop 122 could extend upwardly from below the device holder 24, (iv) the stop 122 could include a magnet that retains a point on the carrier 60 or the device holder 24 and/or (v) the stop 122 could have a flexible tip. The amount of movement required by the device table 20 to rotate the device holder 24 between the positions 42, 44 decreases as distance between where the stop 122 engages the holder assembly 22 and the holder axis of rotation 75 decreases.

Figure 6C:
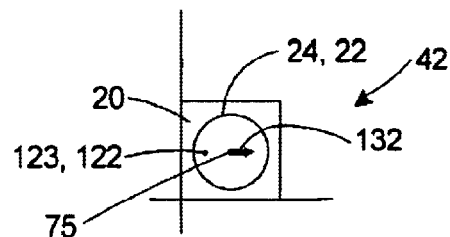
FIGS. 6C–6F illustrate the movement of the device holder between positions.
Figure 6D:
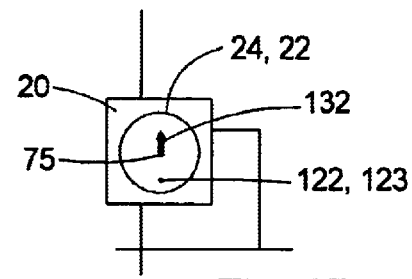
Figure 6E:
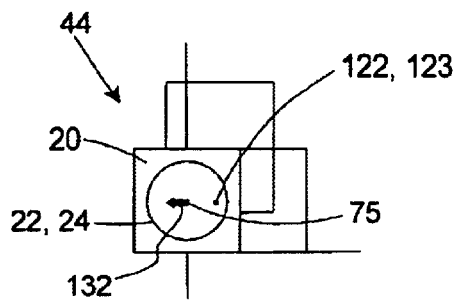
Figure 6F:
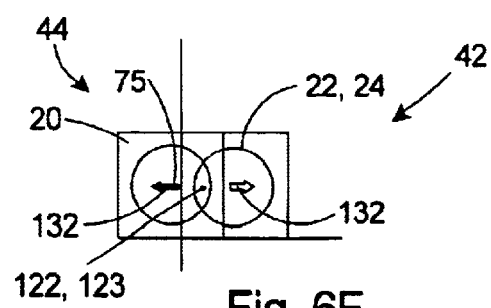

The movement of the holder assembly 22 and the device holder 24 between the positions 42, 44 about the stop 122 relative to the holder axis of rotation 75 and to the device table 20 is illustrated in FIGS. 6C–6F. FIGS. 6C–6F include an arrow 132 that illustrates the orientation of the device holder 24. More specifically, FIG. 6C illustrates a top view with the device holder 24 in the first position 42, FIG. 6D illustrates a top view with the device holder 24 rotated ninety degrees, FIG. 6E illustrates a top view with the device holder 24 in the second position 44 and FIG. 6F illustrates a top view with the device holder 24 in the second position 44 and the first position 42 (lighter lines). Taken together, FIGS. 6C–6F illustrate that the stop 122 holds one point of the holder assembly 22, e.g. the device holder 24, at a fixed position. Subsequently, the stage mover assembly 14 (not shown in FIGS. 6C–6F) moves the device table 20 in a semicircular pattern to rotate the device 26.

FIGS. 6G–6J illustrate another embodiment having features of the present invention. FIGS. 6G–6J illustrate only the device holder 24 of the holder assembly 22 and the device table 20. The holder assembly 22 and the device table 20 can be similar to the corresponding components described above and illustrated in FIG. 2A or FIG. 4B. Further, these components can be incorporated into the stage assembly 10 of FIG. 1 or FIG. 4A.

Figure 6G:
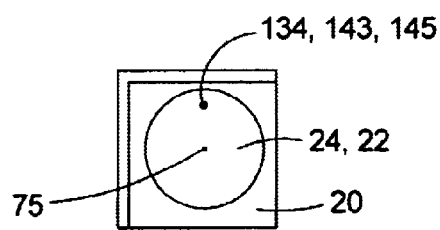
FIGS. 6G–6J illustrate the movement of the device holder between positions using another method.
Figure 6H:
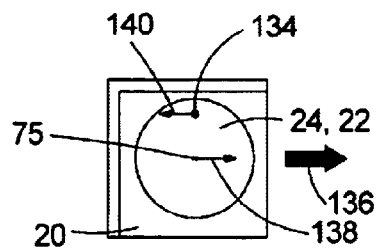
Figure 6I:
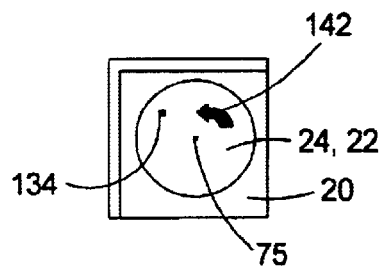
Figure 6J:
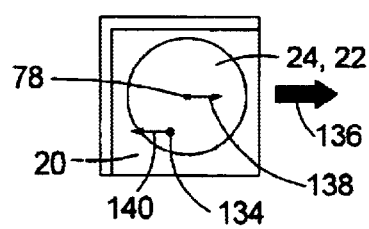

In this embodiment, referring to FIG. 6G, the holder assembly 22 has an assembly center of gravity 134 that is offset and positioned away from the holder axis of rotation 75. With this configuration, the stage mover assembly 14 (not shown in FIGS. 6G–6J) can be used to rotate the device holder 24. More specifically, FIG. 6H illustrates the device holder 24 at the start of rotation. At this time, the device holder 24 is free to rotate relative to the device table 20 about the holder axis of rotation 75. In FIG. 6H, arrow 136 illustrates that the stage mover assembly 14 (not shown in FIG. 6H) accelerates the device table 20 from left to right, arrow 138 illustrates the accelerating force that is applied to the device holder 24 at the holder axis of rotation 75, and arrow 140 illustrates the inertia force on the assembly center of gravity 134. Importantly, the inertia force on the assembly center of gravity 134 is offset from the holder axis of rotation 75 and the device holder 24 begins to rotate. Arrow 142 in FIG. 6I illustrates that device holder 24 continues to rotate about the holder axis of rotation 75 relative to the device table 20. During this time, the stage mover assembly 14 can slowly reposition the device table 20. Referring to FIG. 6J, arrow 136 is used to illustrate that the stage mover assembly 14 (not shown in FIG. 6J) accelerates the device table 20 from left to right to stop the rotation of the device holder 24, arrow 138 illustrates the accelerating force that is applied to the device holder 24 at the holder axis of rotation 75, and arrow 140 illustrates the inertia force on the assembly center of gravity 134. The inertia force on the assembly center of gravity 134 is offset from the holder axis of rotation 75 and rotation of the device holder 24 is halted. Subsequently, the device holder 24 can be locked to the device table 20 with the rotation assembly 64 (not shown in FIGS. 6G–6J).

In this embodiment, it should be noted that if the holder assembly 22 includes a carrier 60 similar to the structure shown in FIGS. 1–2C, the assembly center of gravity 134 is determined by the location of a carrier center of gravity 143 of the carrier 60, a device holder center of gravity 145 of the device holder 24 and the holder connector assembly center of gravity 145 of the holder connector assembly (shown in FIGS. 1–2C). Alternately, if the holder assembly 22 does not include the carrier 60, the assembly center of gravity 134 is determined by the device holder center of gravity 145. It should be noted that the carrier center of gravity 143, the holder center of gravity 145 and the assembly center of gravity 134 are illustrated in FIG. 6G as being in the same location. However, each of the centers of gravity could be at different locations.

The amount of offset of the assembly center of gravity 134 relative to the holder axis of rotation 75 can vary. Preferably, the offset is between approximately 10 and 100 mm and more preferably between 50 and 100 mm. This embodiment is unique because no additional parts are needed to rotate the device holder 24.

Figure 6K:
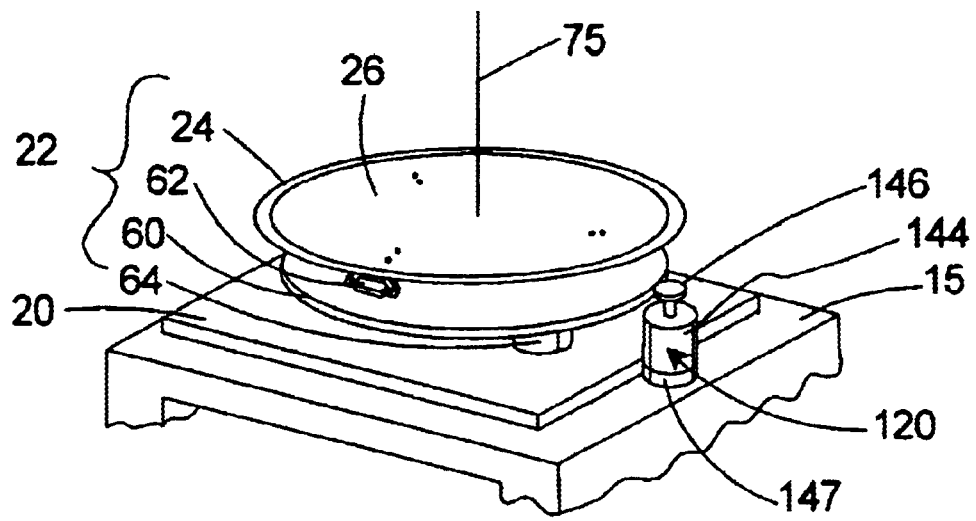
FIG. 6K is a perspective view of another embodiment of the holder mover, the holder assembly, and the device table.
Figure 6K:
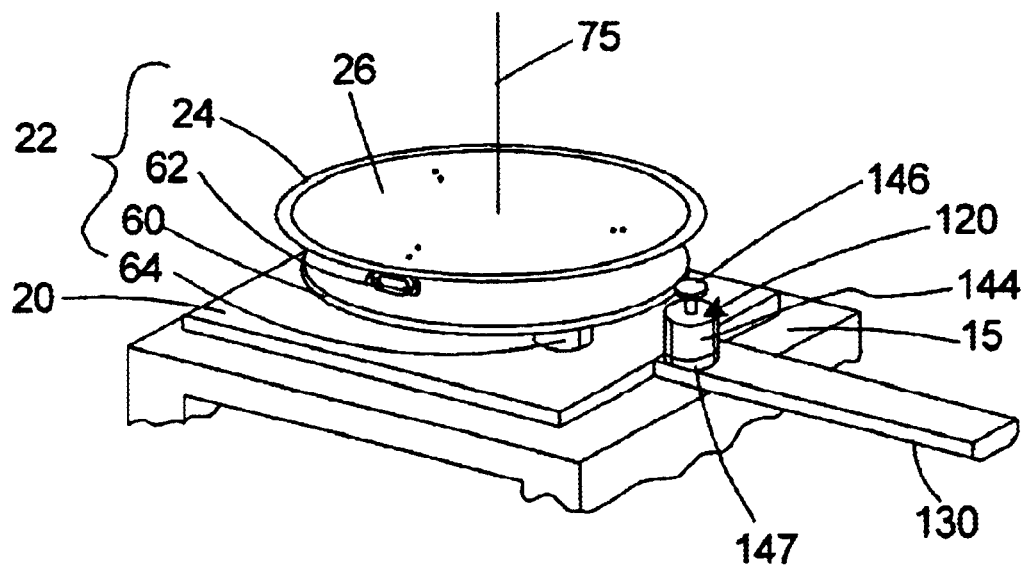

FIG. 6K illustrates another embodiment of the holder mover 120 that accurately moves and/or rotates the device holder 24 relative to the device table 20 about the axis of rotation 75. FIG. 6K illustrates only (i) the holder assembly 22 including the device holder 24 that retains the device 26, the carrier 60, the holder connector assembly 62, and the rotation assembly 64, (ii) the device table 20, (iii) a portion of the stage 15 and (iv) the holder mover 120. The holder assembly 22, the device table 20 and the stage 15 are somewhat similar to the corresponding components described above and illustrated in FIGS. 2A–2C. Further, these components can be incorporated into the stage assembly 10 of FIG. 1.

In FIG. 6K, the holder mover 120 is a motor 144 secured to the stage 15. The type of motor 144 utilized can be a rotary motor, an electromagnetic actuator, or other type of actuator. In FIG. 6K, the motor 144 is a rotary type motor that rotates an output wheel 146 that engages a portion, e.g. an outer perimeter the carrier 60. The motor 144 is secured to the stage 15 near the edge of the device table 20. Also, in this embodiment, the holder mover 120 includes a motor damper 147 that secures the motor 144 to the stage 15. The motor damper 147 inhibits and dampens the reaction forces generated by the motor 144 from being transferred to the stage 15. The motor damper 147 can include a reaction mass assembly, a fluid cylinder, resilient material such as a viscoelastic material, or other type of vibration damping device. Alternately, for example, the motor could be secured directly to the device table 20.

FIG. 6KK illustrates another embodiment of a holder mover 120 that accurately moves and/or rotates the device holder 24 relative to the device table 20 about the axis of rotation 75. FIG. 6KK illustrates only (i) the holder assembly 22 including the device holder 24 that retains the device 26, the carrier 60, the holder connector assembly 62, and the rotation assembly 64, (ii) the device table 20, (iii) the stage 15 and (iv) the holder mover 120. The holder assembly 22, the device table 20 and the stage 15 are somewhat similar to the corresponding components described above and illustrated in FIGS. 2A–2C. Further, these components can be incorporated into the stage assembly 10 of FIG. 1.

In FIG. 6KK, the holder mover 120 is somewhat similar to the equivalent component described above and illustrated in FIG. 6K. More specifically, the holder mover 120 includes the motor 144 having the output wheel 146 that engages the carrier 60. However, in this embodiment, the motor 144 is secured to the apparatus frame 130 or some other structure. In this embodiment, the stage mover assembly 14 (illustrated in FIG. 1) moves the device table 20 to the location of the motor 144 so that the motor 144 can engage the holder assembly 22. Also, in this embodiment, the holder mover 120 includes the motor damper 147 that secures the motor 144 to the apparatus frame 130. The motor damper 147 inhibits and dampens the reaction forces generated by the motor 144 from being transferred to the apparatus frame 130. The motor damper 147 can include a reaction mass assembly, a fluid cylinder, resilient material such as a viscoelastic material, or other type of vibration damping device.

Figure 6L:
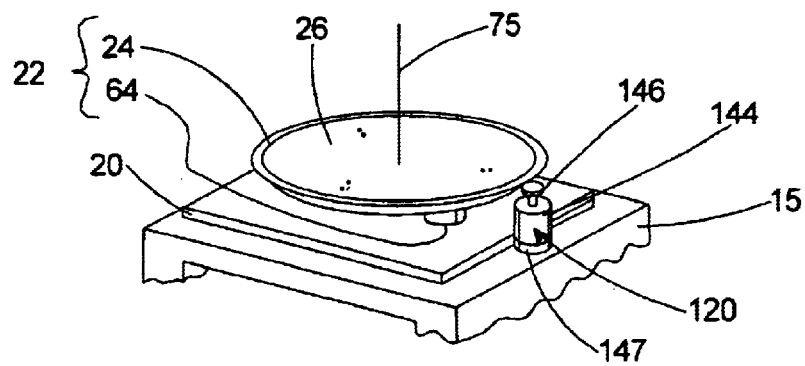
FIG. 6L is a perspective view of another embodiment of the holder mover, the holder assembly, and the device table.
Figure 6L:
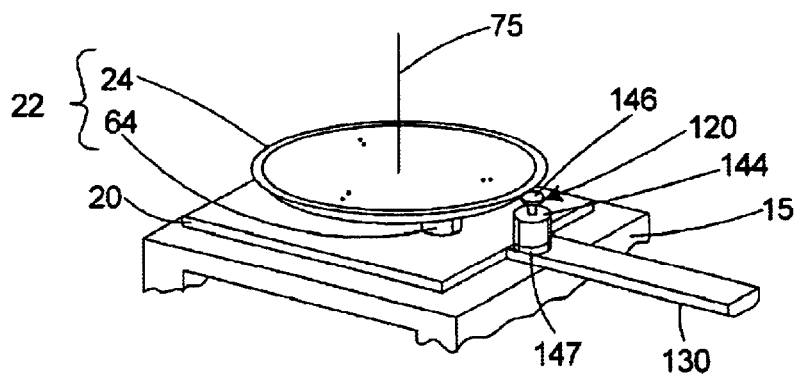

FIG. 6L illustrates another embodiment of a holder mover 120 that accurately moves and/or rotates the device holder 24 relative to the device table 20 about the axis of rotation 75. FIG. 6L illustrates only (i) the holder assembly 22 including the device holder 24 that retains the device 26 and the rotation assembly 64, (ii) the device table 20, (iii) the stage 15 and (iv) the holder mover 120. The holder assembly 22, the device table 20 and the stage 15 are similar to the corresponding components described above and illustrated in FIGS. 4A and 4B. Further, these components can be incorporated into the stage assembly 10 of FIG. 4A.

The holder mover 120 illustrated in FIG. 6L is similar to the embodiment illustrated in FIG. 6K and discussed above. However, in this embodiment, the holder assembly 22 does not include the carrier 60 and the output wheel 146 of the motor 144 directly engages the device holder 24, e.g. an outer perimeter of the device holder 24. More specifically, in FIG. 6L the holder mover 120 is a motor 144 secured to the stage 15. In FIG. 6L the motor 144 is secured to the stage 15 near the edge of the device table 20. Also, in this embodiment, the holder mover 120 includes the motor damper 147 that secures the motor 144 to the stage 15. The motor damper 147 inhibits and dampens the reaction forces generated by the motor 144 from being transferred to the stage 15. The motor damper 147 can include a reaction mass assembly, a fluid cylinder, resilient material such as a viscoelastic material, or other type of vibration damping device. Alternately, for example, the motor could be secured to the device table.

FIG. 6LL illustrates another embodiment of a holder mover 120 that accurately moves and/or rotates the device holder 24 relative to the device table 20 about the axis of rotation 75. FIG. 6LL illustrates only (i) the holder assembly 22 including the device holder 24 that retains the device 26 and the rotation assembly 64, (ii) the device table 20, (iii) the stage 15 and (iv) the holder mover 120. The holder assembly 22, the device table 20 and the stage 15 are similar to the corresponding components described above and illustrated in FIGS. 4A and 4B. Further, these components can be incorporated into the stage assembly 10 of FIG. 4A.

The holder mover 120 illustrated in FIG. 6LL is similar to the embodiment illustrated in FIG. 6KK and discussed above. However, in this embodiment, the holder assembly 22 does not include the carrier 60 and the output wheel 146 of the motor 144 directly engages the device holder 24, e.g. the outer perimeter of the device holder 24. More specifically, in FIG. 6LL, the motor 144 is secured to the apparatus frame 130 or some other structure. In this embodiment, the stage mover assembly 14 (illustrated in FIG. 4A) moves the device table 20 to the location of the motor 144 so that the motor 144 can engage the holder assembly 22. Also, in this embodiment, the holder mover 120 includes the motor damper 147 that secures the motor 144 to the apparatus frame 130. The motor damper 147 inhibits and dampens the reaction forces generated by the motor 144 from being transferred to the apparatus frame 130. The motor damper 147 can include a reaction mass assembly, a fluid cylinder, resilient material such as a viscoelastic material, or other type of vibration damping device.

Figure 6M:
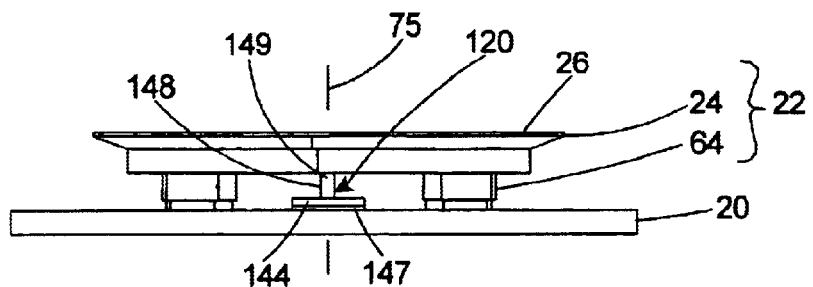
FIG. 6M is a side view of another embodiment of the holder mover, the holder assembly, and the device table.
Figure 6M:
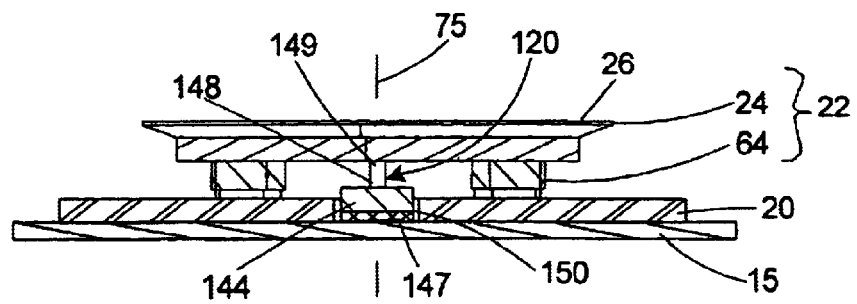

FIG. 6M illustrates another embodiment of a holder mover 120 that accurately moves and/or rotates the device holder 24 relative to the device table 20 about the axis of rotation 75. FIG. 6M illustrates only (i) the holder assembly 22 including the device holder 24 that retains the device 26 and the rotation assembly 64, (ii) the device table 20, and (iii) the holder mover 120. The holder assembly 22 and the device table 20 are similar to the corresponding components described above and illustrated in FIGS. 4A and 4B. Further, these components can be incorporated into the stage assembly 10 of FIG. 4A.

In FIG. 6M, the holder mover 120 includes the motor 144. The type of motor 144 utilized can be a rotary motor, an electromagnetic actuator, or other type of actuator. In FIG. 6M, the motor 144 is a rotary type motor that is secured to the device table 20. In this embodiment, the motor 144 includes an output shaft 148 and a flexible connector 149 that flexibly connects the output shaft 148 to the device holder 24 along the holder axis of rotation 75. The flexible connector 149, for example, can be made of a resilient material.

Also, in this embodiment, the holder mover 120 can include a motor damper 147 that secures the motor 144 to the device table 20. The motor damper 147 inhibits and dampens the reaction forces generated by the motor 144 from being transferred to the device table 20. The motor damper 147 can include a reaction mass assembly, a fluid cylinder, resilient material such as a viscoelastic material, or other type of vibration damping device.

FIG. 6MM illustrates another embodiment of a holder mover 120 that accurately moves and/or rotates the device holder 24 relative to the device table 20 about the axis of rotation 75. FIG. 6MM illustrates only (i) the holder assembly 22 including the device holder 24 that retains the device 26 and the rotation assembly 64, (ii) the device table 20, (iii) the stage 15 and (iv) the holder mover 120. The holder assembly 22, the device table 20 and the stage 15 are similar to the corresponding components described above and illustrated in FIGS. 4A and 4B. Further, these components can be incorporated into the stage assembly 10 of FIG. 4A.

In FIG. 6MM, the holder mover 120 includes the motor 144 similar to the holder mover 120 illustrated in FIG. 6M. The type of motor 144 utilized can be a rotary motor, an electromagnetic actuator, or other type of actuator. In FIG. 6MM, the motor 144 is a rotary type motor that is secured to the stage 15 and extends through an aperture 150 in the device table 20. In this embodiment, the motor 144 includes the output shaft 148 and the flexible connector 149 that flexibly connects the output shaft 148 to the device holder 24 along the holder axis of rotation 75. Further, because the motor 144 is secured to the stage 15, this reduces the amount of heat and reaction forces that are transferred to the device table 20.

Also, in this embodiment, the holder mover 120 can include the motor damper 147 that secures the motor 144 to the stage 15. The motor damper 147 inhibits and dampens the reaction forces generated by the motor 144 from being transferred to the stage 15. The motor damper 147 can include a reaction mass assembly, a fluid cylinder, resilient material such as a viscoelastic material, or other type of vibration damping device.

Figure 6N:
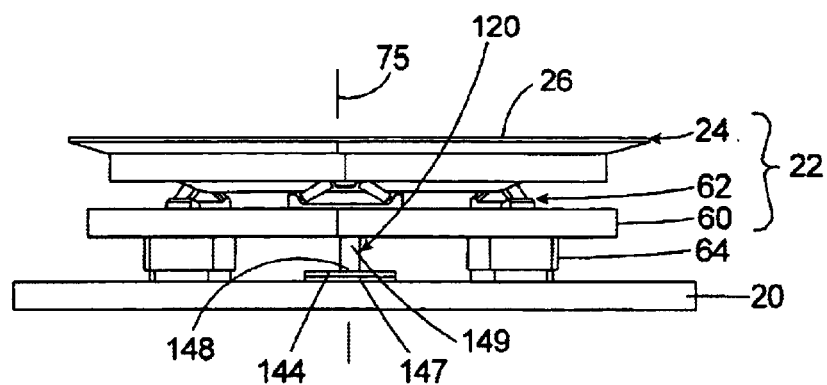
FIG. 6N is a side view of another embodiment of the holder mover, the holder assembly, and the device table.
Figure 6N:
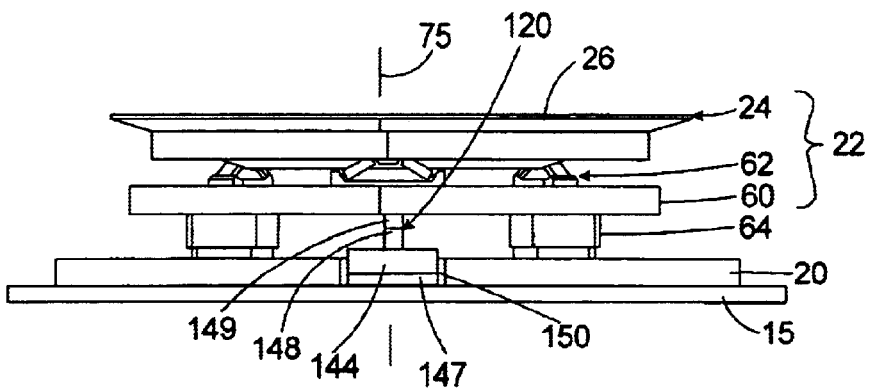

FIG. 6N illustrates another embodiment of a holder mover 120 that accurately moves and/or rotates the device holder 24 relative to the device table 20 about the axis of rotation 75. FIG. 6N illustrates only (i) the holder assembly 22 including the device holder 24 that retains the device 26, the carrier 60, the holder connector assembly 62, and the rotation assembly 64, (ii) the device table 20, and (iii) the holder mover 120. The holder assembly 22, and the device table 20 are similar to the corresponding components described above and illustrated in FIGS. 2A–2C. Further, these components can be incorporated into the stage assembly 10 of FIG. 1. The holder mover 120 illustrated in FIG. 6N is similar to the holder mover 120 illustrated in FIG. 6M and described above.

In FIG. 6N, the holder mover 120 includes the motor 144. The type of motor 144 utilized can be a rotary motor, an electromagnetic actuator, or other type of actuator. In FIG. 6N, the motor 144 is a rotary type motor that is secured to the device table 20. In this embodiment, the motor 144 includes the output shaft 148 and the flexible connector 149 that flexibly connects the output shaft 148 to the carrier 60 along the holder axis of rotation 75.

Also, in this embodiment, the holder mover 120 can include a motor damper 147 that secures the motor 144 to the device table 20. The motor damper 147 inhibits and dampens the reaction forces generated by the motor 144 from being transferred to the device table 20. The motor damper 147 can include a reaction mass assembly, a fluid cylinder, resilient material such as a viscoelastic material, or other type of vibration damping device.

FIG. 6NN illustrates another embodiment of a holder mover 120 that accurately moves and/or rotates the device holder 24 relative to the device table 20 about the axis of rotation 75. FIG. 6NN illustrates only (i) the holder assembly 22 including the device holder 24 that retains the device 26, the carrier 60, the holder connector assembly 62, and the rotation assembly 64, (ii) the device table 20, (iii) the stage 15, and (iv) the holder mover 120. The holder assembly 22, the device table 20, and the stage 15 are similar to the corresponding components described above and illustrated in FIGS. 2A–2C. Further, these components can be incorporated into the stage assembly 10 of FIG. 1. The holder mover 120 illustrated in FIG. 6NN is similar to the holder mover 120 illustrated in FIG. 6N and described above.

In FIG. 6NN, the holder mover 120 includes the motor 144. The type of motor 144 utilized can be a rotary motor, an electromagnetic actuator, or other type of actuator. In FIG. 6NN, the motor 144 is a rotary type motor that is secured to the stage 15 and extends through an aperture 150 in the device table 20. In this embodiment, the motor 144 includes the output shaft 148 and the flexible connector 149 that flexibly connects the output shaft 148 to the carrier 60 along the holder axis of rotation 75. Further, because the motor 144 is secured to the stage 15, this reduces the amount of heat and reaction forces that are transferred to the device table 20.

Figure 6O:
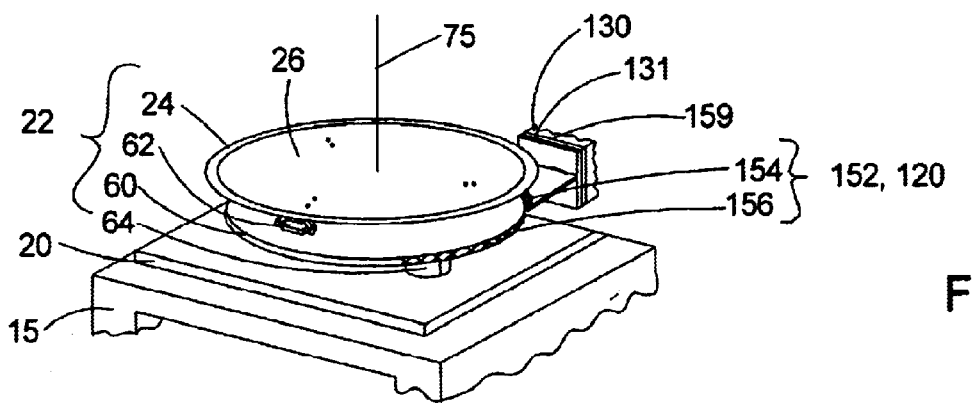
FIG. 6O is a perspective view of another embodiment of the holder mover, the holder assembly, and the device table.

Also, in this embodiment, the holder mover 120 can include the motor damper 147 that secures the motor 144 to the stage 15. The motor damper 147 inhibits and dampens the reaction forces generated by the motor 144 from being transferred to the stage 15. The motor damper 147 can include a reaction mass assembly, a fluid cylinder, resilient material such as a viscoelastic material, or other type of vibration damping device. FIG. 6O illustrates another embodiment of a holder mover 120 that accurately moves and/or rotates the device holder 24 relative to the device table 20 about the axis of rotation 75. FIG. 6O illustrates only (i) the holder assembly 22 including the device holder 24 that retains the device 26, the carrier 60, the holder connector assembly 62, and the rotation assembly 64, (ii) the device table 20, (iii) the stage 15 and (iv) the holder mover 120. The holder assembly 22, the device table 20 and the stage 15 are similar to the corresponding components described above and illustrated in FIGS. 2A–2C. Further, these components can be incorporated into the stage assembly 10 of FIG. 1.

In FIG. 6O, the holder mover 120 is motor 152 that includes a first component 154 (illustrated in phantom) and an adjacent second component 156 (illustrated in phantom), which interacts with the first component 154. One of the components 154, 156 includes a magnet array and the other component 154, 156 includes a conductor array. The design of each magnet array and the number of magnets in each magnet array can be varied to suit the design requirements of the motor 152. Each magnet can be made of a permanent magnetic material such as NdFeB. The design of each conductor array and the number of conductors in each conductor array is varied to suit the design requirements of the motor 152. Each conductor can be made of metal such as copper or any substance or material responsive to electrical current and capable of creating a magnetic field.

Electrical current (not shown) is individually supplied to each conductor in the conductor array by the control system 18. For the motor 152, the electrical current in each conductor interacts with a magnetic field (not shown) generated by the magnet array. This causes a force (Lorentz type force) between the conductors and the magnets that can be used to rotate the device holder 24 relative to the device table 20 between the positions 42, 44.

In FIG. 6O, (i) the first component 154 is secured to a rigid structure 131 and (ii) the second component 156 is secured to the carrier 60, e.g. near an outer perimeter of the carrier 60. In FIG. 6O, the rigid structure 131 and the first component 154 can secured with a beam damper 159 to the apparatus frame 130. The beam damper 159 inhibits and dampens the reaction forces generated by the motor 152 from being transferred to the apparatus frame 130. The beam damper 159 can, for example, include a reaction mass assembly, a fluid cylinder, a resilient material, or other type of vibration damping device.

The stage mover assembly 14 (illustrated in FIG. 1) is used to move the device holder 24 to the location where the first component 154 can interact with the second component 156. Alternately, for example, a separate mover (not shown) could be used to move the first component 154 adjacent to the second component 156.

Figure 6P:
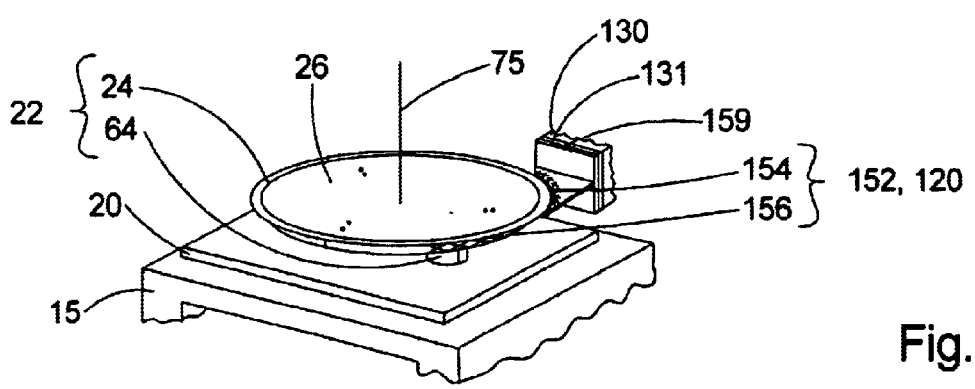
FIG. 6P is a perspective view of another embodiment of the holder mover, the holder assembly, and the device table.

FIG. 6P illustrates another embodiment of a holder mover 120 that accurately moves and/or rotates the device holder 24 relative to the device table 20 about the axis of rotation 75. FIG. 6P illustrates only (i) the holder assembly 22 including the device holder 24 that retains the device 26, and the rotation assembly 64, (ii) the device table 20, (iii) the stage 15 and (iv) the holder mover 120. The holder assembly 22, the device table 20 and the stage 15 are similar to the corresponding components described above and illustrated in FIGS. 4A and 4B. Further, these components can be incorporated into the stage assembly 10 of FIG. 4B.

In FIG. 6P, the holder mover 120 is similar to the embodiment illustrated in FIG. 6O. In FIG. 6P the holder mover 120 is a motor 152 that includes the first component 154 (illustrated in phantom) and the adjacent second component 156 (illustrated in phantom), which interacts with the first component 154. One of the components 154, 156 includes a magnet array and the other component 154, 156 includes a conductor array.

In FIG. 6P, (i) the first component 154 is secured to the rigid structure 131 and (ii) the second component 156 is secured to the device holder 24 near an outer perimeter of the device holder 24. In FIG. 6P, the rigid structure 131 and the first component 154 are secured with the beam damper 159 to the apparatus frame 130. The beam damper 159 inhibits and dampens the reaction forces generated by the motor 152 from being transferred to the apparatus frame 130. The beam damper 159 can, for example, include a reaction mass assembly, a fluid cylinder, a resilient material, or other type of vibration damping device.

Figure 6Q:
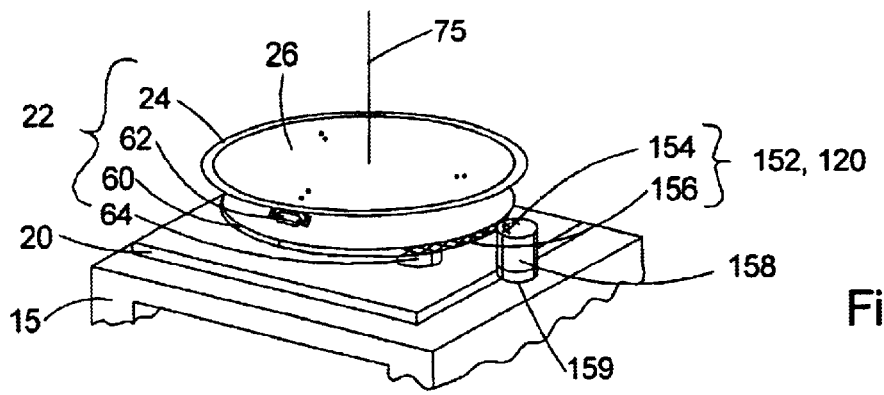
FIG. 6Q is a perspective view of another embodiment of the holder mover, the holder assembly, and the device table.

FIG. 6Q illustrates another embodiment of a holder mover 120 that accurately moves and/or rotates the device holder 24 relative to the device table 20 about the axis of rotation 75. FIG. 6Q illustrates only (i) the holder assembly 22 including the device holder 24 that retains the device 26, the carrier 60, the holder connector assembly 62, and the rotation assembly 64, (ii) the device table 20, (iii) the stage 15 and (iv) the holder mover 120. The holder assembly 22, the device table 20 and the stage 15 are similar to the corresponding components described above and illustrated in FIGS. 2A–2C. Further, these components can be incorporated into the stage assembly 10 of FIG. 1.

In FIG. 6Q, the holder mover 120 is motor 152 that includes the first component 154 (illustrated in phantom) and the adjacent second component 156 (illustrated in phantom), which interacts with the first component 154. One of the components 154, 156 includes a magnet array and the other component 154, 156 includes a conductor array. The design of each magnet array and the number of magnets in each magnet array can be varied to suit the design requirements of the motor 152. Each magnet can be made of a permanent magnetic material such as NdFeB. The design of each conductor array and the number of conductors in each conductor array is varied to suit the design requirements of the motor 152. Each conductor can be made of metal such as copper or any substance or material responsive to electrical current and capable of creating a magnetic field.

Electrical current (not shown) is individually supplied to each conductor in the conductor array by the control system 18. For the motor 152, the electrical current in each conductor interacts with a magnetic field (not shown) generated by the magnet array. This causes a force (Lorentz type force) between the conductors and the magnets that can be used to rotate the device holder 24 relative to the device table 20 between the positions 42, 44.

In FIG. 6Q, (i) the first component 154 is secured with a beam 158 and a beam damper 159 to the stage 15 and (ii) the second component 156 is secured to the carrier 60 near an outer perimeter of the carrier 60. The beam damper 159 inhibits and dampens the reaction forces generated by the motor 144 from being transferred to the stage 15. The beam damper 159 can, for example, include a reaction mass assembly, a fluid cylinder, a resilient material, or other type of vibration damping device. Alternately, the first component 154 could be secured to the device table 20.

Figure 6R:
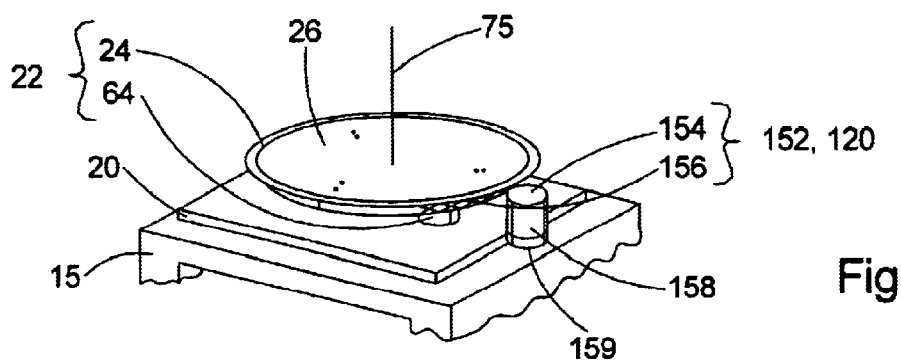
FIG. 6R is a perspective view of another embodiment of the holder mover, the holder assembly, and the device table.

FIG. 6R illustrates another embodiment of a holder mover 120 that accurately moves and/or rotates the device holder 24 relative to the device table 20 about the axis of rotation 75. FIG. 6R illustrates only (i) the holder assembly 22 including the device holder 24 that retains the device 26, and the rotation assembly 64, (ii) the device table 20, (iii) the stage 15 and (iv) the holder mover 120. The holder assembly 22, the device table 20 and the stage 15 are similar to the corresponding components described above and illustrated in FIGS. 4A and 4B. Further, these components can be incorporated into the stage assembly 10 of FIG. 4B.

In FIG. 6R, the holder mover 120 is somewhat similar to the holder mover 120 illustrated in FIG. 6Q. More specifically, the holder mover 120 is the motor 152 that includes the first component 154 (illustrated in phantom) and the adjacent second component 156 (illustrated in phantom), which interacts with the first component 154. One of the components 154, 156 includes a magnet array and the other component 154, 156 includes a conductor array.

In FIG. 6R, (i) the first component 154 is secured with the beam 158 and the beam damper 159 to the stage 15 and (ii) the second component 156 is secured to the stage is near an outer perimeter of the stage. Alternately, for example, the first component 154 can be secured to the device table 20.

Figure 6S:
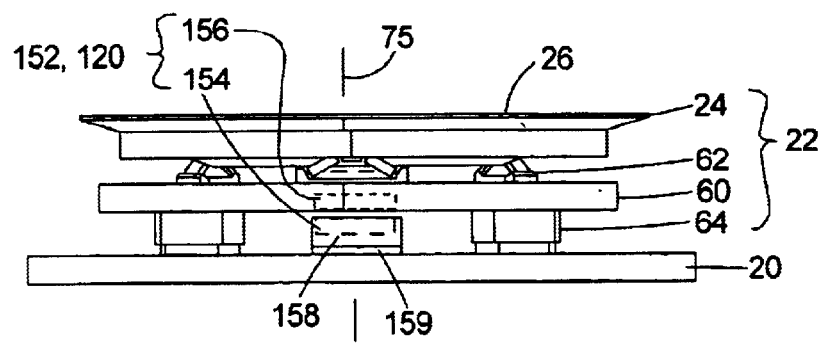
FIG. 6S is a side view of another embodiment of the holder mover, the holder assembly, and the device table.
Figure 6S:
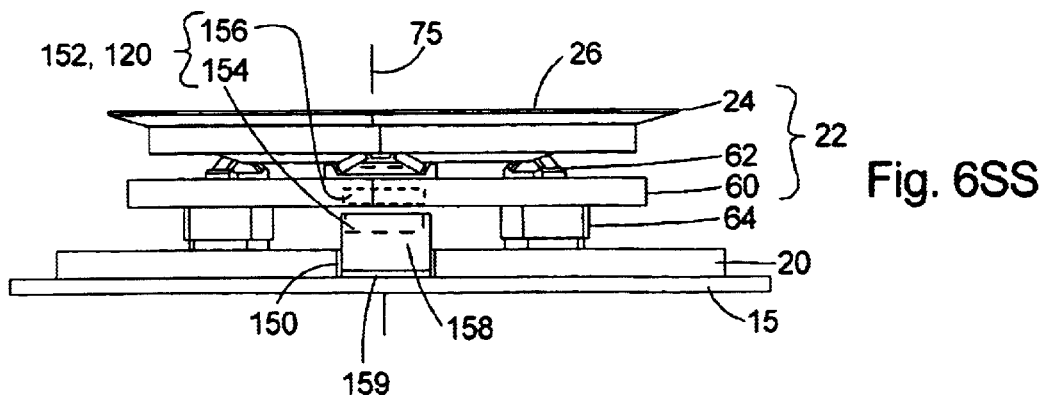

FIG. 6S illustrates another embodiment of a holder mover 120 that accurately moves and/or rotates the device holder 24 relative to the device table 20 about the axis of rotation 75. FIG. 6S illustrates only (i) the holder assembly 22 including the device holder 24 that retains the device 26, the carrier 60, the holder connector assembly 62, and the rotation assembly 64, (ii) the device table 20, and (iii) the holder mover 120. The holder assembly 22 and the device table 20 are similar to the corresponding components described above and illustrated in FIGS. 2A–2C. Further, these components can be incorporated into the stage assembly 10 of FIG. 1.

In FIG. 6S, the holder mover 120 is a motor 152 that includes the first component 154 (illustrated in phantom) and the adjacent second component 156 (illustrated in phantom), which interacts with the first component 154. One of the components 154, 156 includes a magnet array and the other component 154, 156 includes a conductor array. The design of each magnet array and the number of magnets in each magnet array can be varied to suit the design requirements of the motor 152. Each magnet can be made of a permanent magnetic material such as NdFeB. The design of each conductor array and the number of conductors in each conductor array is varied to suit the design requirements of the motor 152. Each conductor can be made of metal such as copper or any substance or material responsive to electrical current and capable of creating a magnetic field.

Electrical current (not shown) is individually supplied to each conductor in the conductor array by the control system 18. For the motor 152, the electrical current in each conductor interacts with a magnetic field (not shown) generated by the magnet array. This causes a force (Lorentz type force) between the conductors and the magnets that can be used to rotate the device holder 24 relative to the device table 20 between the positions 42, 44.

In FIG. 6S, (i) the first component 154 is secured with the beam 158 and the beam damper 159 to the device table 20 along the holder axis of rotation 75 and (ii) the second component 156 is secured to the carrier 60 near the holder axis of rotation 75. The beam damper 159 inhibits and dampens the reaction forces generated by the motor 144 from being transferred to the device table 20. The beam damper 159 can, for example, include a reaction mass assembly, a fluid cylinder, a resilient material, or other type of vibration damping device.

FIG. 6SS illustrates another embodiment of a holder mover 120 that accurately moves and/or rotates the device holder 24 relative to the device table 20 about the axis of rotation 75. FIG. 6SS illustrates only (i) the holder assembly 22 including the device holder 24 that retains the device 26, the carrier 60, the holder connector assembly 62, and the rotation assembly 64, (ii) the device table 20, (iii) the stage 15 and (iv) the holder mover 120. The holder assembly 22, the device table 20 and the stage 15 are similar to the corresponding components described above and illustrated in FIGS. 2A–2C. Further, these components can be incorporated into the stage assembly 10 of FIG. 1.

In FIG. 6SS, the holder mover 120 is similar to the holder mover 120 illustrated in FIG. 6S. In FIG. 6SS the holder mover 120 is the motor 152 that includes the first component 154 (illustrated in phantom) and the adjacent second component 156 (illustrated in phantom), which interacts with the first component 154. One of the components 154, 156 includes a magnet array and the other component 154, 156 includes a conductor array.

In FIG. 6SS, (i) the first component 154 is secured to the stage 15 with the beam 158 and the beam damper 159 through the aperture 150 in the device table 20, along the holder axis of rotation 75 and (ii) the second component 156 is secured to the carrier 60 along the holder axis of rotation 75.

Figure 6T:
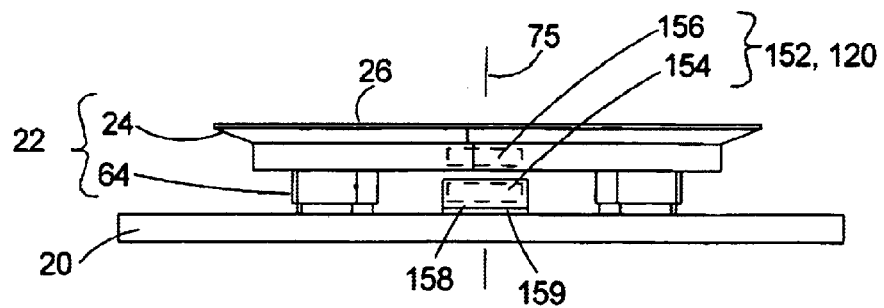
FIG. 6T is a side view of another embodiment of the holder mover, the holder assembly, and the device table.
Figure 6T:
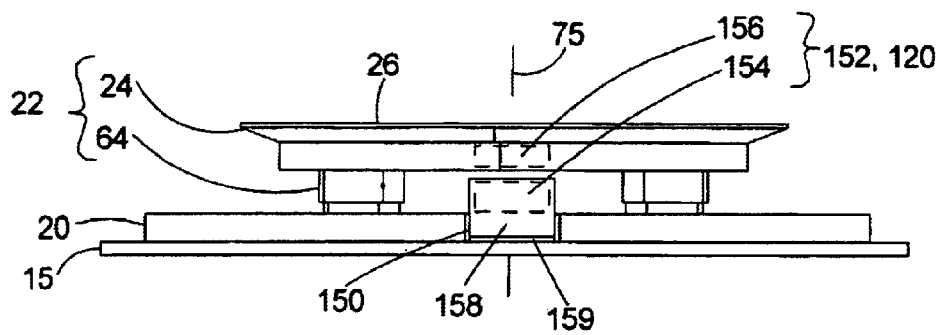

FIG. 6T illustrates another embodiment of a holder mover 120 that accurately moves and/or rotates the device holder 24 relative to the device table 20 about the axis of rotation 75. FIG. 6T illustrates only (i) the holder assembly 22 including the device holder 24 that retains the device, and the rotation assembly 64, (ii) the device table 20, and (iii) the holder mover 120. The holder assembly 22 and the device table 20 are similar to the corresponding components described above and illustrated in FIGS. 4A and 4B. Further, these components can be incorporated into the stage assembly 10 of FIG. 4A.

In FIG. 6T, the holder mover 120 is similar to the holder mover 120 illustrated in FIG. 6S. In this embodiment, the holder mover 120 is the motor 152 that includes the first component 154 (illustrated in phantom) and the adjacent second component 156 (illustrated in phantom), which interacts with the first component 154. One of the components 154, 156 includes a magnet array and the other component 154, 156 includes a conductor array.

In FIG. 6T, (i) the first component 154 is secured with the beam 158 and the beam damper 159 to the device table 20 along the holder axis of rotation 75 and (ii) the second component 156 is secured to the device holder 24 near the holder axis of rotation 75. The beam damper 159 inhibits and dampens the reaction forces generated by the motor 152 from being transferred to the device table 20. The beam damper 159 can, for example, include a reaction mass assembly, a fluid cylinder, a resilient material, or other type of vibration damping device.

FIG. 6TT illustrates another embodiment of a holder mover 120 that accurately moves and/or rotates the device holder 24 relative to the device table 20 about the axis of rotation 75. FIG. 6TT illustrates only (i) the holder assembly 22 including the device holder 24 that retains the device 26, and the rotation assembly 64, (ii) the device table 20, (iii) the stage 15 and (iv) the holder mover 120. The holder assembly 22, the device table 20 and the stage 15 are similar to the corresponding components described above and illustrated in FIGS. 4A and 4B. Further, these components can be incorporated into the stage assembly 10 of FIG. 4A.

In FIG. 6TT, the holder mover 120 is similar to the holder mover 12 illustrated in FIG. 6T. In FIG. 6TT, the holder mover 120 is the motor 152 that includes the first component 154 (illustrated in phantom) and the adjacent second component 156 (illustrated in phantom), which interacts with the first component 154. One of the components 154, 156 includes a magnet array and the other component 154, 156 includes a conductor array.

In FIG. 6TT, (i) the first component 154 is secured to the stage 15 with the beam 158 and the beam damper 159 through the aperture 150 in the device table 20 along the holder axis of rotation 75 and (ii) the second component 156 is secured to the device holder 24 along the holder axis of rotation 75.

FIG. 7 is a schematic view illustrating an exposure apparatus 28 useful with the present invention. The exposure apparatus 28 includes the apparatus frame 130, an illumination system 200 (irradiation apparatus), a reticle stage assembly 202, the optical assembly 40 (lens assembly), and a wafer stage assembly 204. The stage assemblies 10 provided herein can be used as the wafer stage assembly 204. Alternately, with the disclosure provided herein, the stage assemblies 10 provided herein can be modified for use as the reticle stage assembly 202.

The exposure apparatus 28 is particularly useful as a lithographic device that transfers a pattern (not shown) of an integrated circuit from the reticle 30 onto the semiconductor wafer 26. The exposure apparatus 28 mounts to the mounting base 46, e.g., the ground, a base, or floor or some other supporting structure.

The apparatus frame 130 is rigid and supports the components of the exposure apparatus 28. The design of the apparatus frame 130 can be varied to suit the design requirements for the rest of the exposure apparatus 28. The apparatus frame 130 illustrated in FIG. 7 supports the optical assembly 40 and the illumination system 200 and the reticle stage assembly 202 above the mounting base 46.

The illumination system 200 includes an illumination source 206 and an illumination optical assembly 208. The illumination source 206 emits a beam (irradiation) of light energy. The illumination optical assembly 208 guides the beam of light energy from the illumination source 206 to the optical assembly 40. The beam illuminates selectively different portions of the reticle 30 and exposes the semiconductor wafer 26. In FIG. 7, the illumination source 206 is illustrated as being supported above the reticle stage assembly 202. Typically, however, the illumination source 206 is secured to one of the sides of the apparatus frame 130 and the energy beam from the illumination source 206 is directed to above the reticle stage assembly 202 with the illumination optical assembly 208.

The optical assembly 40 projects and/or focuses the light passing through the reticle 30 to the wafer 26. Depending upon the design of the exposure apparatus 28, the optical assembly 40 can magnify or reduce the image illuminated on the reticle 30.

The reticle stage assembly 202 holds and positions the reticle 30 relative to the optical assembly 40 and the wafer 26. Similarly, the wafer stage assembly 204 holds and positions the wafer(s) 26 with respect to the projected image of the illuminated portions of the reticle 30 in the operational area. In FIG. 7, the wafer stage assembly 204 utilizes a stage assembly 10 having features of the present invention.

Depending upon the design, the exposure apparatus 28 can also include additional motors to move the stage assemblies 202, 204.

There are a number of different types of lithographic devices. For example, the exposure apparatus 28 can be used as scanning type photolithography system that exposes the pattern from the reticle 30 onto the wafer 26 with the reticle 30 and the wafer 26 moving synchronously. In a scanning type lithographic device, the reticle 30 is moved perpendicular to an optical axis of the optical assembly 40 by the reticle stage assembly 202 and the wafer 26 is moved perpendicular to an optical axis of the optical assembly 40 by the wafer 26 stage assembly 204. Scanning of the reticle 30 and the wafer 26 occurs while the reticle 30 and the wafer 26 are moving synchronously.

Alternately, the exposure apparatus 28 can be a step-and-repeat type photolithography system that exposes the reticle 30 while the reticle 30 and the wafer 26 are stationary. In the step and repeat process, the wafer 26 is in a constant position relative to the reticle 30 and the optical assembly 40 during the exposure of an individual field. Subsequently, between consecutive exposure steps, the wafer 26 is consecutively moved by the wafer stage assembly 204 perpendicular to the optical axis of the optical assembly 40 so that the next field of the wafer 26 is brought into position relative to the optical assembly 40 and the reticle 30 for exposure. Following this process, the images on the reticle 30 are sequentially exposed onto the fields of the wafer 26 so that the next field of the wafer 26 is brought into position relative to the optical assembly 40 and the reticle 30.

However, the use of the exposure apparatus 28 and the stage assembly 10 provided herein are not limited to a photolithography system for semiconductor manufacturing. The exposure apparatus 28, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern by closely locating a mask and a substrate without the use of a lens assembly. Additionally, the present invention provided herein can be used in other devices, including other semiconductor processing equipment, machine tools, metal cutting machines, and inspection machines.

The illumination source 206 can be g-line (436 nm), i-line (365 nm), KrF excimer laser (248 nm), ArF excimer laser (193 nm) and $F_2$ laser (157 nm). Alternately, the illumination source 206 can also use charged particle beams such as an x-ray and electron beam. For instance, in the case where an electron beam is used, thermionic emission type lanthanum hexaboride ($LaB_6$) or tantalum (Ta) can be used as an electron gun. Furthermore, in the case where an electron beam is used, the structure could be such that either a mask is used or a pattern can be directly formed on a substrate without the use of a mask.

In terms of the magnification of the optical assembly 40 included in the photolithography system, the optical assembly 40 need not be limited to a reduction system. It could also be a 1x or magnification system.

With respect to an optical assembly 40, when far ultra-violet rays such as the excimer laser is used, glass materials such as quartz and fluorite that transmit far ultra-violet rays is preferable to be used. When the $F_2$ type laser or x-ray is used, the optical assembly 40 should preferably be either catadioptric or refractive (a reticle should also preferably be a reflective type), and when an electron beam is used, electron optics should preferably consist of electron lenses and deflectors. The optical path for the electron beams should be in a vacuum.

Also, with an exposure device that employs vacuum ultra-violet radiation (VUV) of wavelength 200 nm or lower, use of the catadioptric type optical system can be considered. Examples of the catadioptric type of optical system include the disclosure Japan Patent Application Disclosure No.8-171054 published in the Official Gazette for Laid-Open Patent Applications and its counterpart U.S. Pat. No. 5,668,672, as well as Japan Patent Application Disclosure No.10-20195 and its counterpart U.S. Pat. No. 5,835,275. In these cases, the reflecting optical device can be a catadioptric optical system incorporating a beam splitter and concave mirror. Japan Patent Application Disclosure No.8-334695 published in the Official Gazette for Laid-Open Patent Applications and its counterpart U.S. Pat. No. 5,689,377 as well as Japan Patent Application Disclosure No.10-3039 and its counterpart U.S. patent application Ser. No. 873,605 (Application Date: Jun. 12, 1997) also use a reflecting-refracting type of optical system incorporating a concave mirror, etc., but without a beam splitter, and can also be employed with this invention. As far as is permitted, the disclosures in the above-mentioned U.S. patents, as well as the Japan patent applications published in the Official Gazette for Laid-Open Patent Applications are incorporated herein by reference.

Further, in photolithography systems, when linear motors (see U.S. Pat. Nos. 5,623,853 or 5,528,118) are used in a wafer stage or a mask stage, the linear motors can be either an air levitation type employing air bearings or a magnetic levitation type using Lorentz force or reactance force. Additionally, the stage could move along a guide, or it could be a guideless type stage that uses no guide. As far as is permitted, the disclosures in U.S. Pat. Nos. 5,623,853 and 5,528,118 are incorporated herein by reference.

Alternatively, one of the stages could be driven by a planar motor, which drives the stage by an electromagnetic force generated by a magnet unit having two-dimensionally arranged magnets and an armature coil unit having two-dimensionally arranged coils in facing positions. With this type of driving system, either the magnet unit or the armature coil unit is connected to the stage and the other unit is mounted on the moving plane side of the stage.

Movement of the stages as described above generates reaction forces that can affect performance of the photolithography system. Reaction forces generated by the wafer (substrate) stage motion can be mechanically released to the floor (ground) by use of a frame member as described in U.S. Pat. No. 5,528,118 and published Japanese Patent Application Disclosure No. 8-166475. Additionally, reaction forces generated by the reticle (mask) stage motion can be mechanically released to the floor (ground) by use of a frame member as described in U.S. Pat. No. 5,874,820 and published Japanese Patent Application Disclosure No. 8-330224. As far as is permitted, the disclosures in U.S. Pat. Nos. 5,528,118 and 5,874,820 and Japanese Patent Application Disclosure No. 8-330224 are incorporated herein by reference.

As described above, a photolithography system according to the above described embodiments can be built by assembling various subsystems, including each element listed in the appended claims, in such a manner that prescribed mechanical accuracy, electrical accuracy, and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, a total adjustment is performed to make sure that accuracy is maintained in the complete photolithography system. Additionally, it is desirable to manufacture an exposure system in a clean room where the temperature and cleanliness are controlled.

Figure 8A:
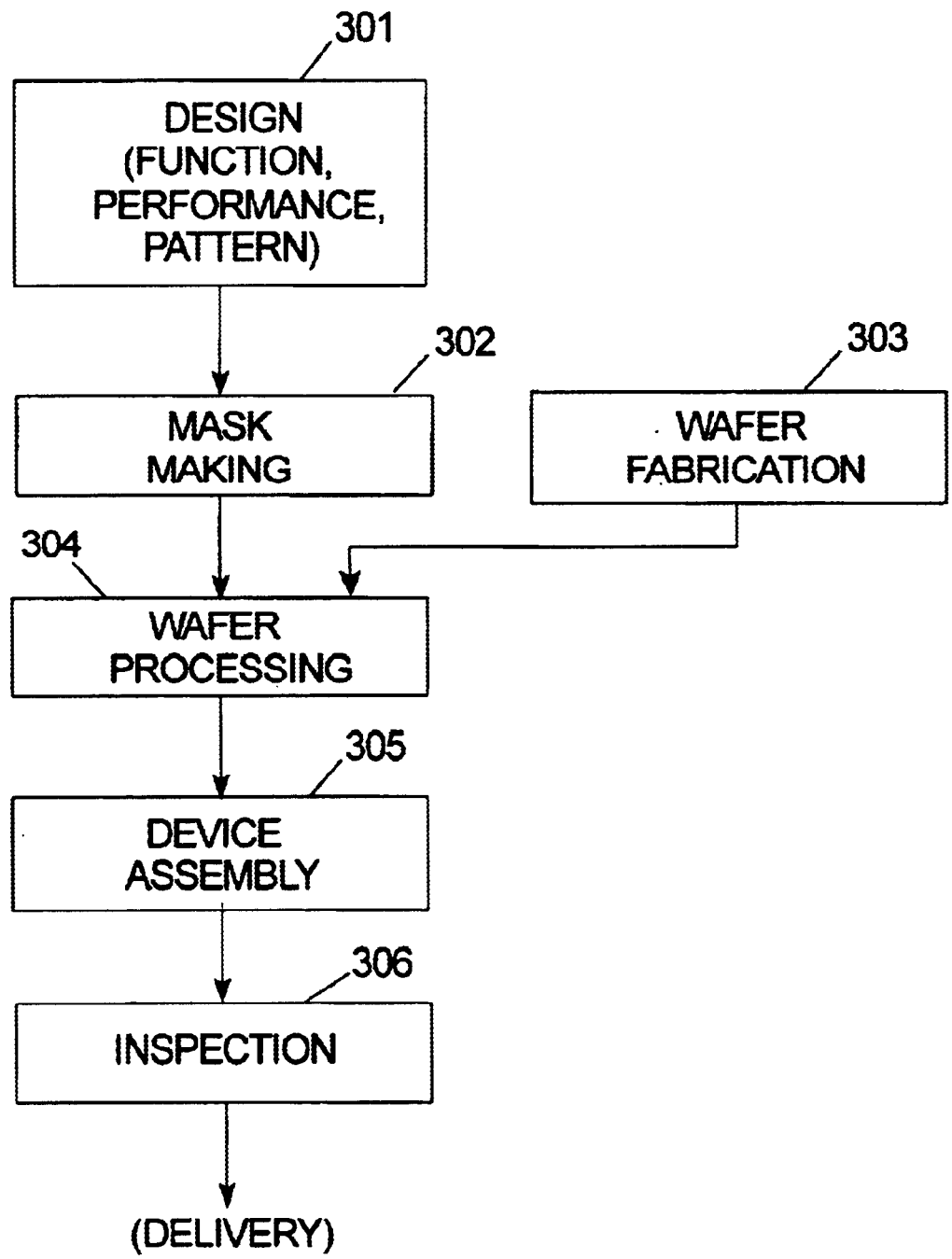
FIG. 8A is a flow chart that outlines a process for manufacturing a device in accordance with the present invention.

Further, semiconductor devices can be fabricated using the above described systems, by the process shown generally in FIG. 8A. In step 301 the device's function and performance characteristics are designed. Next, in step 302, a mask (reticle) having a pattern is designed according to the previous designing step, and in a parallel step 303 a wafer is made from a silicon material. The mask pattern designed in step 302 is exposed onto the wafer from step 303 in step 304 by a photolithography system described hereinabove in accordance with the present invention. In step 305 the semiconductor device is assembled (including the dicing process, bonding process and packaging process), finally, the device is then inspected in step 306.

Figure 8B:
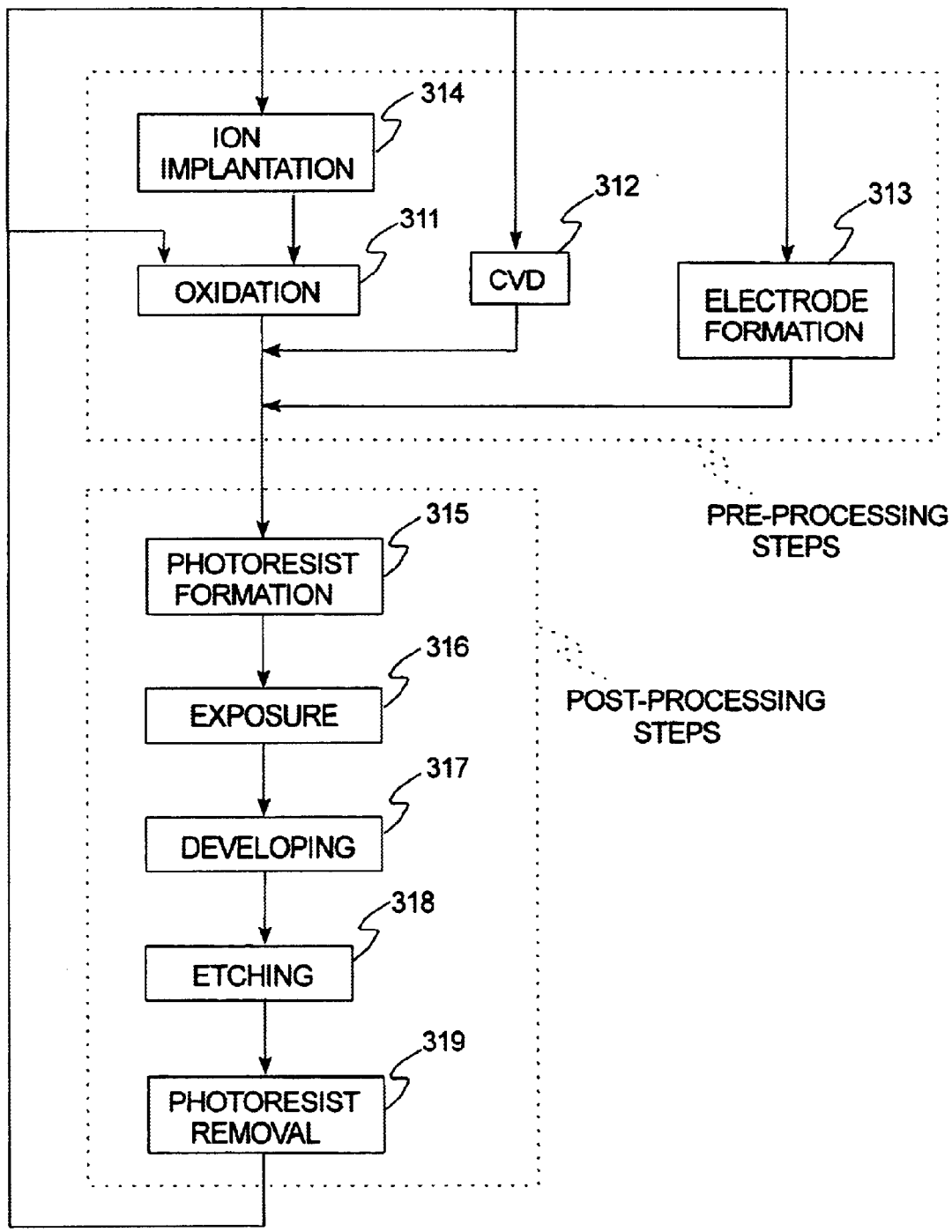
FIG. 8B is a flow chart that outlines device processing in more detail.

FIG. 8B illustrates a detailed flowchart example of the above-mentioned step 304 in the case of fabricating semiconductor devices. In FIG. 8B, in step 311 (oxidation step), the wafer surface is oxidized. In step 312 (CVD step), an insulation film is formed on the wafer surface. In step 313 (electrode formation step), electrodes are formed on the wafer by vapor deposition. In step 314 (ion implantation step), ions are implanted in the wafer. The above mentioned steps 311–314 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 315 (photoresist formation step), photoresist is applied to a wafer. Next, in step 316 (exposure step), the above-mentioned exposure device is used to transfer the circuit pattern of a mask (reticle) to a wafer. Then in step 317 (developing step), the exposed wafer is developed, and in step 318 (etching step), parts other than residual photoresist (exposed material surface) are removed by etching. In step 319 (photoresist removal step), unnecessary photoresist remaining after etching is removed.

Multiple circuit patterns are formed by repetition of these preprocessing and post-processing steps.

While the particular stage assembly 10 as shown and disclosed herein is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A stage assembly that holds a device, the stage assembly comprising:

a stage base;

a device table being movable relative to the stage base along a first axis and along a second axis that is orthogonal to the first axis;

a carrier coupled to the device table and being movable relative to the device table;

a device holder that retains the device; and a holder connector assembly that connects the device holder to the carrier so that deformation of the carrier does not result in deformation of the device holder.

2. The stage assembly of claim 1 wherein the holder connector assembly includes a flexure.

3. The stage assembly of claim 2 wherein the holder connector assembly includes three spaced apart flexures.

4. The stage assembly of claim 1 wherein the holder connector assembly kinematically connects the device holder to the carrier.

5. The stage assembly of claim 1 wherein the holder connector assembly includes three spaced apart protrusions and three spaced apart receivers.

6. The stage assembly of claim 1 wherein the holder connector assembly includes a protrusion and a cone shaped receiver that receives the protrusion.

7. The stage assembly of claim 1 wherein the holder connector assembly includes a fluid bearing assembly.

8. The stage assembly of claim 7 wherein the holder connector assembly includes three spaced apart, fluid bearing assemblies.

9. The stage assembly of claim 8 wherein each fluid bearing assembly includes a bearing body having a substantially triangular shaped cross-section and a pair of bearing pads.

10. The stage assembly of claim 9 wherein the holder connector assembly includes three spaced apart receivers.

11. The stage assembly of claim 10 wherein each of the receivers includes a groove having a substantially triangular shaped cross-section.

12. The stage assembly of claim 1 further comprising a stage mover assembly that moves the device table.

13. The stage assembly of claim 12 wherein the stage mover assembly moves the device table with at least three degrees of freedom.

14. The stage assembly of claim 1 wherein the carrier rotates relative to the device table.

15. The stage assembly of claim 14 further comprising a lock that inhibits rotation of the carrier relative to the device table.

16. The stage assembly of claim 14 wherein the carrier and the device holder are rotated relative to the device table between a first position and a second position.

17. The stage assembly of claim 16 wherein the device holder is rotated at least approximately 25 degrees between the first position and the second position.

18. The stage assembly of claim 16 wherein the device holder is rotated at least approximately 180 degrees between the first position and the second position.

19. The stage assembly of claim 1 further comprising a bearing that allows for rotation of the carrier relative to the device table.

20. The stage assembly of claim 1 further comprising a holder damper assembly that dampens vibration between the device holder and the carrier.

21. The stage assembly of claim 20 wherein the holder damper assembly includes a first damping layer that covers at least a portion of one of the carrier and the device holder.

22. The stage assembly of claim 21 wherein the first damping layer is made of a viscoelastic material.

23. The stage assembly of claim 21 further comprising a constraining layer of material that covers at least a portion of the first damping layer.

24. The stage assembly of claim 20 wherein the holder damper assembly includes a first damping layer that covers at least a portion of the device holder and a second damping layer that covers at least a portion of the carrier.

25. The stage assembly of claim 24 wherein the first damping layer and the second damping layer are made of a viscoelastic material.

26. The stage assembly of claim 24 further comprising a constraining layer of material that covers at least a portion of one of the damping layers.

27. The stage assembly of claim 20 wherein the holder damper assembly includes a magnet that is secured to the device holder, the magnet generating flux that passes through the carrier to dampen vibration of the device holder.

28. The stage assembly of claim 20 wherein the holder damper assembly includes a magnet that is secured to the carrier, the magnet generating flux that passes through the device holder to dampen vibration of the device holder.

29. The stage assembly of claim 20 wherein the holder damper assembly utilizes squeeze film type damping.

30. The stage assembly of claim 29 wherein the holder damper assembly includes a damping unit that includes a first damping component that is secured to the device holder and a second damping component that is secured to the carrier, wherein a small gap exists between the first damping component and the second damping component.

31. The stage assembly of claim 1 further comprising a holder mover that engages the carrier and rotates the carrier and the device holder.

32. An exposure apparatus including the stage assembly of claim 1.

33. A device manufactured with the exposure apparatus according to claim 32.

34. A wafer on which an image has been formed by the exposure apparatus of claim 32.

35. A stage assembly that holds a device, the stage assembly comprising:

a stage base;

a device table being movable relative to the stage base along a first axis and along a second axis that is orthogonal to the first axis;

a carrier coupled to the device table and movable relative to the device table;

a device holder that retains the device;

a holder connector assembly that connects the device holder to the carrier so that deformation of the carrier does not result in deformation of the device holder; and a holder damper assembly connected to at least one of the device holder and the carrier, the holder damper damping vibration between the device holder and the carrier.

36. The stage assembly of claim 35 wherein the holder connector assembly includes a flexure.

37. The stage assembly of claim 36 wherein the holder connector assembly includes three spaced apart flexures.

38. The stage assembly of claim 35 wherein the holder connector assembly kinematically connects the device holder to the carrier.

39. The stage assembly of claim 35 wherein the holder connector assembly includes three spaced apart protrusions and three spaced apart receivers.

40. The stage assembly of claim 35 wherein the holder connector assembly includes a fluid bearing assembly.

41. The stage assembly of claim 40 wherein the holder connector assembly includes three spaced apart, fluid bearing assemblies.

42. The stage assembly of claim 41 wherein each fluid bearing assembly includes a bearing body having a substantially triangular shaped cross-section and a pair of bearing pads.

43. The stage assembly of claim 42 wherein the holder connector assembly includes three spaced apart receivers.

44. The stage assembly of claim 43 wherein each of the receivers includes a groove having a substantially triangular shaped cross-section.

45. The stage assembly of claim 35 wherein the carrier rotates relative to the device table.

46. The stage assembly of claim 45 further comprising a lower damper assembly for damping vibration between the carrier and the device table.

47. The stage assembly of claim 45 further comprising a stage mover assembly that moves the device table.

48. The stage assembly of claim 45 further comprising a lock that inhibits rotation of the carrier relative to the device table.

49. The stage assembly of claim 45 wherein the carrier and the device holder are rotated relative to the device table between a first position and a second position.

50. The stage assembly of claim 49 wherein the device holder is rotated at least approximately 25 degrees between the first position and the second position.

51. The stage assembly of claim 49 wherein the device holder is rotated at least approximately 180 degrees between the first position and the second position.

52. The stage assembly of claim 35 wherein the holder damper assembly includes a first damping layer that covers at least a portion of one of the carrier and the device holder.

53. The stage assembly of claim 52 wherein the first damping layer is made of a viscoelastic material.

54. The stage assembly of claim 52 further comprising a constraining layer of material that covers at least a portion of the first damping layer.

55. The stage assembly of claim 35 wherein the holder damper assembly includes a first damping layer that covers at least a portion of the device holder and a second damping layer that covers at least a portion of the carrier.

56. The stage assembly of claim 55 wherein the first damping layer and the second damping layer are made of a viscoelastic material.

57. The stage assembly of claim 56 further comprising a constraining layer of material that covers at least a portion of one of the damping layers.

58. The stage assembly of claim 35 wherein the holder damper assembly includes a damping layer that covers at least a portion of the holder connector assembly.

59. The stage assembly of claim 35 wherein the holder damper assembly includes a magnet that is secured to the device holder, the magnet generating flux that passes through the carrier to dampen vibration of the device holder.

60. The stage assembly of claim 35 wherein the holder damper assembly includes a magnet that is secured to the carrier, the magnet generating flux that passes through the device holder to dampen vibration of the device holder.

61. The stage assembly of claim 35 wherein the holder damper assembly utilizes squeeze film type damping.

62. The stage assembly of claim 61 wherein the holder damper assembly includes a damping unit that includes a first damping component that is secured to the device holder and a second damping component that is secured to the carrier, wherein a small gap exists between the first damping component and the second damping component.

63. An exposure apparatus including the stage assembly of claim 35.

64. A device manufactured with the exposure apparatus according to claim 63.

65. A wafer on which an image has been formed by the exposure apparatus of claim 63.

66. A stage assembly that holds a device, the stage assembly comprising:

a device table;

a carrier that is coupled to the device table, the carrier rotating relative to the device table at least approximately five degrees between a first position and a second position;

a device holder that retains the device; and a holder connector assembly that directly connects the device holder to the carrier, the holder connector assembly including a flexure.

67. The stage assembly of claim 66 wherein the holder connector assembly includes three spaced apart flexures.

68. The stage assembly of claim 66 wherein the holder connector assembly kinematically connects the device holder to the carrier.

69. The stage assembly of claim 66 further comprising a lock that inhibits rotation of the carrier relative to the device table.

70. The stage assembly of claim 66 wherein the carrier and the device holder are rotated relative to the device table between the first position and the second position.

71. The stage assembly of claim 70 wherein the device holder is rotated at least approximately 25 degrees between the first position and the second position.

72. The stage assembly of claim 70 wherein the device holder is rotated at least approximately 180 degrees between the first position and the second position.

73. The stage assembly of claim 66 further comprising a holder damper assembly that dampens vibration between the device holder and the carrier.

74. The stage assembly of claim 73 wherein the holder damper assembly includes a first damping layer that covers at least a portion of one of the carrier and the device holder.

75. The stage assembly of claim 74 wherein the first damping layer is made of a viscoelastic material.

76. The stage assembly of claim 74 further comprising a constraining layer of material that covers at least a portion of the first damping layer.

77. The stage assembly of claim 73 wherein the holder damper assembly includes a first damping layer that covers at least a portion of the device holder and a second damping layer that covers at least a portion of the carrier.

78. The stage assembly of claim 73 wherein the holder damper assembly includes a magnet that is secured to the device holder, the magnet generating flux that passes through the carrier to dampen vibration of the device holder.

79. The stage assembly of claim 73 wherein the holder damper assembly includes a magnet that is secured to the carrier, the magnet generating flux that passes through the device holder to dampen vibration of the device holder.

80. The stage assembly of claim 73 wherein the holder damper assembly utilizes squeeze film type damping.

81. The stage assembly of claim 66 wherein the flexure extends directly between a carrier top of the carrier and a holder bottom of the device holder.

82. An exposure apparatus including the stage assembly of claim 66.

83. A device manufactured with the exposure apparatus according to claim 82.

84. A wafer on which an image has been formed by the exposure apparatus of claim 82.

85. A stage assembly that holds a device, the stage assembly comprising:

a device table that is movable along a first axis and along a second axis that is orthogonal to the first axis;

a carrier that is coupled to the device table and moves relative to the device table;

a device holder that retains the device; and a holder connector assembly that directly connects the device holder to the carrier, the holder connector assembly including a fluid bearing.

86. The stage assembly of claim 85 wherein the holder connector assembly kinematically connects the device holder to the carrier.

87. The stage assembly of claim 85 wherein the holder connector assembly includes three spaced apart, fluid bearing assemblies.

88. The stage assembly of claim 87 wherein each fluid bearing assembly includes a bearing body having a substantially triangular shaped cross-section and a pair of bearing pads.

89. The stage assembly of claim 88 wherein the holder connector assembly includes three spaced apart receivers for receiving each bearing body.

90. The stage assembly of claim 89 wherein each of the receivers includes a groove having a substantially triangular shaped cross-section.

91. The stage assembly of claim 85 wherein the carrier rotates relative to the device table.

92. The stage assembly of claim 91 further comprising a lock that inhibits rotation of the carrier relative to the device table.

93. The stage assembly of claim 91 wherein the carrier and the device holder are rotated relative to the device table between a first position and a second position.

94. The stage assembly of claim 93 wherein the device holder is rotated at least approximately 25 degrees between the first position and the second position.

95. The stage assembly of claim 93 wherein the device holder is rotated at least approximately 180 degrees between the first position and the second position.

96. The stage assembly of claim 85 further comprising a holder damper assembly that dampens vibration between the device holder and the carrier.

97. The stage assembly of claim 96 wherein the holder damper assembly includes a first damping layer that covers at least a portion of one of the carrier and the device holder.

98. The stage assembly of claim 96 wherein the holder damper assembly includes a first damping layer that covers at least a portion of the device holder and a second damping layer that covers at least a portion of the carrier.

99. The stage assembly of claim 96 wherein the holder damper assembly includes a magnet that is secured to the device holder, the magnet generating flux that passes through the carrier to dampen vibration of the device holder.

100. The stage assembly of claim 96 wherein the holder damper assembly includes a magnet that is secured to the carrier, the magnet generating flux that passes through the device holder to dampen vibration of the device holder.

101. The stage assembly of claim 96 wherein the holder damper assembly utilizes squeeze film type damping.

102. An exposure apparatus including the stage assembly of claim 85.

103. A device manufactured with the exposure apparatus according to claim 102.

104. A wafer on which an image has been formed by the exposure apparatus of claim 102.

105. A method for making a stage assembly that holds a device, the method comprising the steps of:

providing a stage base;

providing a device table that is movable along a first axis and along a second axis that is orthogonal to the first axis relative to the stage base;

connecting a carrier to the device table, the carrier being movable relative to the device table; and connecting a device holder that retains the device to the carrier so that deformation of the carrier does not result in deformation of the device holder.

106. The method of claim 105, wherein the step of connecting the device holder includes the step of securing the device holder to the carrier with a flexure.

107. The method of claim 105, wherein the step of connecting the device holder includes the step of kinematically securing the device holder to the carrier.

108. The method of claim 106, wherein the flexure extends between the device holder and the carrier.

109. The method of claim 105 wherein the step of connecting the device holder includes the step of creating a fluid bearing between the device holder and the carrier.

110. The method of claim 109 wherein the step of connecting the device holder includes the step of providing three spaced apart, fluid bearing assemblies, each fluid bearing assembly including a bearing body having a substantially triangular shaped cross-section and a pair of bearing pads.

111. The method of claim 110 wherein the step of connecting the device holder includes the step of providing three spaced apart receivers for receiving each bearing body, each of the receivers includes a groove having a substantially triangular shaped cross-section.

112. The method of claim 105, further comprising the step of connecting a stage mover assembly to the device table.

113. The method of claim 105 wherein the step of connecting a carrier includes the step of supporting the carrier above the device table with a bearing that allows for rotation of the carrier relative to the device table.

114. The method of claim 113, wherein the rotation of the carrier is inhibited selectively relative to the device table.

115. The method of claim 105, further comprising the step of connecting a holder damper assembly to at least one of the device holder and the carrier to dampen vibration between the device holder and the carrier.

116. The method of claim 115 wherein the step of connecting the holder damper assembly includes the step of covering at least a portion of one of the carrier and the device holder with a first damping layer to dampen vibration between the device holder and the carrier.

117. The method of claim 115 wherein the step of connecting the holder damper assembly includes the step of securing a magnet to at least one of the device holder and the carrier to dampen vibration between the device holder and the carrier.

118. The method of claim 115, wherein the holder damper assembly includes squeeze film type damping.

119. A method for making an exposure apparatus that forms an image on an object, the method comprising the steps of:

providing an irradiation apparatus that irradiates the object with radiation to form image on the object; and providing the stage assembly made by the method of claim 105.

120. A method of making a wafer utilizing the exposure apparatus made by the method of claim 119.

121. A method of making a device including at least the exposure process: wherein the exposure process utilizes the exposure apparatus made by the method of claim 119.

122. A stage assembly that holds a device, the stage assembly comprising:

a stage base;

a device table that is movable relative to the stage base along a first axis and along a second axis that is orthogonal to the first axis;

a device holder that retains the device, the device holder being coupled to the device table, the device holder rotating relative to the device table at least approximately five degrees; and a holder damper assembly for damping vibration between the device holder and the device table.

123. The stage assembly of claim 122 wherein the holder damper assembly is connected to at least one of the device holder and the device table.

124. The stage assembly of claim 122 further comprising a rotation assembly that couples the device holder to the device table, the rotation assembly allowing for rotation of the device holder relative to the device table.

125. The stage assembly of claim 122 wherein the device holder rotates relative to the device table at least approximately ten degrees.

126. The stage assembly of claim 122 further comprising a stage mover assembly that moves the device table.

127. The stage assembly of claim 122 further comprising a lock that inhibits rotation of the device holder relative to the device table.

128. The stage assembly of claim 122 wherein the device holder rotates relative to the device table between a first position and a second position.

129. The stage assembly of claim 128 wherein the device holder rotates at least approximately 25 degrees between the first position and the second position.

130. The stage assembly of claim 122 wherein the holder damper assembly includes a first damping layer that covers at least a portion of one of the device table and the device holder.

131. The stage assembly of claim 130 wherein the first damping layer is made of a viscoelastic material.

132. The stage assembly of claim 130 further comprising a constraining layer of material that covers at least a portion of the first damping layer.

133. The stage assembly of claim 122 wherein the holder damper assembly includes a first damping layer that covers at least a portion of the device holder and a second damping layer that covers at least a portion of the device table.

134. The stage assembly of claim 133 wherein the first damping layer and the second damping layer are made of a viscoelastic material.

135. The stage assembly of claim 133 further comprising a constraining layer of material that covers at least a portion of one of the damping layers.

136. The stage assembly of claim 122 wherein the holder damper assembly includes a magnet that is secured to the device holder, the magnet generating flux that passes through the device table to dampen vibration of the device holder.

137. The stage assembly of claim 122 wherein the holder damper assembly includes a magnet that is secured to the device table, the magnet generating flux that passes through the device holder to dampen vibration of the device holder.

138. The stage assembly of claim 122 wherein the holder damper assembly utilizes squeeze film type damping.

139. The stage assembly of claim 138 wherein the holder damper assembly includes a damping unit that includes a first damping component that is secured to the device holder and a second damping component that is secured to the device table, wherein a small gap exists between the first damping component and the second damping component.

140. The stage assembly of claim 122 further comprising a carrier that couples the device holder to the device table.

141. The stage assembly of claim 122 wherein the holder damper assembly is connected to at least one of the device holder, the carrier and the device table.

142. An exposure apparatus including the stage assembly of claim 122.

143. A device manufactured with the exposure apparatus according to claim 142.

144. A wafer on which an image has been formed by the exposure apparatus of claim 142.

* * * * *